(12) United States Patent
Ohno et al.

(10) Patent No.: US 10,629,831 B2
(45) Date of Patent: Apr. 21, 2020

(54) SEPARATION METHOD, DISPLAY DEVICE, DISPLAY MODULE, AND ELECTRONIC DEVICE

(71) Applicant: Semiconductor Energy Laboratory Co., Ltd., Atsugi-shi, Kanagawa-ken (JP)

(72) Inventors: Masakatsu Ohno, Utsunomiya (JP); Kayo Kumakura, Tochigi (JP); Hiroyuki Watanabe, Tochigi (JP); Seiji Yasumoto, Tochigi (JP); Satoru Idojiri, Tochigi (JP); Hiroki Adachi, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 127 days.

(21) Appl. No.: 15/657,259

(22) Filed: Jul. 24, 2017

(65) Prior Publication Data
US 2018/0033978 A1 Feb. 1, 2018

(30) Foreign Application Priority Data

Jul. 29, 2016 (JP) ................................ 2016-149840

(51) Int. Cl.
*H01L 51/00* (2006.01)
*H01L 27/12* (2006.01)
(Continued)

(52) U.S. Cl.
CPC ...... *H01L 51/0097* (2013.01); *H01L 27/1266* (2013.01); *H01L 27/3262* (2013.01);
(Continued)

(58) Field of Classification Search
None
See application file for complete search history.

(56) References Cited

U.S. PATENT DOCUMENTS 4,409,134 A  10/1983  Yamazaki
4,618,878 A  10/1986  Aoyama et al.
(Continued)

FOREIGN PATENT DOCUMENTS

DE   112015600866    11/2016
EP        1046945 A  10/2000
(Continued)

OTHER PUBLICATIONS

Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.
(Continued)

*Primary Examiner* — Cory W Eskridge
(74) *Attorney, Agent, or Firm* — Robinson Intellectual Property Law Office; Eric J. Robinson

(57) ABSTRACT

The yield of a separation process is improved. The mass productivity of a display device which is formed through a separation process is improved. A layer is formed over a substrate with use of a material including a resin or a resin precursor. Next, a resin layer is formed by performing heat treatment on the layer. Next, a layer to be separated is formed over the resin layer. Then, the layer to be separated and the substrate are separated from each other. The heat treatment is performed in an atmosphere containing oxygen or while supplying a gas containing oxygen.

19 Claims, 49 Drawing Sheets

(51) Int. Cl.
*H01L 27/32* (2006.01)
*H01L 51/52* (2006.01)
*H01L 29/786* (2006.01)

(52) U.S. Cl.
CPC ........ *H01L 51/003* (2013.01); *H01L 51/5246* (2013.01); *H01L 27/1218* (2013.01); *H01L 27/1225* (2013.01); *H01L 29/7869* (2013.01); *H01L 51/5253* (2013.01); *H01L 2227/323* (2013.01); *H01L 2227/326* (2013.01); *H01L 2251/5338* (2013.01); *Y02E 10/549* (2013.01)

(56) References Cited

U.S. PATENT DOCUMENTS

| | | |
|---|---|---|
| 5,826,162 A | 10/1998 | Aral et al. |
| 5,834,327 A | 11/1998 | Yamazaki et al. |
| 5,952,708 A | 9/1999 | Yamazaki |
| 5,969,463 A | 10/1999 | Tomita et al. |
| 5,990,542 A | 11/1999 | Yamazaki |
| 6,100,166 A | 8/2000 | Sakaguchi et al. |
| 6,127,199 A | 10/2000 | Inoue et al. |
| 6,335,479 B1 | 1/2002 | Yamada et al. |
| 6,372,608 B1 | 4/2002 | Shimoda et al. |
| 6,379,792 B1 | 4/2002 | Isshiki et al. |
| 6,413,693 B1 | 7/2002 | Bekku et al. |
| 6,468,638 B2 | 10/2002 | Jacobsen et al. |
| 6,521,511 B1 | 2/2003 | Inoue et al. |
| 6,627,518 B1 | 9/2003 | Inoue et al. |
| 6,645,830 B2 | 11/2003 | Shimoda et al. |
| RE38,466 E | 3/2004 | Inoue et al. |
| 6,707,614 B2 | 3/2004 | Tanaka |
| 6,714,268 B2 | 3/2004 | Wang et al. |
| 6,814,832 B2 | 11/2004 | Utsunomiya |
| 6,818,530 B2 | 11/2004 | Shimoda et al. |
| 6,825,099 B2 | 11/2004 | Yanagita et al. |
| 6,830,864 B2 | 12/2004 | Bekku et al. |
| 6,846,616 B2 | 1/2005 | Kobayashi et al. |
| 6,867,067 B2 | 3/2005 | Ghyselen et al. |
| 6,870,125 B2 | 3/2005 | Doi et al. |
| 6,885,146 B2 | 4/2005 | Yamazaki et al. |
| 6,946,361 B2 | 9/2005 | Takayama et al. |
| 6,947,321 B2 | 9/2005 | Tanabe |
| 7,038,641 B2 | 5/2006 | Hirota et al. |
| 7,050,835 B2 | 5/2006 | Hack et al. |
| 7,052,924 B2 | 5/2006 | Daniels et al. |
| 7,067,392 B2 | 6/2006 | Yamazaki et al. |
| 7,078,737 B2 | 7/2006 | Yuri et al. |
| 7,084,045 B2 | 8/2006 | Takayama et al. |
| 7,084,936 B2 | 8/2006 | Kato |
| 7,094,665 B2 | 8/2006 | Shimoda et al. |
| 7,102,704 B2 | 9/2006 | Mitsui et al. |
| 7,147,740 B2 | 12/2006 | Takayama et al. |
| 7,169,652 B2 | 1/2007 | Kimura |
| 7,176,991 B2 | 2/2007 | Mitsui et al. |
| 7,239,361 B2 | 7/2007 | Kato |
| 7,248,235 B2 | 7/2007 | Fujii et al. |
| 7,262,088 B2 | 8/2007 | Kodaira et al. |
| 7,285,476 B2 | 10/2007 | Shimoda et al. |
| 7,335,573 B2 | 2/2008 | Takayama et al. |
| 7,341,924 B2 | 3/2008 | Takayama et al. |
| 7,385,654 B2 | 6/2008 | Mitsui et al. |
| 7,411,211 B1 | 8/2008 | Yamazaki |
| 7,420,208 B2 | 9/2008 | Yamazaki et al. |
| 7,456,059 B2 | 11/2008 | Kodaira et al. |
| RE40,601 E | 12/2008 | Inoue et al. |
| 7,468,308 B2 | 12/2008 | Shimoda |
| 7,473,928 B1 | 1/2009 | Yamazaki et al. |
| 7,547,866 B2 | 6/2009 | Tanaka et al. |
| 7,572,667 B2 | 8/2009 | Ryu et al. |
| 7,575,965 B2 | 8/2009 | Kuwabara et al. |
| 7,591,863 B2 | 9/2009 | Watanabe et al. |
| 7,709,309 B2 | 5/2010 | Moriwaka |
| 7,726,013 B2 | 6/2010 | Kimura |
| 7,791,072 B2 | 9/2010 | Kumomi et al. |
| 7,833,871 B2 | 11/2010 | Kawakami et al. |
| 7,879,687 B2 | 2/2011 | Yamada |
| 7,968,388 B2 | 6/2011 | Komatsu |
| 8,048,777 B2 | 11/2011 | Eguchi et al. |
| 8,110,442 B2 | 2/2012 | Jinbo |
| 8,123,896 B2 | 2/2012 | Watanabe et al. |
| 8,173,519 B2 | 5/2012 | Morisue et al. |
| 8,199,269 B2 | 6/2012 | Hattori et al. |
| 8,202,365 B2 | 6/2012 | Umeda et al. |
| 8,211,725 B2 | 7/2012 | Park et al. |
| 8,222,092 B2 | 7/2012 | Yamazaki et al. |
| 8,227,353 B2 | 7/2012 | Omata et al. |
| 8,237,166 B2 | 8/2012 | Kumomi et al. |
| 8,274,079 B2 | 9/2012 | Yamazaki |
| 8,597,965 B2 | 12/2013 | Hatano et al. |
| 8,816,349 B2 | 8/2014 | Yamazaki et al. |
| 8,895,974 B2 | 11/2014 | Sugimoto et al. |
| 8,969,128 B2 | 3/2015 | Cho et al. |
| 9,000,443 B2 | 4/2015 | Hatano |
| 9,268,162 B2 | 2/2016 | Haskal |
| 9,427,949 B2 | 8/2016 | Ohno et al. |
| 9,437,831 B2 | 9/2016 | Yamazaki et al. |
| 9,437,832 B2 | 9/2016 | Sakuishi et al. |
| 9,770,894 B2 | 9/2017 | Ohno et al. |
| 10,211,239 B2 * | 2/2019 | Yamazaki ............... H01L 24/19 |
| 2002/0055057 A1 | 5/2002 | Bekku et al. |
| 2002/0146893 A1 | 10/2002 | Shimoda et al. |
| 2003/0003687 A1 | 1/2003 | Yanagita et al. |
| 2003/0024635 A1 | 2/2003 | Utsunomiya |
| 2003/0032210 A1 | 2/2003 | Takayama et al. |
| 2003/0048370 A1 | 3/2003 | Koyama |
| 2003/0087073 A1 | 5/2003 | Kobayashi |
| 2003/0144034 A1 | 7/2003 | Hack et al. |
| 2003/0201960 A1 | 10/2003 | Fujieda |
| 2003/0217805 A1 | 11/2003 | Takayama et al. |
| 2004/0079941 A1 | 4/2004 | Yamazaki et al. |
| 2004/0129960 A1 | 7/2004 | Maruyama et al. |
| 2004/0209442 A1 | 10/2004 | Takakuwa et al. |
| 2004/0239827 A1 | 12/2004 | Yamazaki et al. |
| 2005/0124751 A1 | 6/2005 | Klingenberg et al. |
| 2005/0127371 A1 | 6/2005 | Yamazaki et al. |
| 2005/0130391 A1 | 6/2005 | Takayama et al. |
| 2005/0163816 A1 | 7/2005 | Agrawal et al. |
| 2005/0173701 A1 | 8/2005 | Kawase et al. |
| 2005/0250308 A1 | 11/2005 | Yamaguchi et al. |
| 2005/0287871 A1 | 12/2005 | Nakayama et al. |
| 2006/0072047 A1 | 4/2006 | Sekiguchi |
| 2007/0171142 A1 | 7/2007 | Ikarashi et al. |
| 2007/0207571 A1 | 9/2007 | Morisue et al. |
| 2007/0295973 A1 | 12/2007 | Jinbo et al. |
| 2008/0042168 A1 | 2/2008 | Watanabe et al. |
| 2008/0180618 A1 | 7/2008 | Fujieda |
| 2009/0269621 A1 | 10/2009 | Lifka et al. |
| 2009/0315457 A1 | 12/2009 | Furukawa et al. |
| 2010/0073615 A1 | 3/2010 | Yaguchi et al. |
| 2010/0171905 A1 | 7/2010 | Huang et al. |
| 2011/0084267 A1 | 4/2011 | Yamazaki et al. |
| 2011/0156062 A1 | 6/2011 | Kim et al. |
| 2011/0204361 A1 | 8/2011 | Nishiki et al. |
| 2011/0294244 A1 | 12/2011 | Hattori et al. |
| 2011/0308739 A1 | 12/2011 | McCutcheon et al. |
| 2012/0034451 A1 | 2/2012 | Seo et al. |
| 2012/0061664 A1 | 3/2012 | Yamazaki et al. |
| 2012/0187399 A1 | 7/2012 | Fukuda et al. |
| 2012/0213929 A1 | 8/2012 | Lee et al. |
| 2012/0228617 A1 | 9/2012 | Ko et al. |
| 2012/0280229 A1 | 11/2012 | Suzuki et al. |
| 2012/0325535 A1 | 12/2012 | Zahr |
| 2013/0341629 A1 | 12/2013 | Seo et al. |
| 2014/0113440 A1 | 4/2014 | Tanaka et al. |
| 2014/0234664 A1 | 8/2014 | Yasumoto et al. |
| 2014/0339517 A1 | 11/2014 | Park et al. |
| 2015/0060778 A1 | 3/2015 | Kim et al. |
| 2015/0072454 A1 | 3/2015 | Kim et al. |
| 2015/0123106 A1 | 5/2015 | Yasumoto et al. |
| 2015/0151514 A1 | 6/2015 | Kikuchi et al. |
| 2015/0151531 A1 | 6/2015 | Ohno et al. |
| 2015/0183932 A1 | 7/2015 | Katayama et al. |
| 2015/0187849 A1 * | 7/2015 | Kachatryan ............. H01L 51/56 |
| | | 257/40 |

(56) References Cited

U.S. PATENT DOCUMENTS

| | | |
|---|---|---|
| 2015/0210048 A1 | 7/2015 | Jeong et al. |
| 2015/0236280 A1 | 8/2015 | Sakuishi et al. |
| 2015/0303408 A1 | 10/2015 | Lee et al. |
| 2015/0372255 A1 | 12/2015 | Fukumoto |
| 2016/0028034 A1 | 1/2016 | Yasumoto et al. |
| 2016/0079320 A1 | 3/2016 | Kim et al. |
| 2016/0133864 A1 | 5/2016 | Kim et al. |
| 2016/0222165 A1 | 8/2016 | Wakita et al. |
| 2017/0092885 A1 | 3/2017 | Sakuishi et al. |
| 2017/0110620 A1 | 4/2017 | Hino et al. |
| 2017/0158805 A1 | 6/2017 | Su |
| 2017/0200891 A1 | 7/2017 | Suga et al. |
| 2017/0278878 A1 | 9/2017 | Kuwabara et al. |
| 2017/0293171 A1 | 10/2017 | Yamazaki et al. |
| 2017/0294462 A1 | 10/2017 | Yamazaki et al. |
| 2017/0294463 A1 | 10/2017 | Yamazaki et al. |
| 2017/0297793 A1 | 10/2017 | Matoba et al. |
| 2017/0299965 A1 | 10/2017 | Hashimoto et al. |
| 2017/0301860 A1 | 10/2017 | Yamazaki et al. |
| 2017/0305134 A1 | 10/2017 | Hirakata |
| 2017/0309731 A1 | 10/2017 | Yamazaki et al. |
| 2017/0329162 A1 | 11/2017 | Yamazaki et al. |
| 2018/0012751 A1 | 1/2018 | Kamochi et al. |
| 2018/0040647 A1 | 2/2018 | Yamazaki et al. |
| 2018/0047609 A1 | 2/2018 | Ohno et al. |
| 2018/0061638 A1 | 3/2018 | Yamazaki et al. |
| 2018/0061639 A1 | 3/2018 | Yamazaki et al. |
| 2018/0085859 A1 | 3/2018 | Yamazaki et al. |
| 2018/0165996 A1 | 6/2018 | Ochi et al. |

FOREIGN PATENT DOCUMENTS

| | | |
|---|---|---|
| EP | 3171390 A | 5/2017 |
| JP | 2000-306441 A | 11/2000 |
| JP | 2001-066593 A | 3/2001 |
| JP | 2002-196702 A | 7/2002 |
| JP | 2003-098977 A | 4/2003 |
| JP | 2004-296162 A | 10/2004 |
| JP | 2007-232882 A | 9/2007 |
| JP | 2013-038229 A | 2/2013 |
| JP | 2013-080876 A | 5/2013 |
| JP | 2013-221965 A | 10/2013 |
| JP | 2014-127521 A | 7/2014 |
| JP | 2015-078254 A | 4/2015 |
| JP | 2015-173104 A | 10/2015 |
| JP | 2015-187987 A | 10/2015 |
| JP | 2015-223823 | 12/2015 |
| JP | 2016-031930 A | 3/2016 |
| KR | 10-0382824 | 5/2003 |
| KR | 2016-0015158 A | 2/2016 |
| KR | 2016-0124756 A | 10/2016 |
| TW | 514607 | 12/2002 |
| TW | 201539779 | 10/2015 |
| TW | 201616703 | 5/2016 |
| WO | WO-2013/035298 | 3/2013 |
| WO | WO-2014/050933 | 4/2014 |
| WO | WO-2015/125046 | 8/2015 |
| WO | WO-2016/152906 | 9/2016 |
| WO | WO-2018/029546 | 2/2018 |

OTHER PUBLICATIONS

Sakuishi.T et al., "Transmissive OLED and Reflective LC Hybrid (TR-Hybrid) Display with High Visibility and Low Power Consumption", SID Digest '16 ; SID International Symposium Digest of Technical Papers, May 22, 2016, vol. 47, pp. 735-738.

Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

Shieh.H, "Transflective display by Hybrid OLED and LCD", LEOS 2005 (IEEE Lasers and Electro-Optics Society Annual Meeting) , Oct. 22, 2005, pp. 650-651, IEEE.

Lee.J et al., "High ambient-contrast-ratio display using tandem reflective liquid crystal display and organic light-emitting device", Optics Express, Nov. 14, 2005, vol. 13, No. 23, pp. 9431-9438.

French.I et al., "54.2: Thin Plastic Electrophoretic Displays Fabricated by a Novel Process", SID Digest '05 : SID International Symposium Digest of Technical Papers, May 24, 2005, vol. 36, pp. 1634-1637.

Yoon.J et al., "World 1st Large Size 18-inch Flexible OLED Display and the Key Technologies", SID Digest '15 : SID International Symposium Digest of Technical Papers, Jun. 2, 2015, pp. 962-965.

Ko.M et al., "Late-News Paper: Joule Heating Induced Lift-off Technology for Large Area Flexible AMOLED Displays", SID Digest '11 : SID International Symposium Digest of Technical Papers, 2011, vol. 42, No. 1, pp. 118-120.

Hong.S et al., "Development of Commercial Flexible AMOLEDs", SID Digest '14 : SID International Symposium Digest of Technical Papers, Jun. 1, 2014, vol. 45, pp. 334-337.

International Search Report (Application No. PCT/IB2017/052918) dated Jul. 4, 2017.

Written Opinion (Application No. PCT/IB2017/052918) dated Jul. 4, 2017.

\* cited by examiner

FIG. 22A1
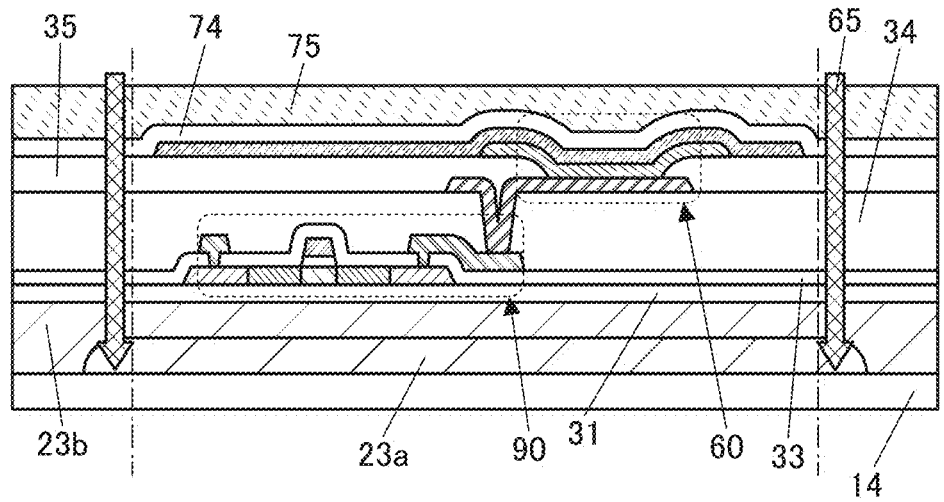
FIG. 22A2
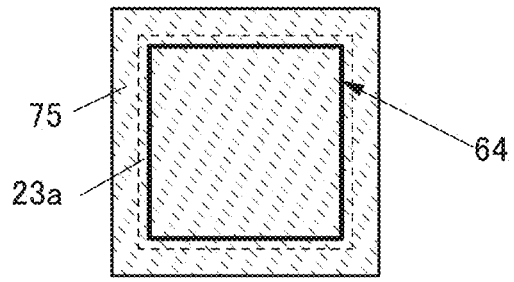
FIG. 22B
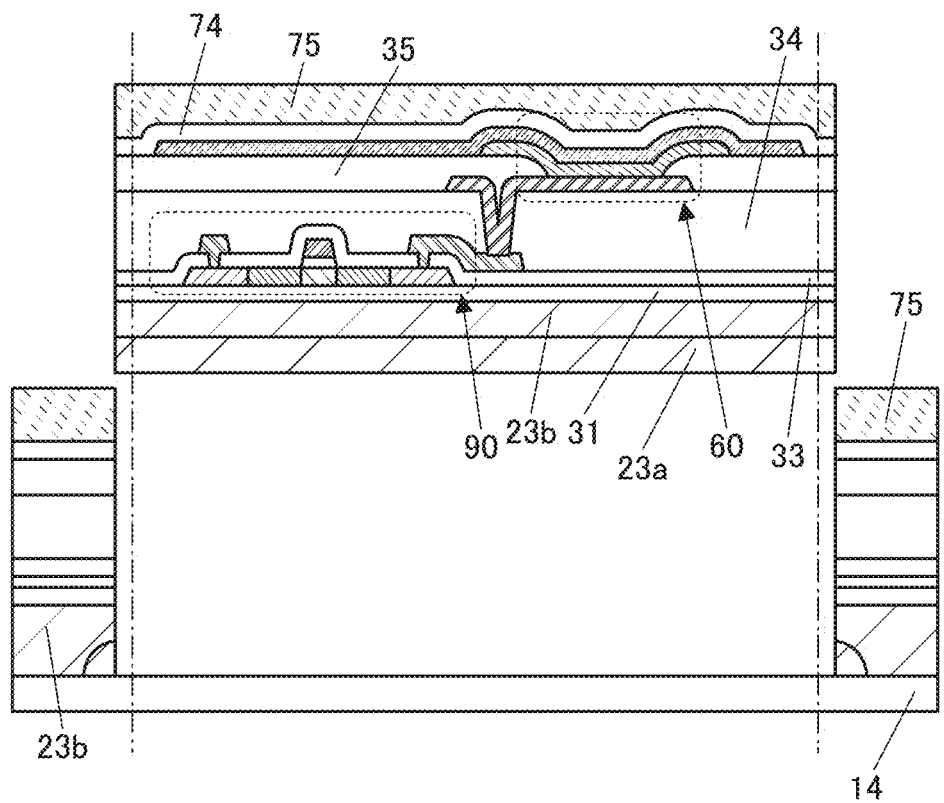

FIG. 42A1
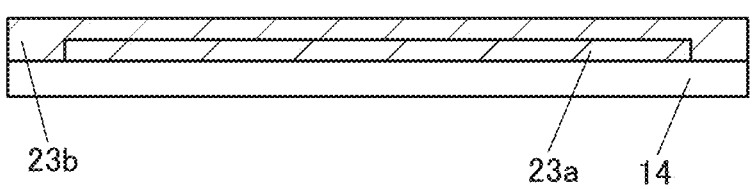
FIG. 42A2
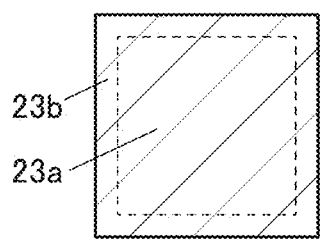
FIG. 42B
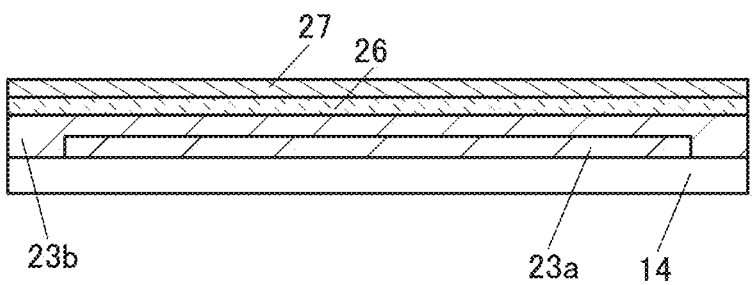
FIG. 42C1
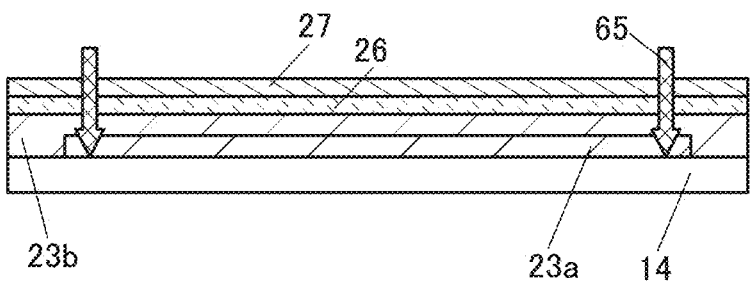
FIG. 42C2
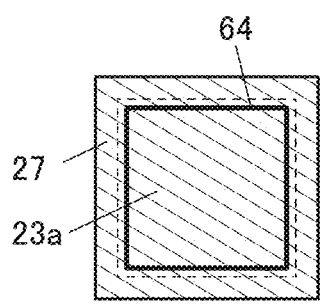
FIG. 42D
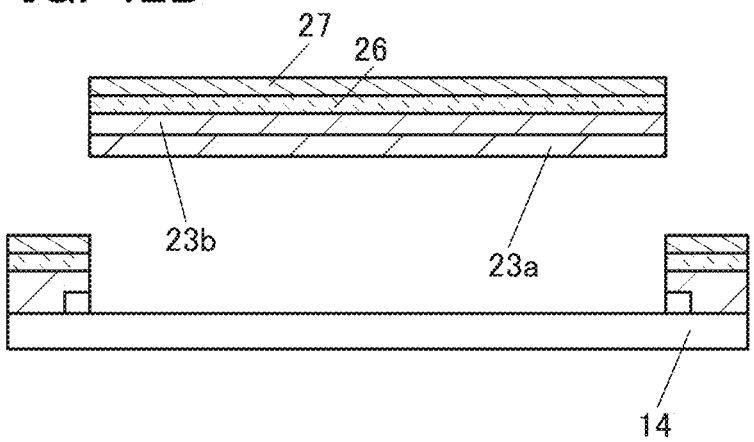

SEPARATION METHOD, DISPLAY DEVICE, DISPLAY MODULE, AND ELECTRONIC DEVICE

TECHNICAL FIELD

One embodiment of the present invention relates to a separation method, a display device, a display module, an electronic device, and a manufacturing method of a display device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (such as a touch sensor), an input/output device (such as a touch panel), a method for driving any of them, and a method for manufacturing any of them.

In this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

BACKGROUND ART

Display devices using organic electroluminescent (EL) elements or liquid crystal elements have been known. Examples of the display device also include a light-emitting device provided with a light-emitting element such as a light-emitting diode (LED), and electronic paper performing display with an electrophoretic method or the like.

The organic EL element generally has a structure in which a layer containing a light-emitting organic compound is provided between a pair of electrodes. By voltage application to this element, the light-emitting organic compound can emit light. A display device including such an organic EL element can be thin and lightweight and have high contrast and low power consumption.

Further, by forming a semiconductor element such as a transistor and a display element such as the organic EL element over a flexible substrate (film), a flexible display device can be provided.

Patent Document 1 discloses a method for manufacturing a flexible display device by separating a heat-resistant resin layer from a supporting substrate (a glass substrate) after the glass substrate provided with a heat-resistant resin layer and electronic elements is irradiated with laser light through a sacrificial layer.

REFERENCE

Patent Document

[Patent Document 1] Japanese Published Patent Application No. 2015-223823

DISCLOSURE OF INVENTION

An object of one embodiment of the present invention is to provide a novel separation method or a novel manufacturing method of a display device. An object of one embodiment of the present invention is to provide a separation method or a manufacturing method of a display device at low cost with high mass productivity. An object of one embodiment of the present invention is to provide a separation method with a high yield. An object of one embodiment of the present invention is to perform separation using a large-sized substrate. An object of one embodiment of the present invention is to manufacture a display device using a large-sized substrate. An object of one embodiment of the present invention is to provide a manufacturing method of a display device with a simplified manufacturing process. An object of one embodiment of the present invention is to manufacture a display device at low temperatures.

Another object of one embodiment of the present invention is to provide a display device with low power consumption. Another object of one embodiment of the present invention is to provide a display device with high visibility regardless of the ambient brightness. Another object of one embodiment of the present invention is to provide an all-weather display device. Another object of one embodiment of the present invention is to provide a display device with high convenience. Another object of one embodiment of the present invention is to provide a display device with high reliability. Another object of one embodiment of the present invention is to reduce the thickness or weight of a display device. Another object of one embodiment of the present invention is to provide a display device having flexibility or a curved surface. Another object of one embodiment of the present invention is to provide a robust display device. Another object of one embodiment of the present invention is to provide a novel display device, a novel input/output device, a novel electronic device, or the like.

Note that the descriptions of these objects do not disturb the existence of other objects. One embodiment of the present invention does not necessarily achieve all the objects. Further, it is a problem that a polarizing plate having a high polarization degree is expensive.

One embodiment of the present invention is a separation method including the steps of forming a first layer over a substrate with use of a material containing a resin or a resin precursor; performing a first heat treatment on the first layer while supplying a gas containing oxygen to form a first resin layer; forming a layer to be separated over the first resin layer; and separating the layer and the substrate from each other.

One embodiment of the present invention is a separation method including the steps of forming a first layer over a substrate with use of a material containing a resin or a resin precursor; performing a first heat treatment on the first layer while supplying a gas containing oxygen to form a first resin layer; forming an insulating layer covering an end portion of the first resin layer over the substrate and the first resin layer; forming a transistor containing a metal oxide in a channel formation region over the first resin layer with the insulating layer positioned therebetween; separating at least part of the first resin layer from the substrate to form a separation starting point; and separating the transistor and the substrate from each other.

One embodiment of the present invention is a separation method including the steps of forming a first layer over a substrate with use of a material containing a resin or a resin precursor; performing a first heat treatment on the first layer in an atmosphere containing oxygen to form a first resin layer; forming a second layer covering an end portion of the first resin layer over the substrate and the first resin layer; performing a second heat treatment on the second layer in an atmosphere containing less oxygen than the atmosphere of the first treatment to form a second resin layer covering an end portion of the first resin layer; forming a transistor including a metal oxide in a channel formation region over the first resin layer with the second resin layer positioned therebetween; separating at least part of the first resin layer from the substrate to form a separation starting point; and separating the transistor and the substrate from each other.

One embodiment of the present invention is a separation method including the steps of forming a first layer over a substrate with use of a material containing a resin or a resin precursor; performing a first heat treatment on the first layer while supplying a gas containing oxygen to form a first resin layer; forming a second layer covering an end portion of the first resin layer over the substrate and the first resin layer; performing a second heat treatment on the second layer without supplying a gas containing oxygen or while supplying a gas whose proportion of oxygen is lower than a proportion of a gas used in the first heat treatment; forming a transistor including a metal oxide in a channel formation region over the first resin layer with the second resin layer positioned therebetween; separating at least part of the first resin layer from the substrate to form a separation starting point; and separating the transistor and the substrate from each other.

The second heat treatment may be performed while supplying a nitrogen gas.

The second heat treatment may be performed at a temperature lower than the temperature of the first heat treatment while supplying a mixed gas containing nitrogen and oxygen.

In the case where the temperature of the second heat treatment is lower than the temperature of the first heat treatment, the proportion of oxygen in the gas used in the first heat treatment may be equal to the proportion of oxygen in the gas used in the second heat treatment.

The first heat treatment may be performed while supplying a mixed gas in which the proportion of an oxygen gas flow rate in a whole gas flow rate is greater than or equal to 5% and less than or equal to 50%.

The first heat treatment may be performed at a temperature of greater than or equal to 350° C. and less than or equal to 450° C. while supplying a mixed gas containing nitrogen and oxygen.

The first resin layer may be formed to a thickness greater than or equal to 1 μm and less than or equal to 3 μm.

The first layer may be formed with use of a solution with a viscosity of greater than or equal to 5 cP and less than 100 cP.

The first layer may be formed using a spin coater.

It is preferable that the transistor be manufactured at a temperature lower than or equal to the temperature of the first heat treatment.

The first layer may be formed using a photosensitive resin.

One embodiment of the present invention is a display device including a first resin layer, a second resin layer over the first resin layer, a transistor over the second resin layer, and a display element electrically connected to the transistor. The oxygen concentration measured by X-ray photoelectron spectroscopy (XPS) analysis performed on a surface of the first resin layer that is opposite to a surface on the second resin layer side is higher than or equal to 10 atomic %. The first resin layer preferably has a thickness greater than or equal to 1 μm and less than or equal to 3 μm. The transistor preferably includes metal oxide in a channel formation region.

One embodiment of the present invention is a display module including any of the above display devices and a circuit board such as a flexible printed circuit (FPC).

One embodiment of the present invention is an electronic device including the above display module and at least one of an antenna, a battery, a housing, a camera, a speaker, a microphone, and an operation button.

One embodiment of the present invention can provide a novel separation method or a novel manufacturing method of a display device. One embodiment of the present invention can provide a separation method or a manufacturing method of a display device at low cost with high mass productivity. One embodiment of the present invention can provide a separation method with a high yield. One embodiment of the present invention can perform separation using a large-sized substrate. One embodiment of the present invention can manufacture a display device using a large-sized substrate. One embodiment of the present invention can provide a manufacturing method of a display device with a simplified manufacturing process. One embodiment of the present invention can manufacture a display device at low temperatures.

One embodiment of the present invention can provide a display device with low power consumption. One embodiment of the present invention can provide a display device with high visibility regardless of the ambient brightness. One embodiment of the present invention can provide an all-weather display device. One embodiment of the present invention can provide a display device with high convenience. One embodiment of the present invention can provide a display device with high reliability. One embodiment of the present invention can reduce the thickness or weight of a display device. One embodiment of the present invention can provide a display device with flexibility or having a curved surface. One embodiment of the present invention can provide a display device that is unlikely to be broken. One embodiment of the present invention can provide a novel display device, a novel input/output device, a novel electronic device, or the like.

Note that the description of these effects does not preclude the existence of other effects. One embodiment of the present invention does not necessarily have all the effects listed above. Other effects can be derived from the description of the specification, the drawings, the claims, and the like.

BRIEF DESCRIPTION OF DRAWINGS

FIGS. 4A, 4B, 4C, 4D1, 4D2, and 4E are cross-sectional views illustrating an example of a manufacturing method of a display device.

FIGS. 5A, 5B1, and 5B2 are cross-sectional views and a top view illustrating an example of a manufacturing method of a display device.

FIGS. 22A1, 22A2, and 22B are cross-sectional views and a top view illustrating an example of a manufacturing method of a display device.

FIGS. 42A1, 42A2, 42B, 42C1, 42C2, and 42D are cross-sectional views and top views illustrating a separation method in Example 2.

BEST MODE FOR CARRYING OUT THE INVENTION

Figure 1A:
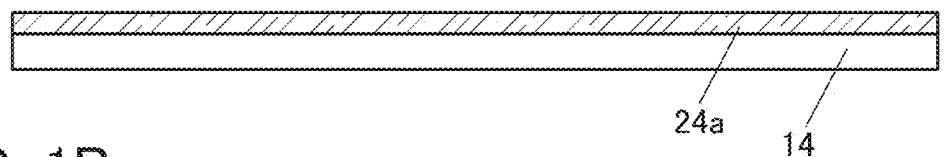
FIGS. 1A to 1E are cross-sectional views illustrating an example of a manufacturing method of a display device.

Embodiments will be described in detail with reference to drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Further, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". Also, the term "insulating film" can be changed into the term "insulating layer".

Note that in this specification and the like, a "substrate" preferably has a function of supporting at least one of a functional circuit, a functional element, a functional film, and the like. A "substrate" does not necessary have a function of supporting a functional circuit, a functional element, a functional film, and the like, and may have a function of protecting a surface of the device, or a function of sealing at least one of a functional circuit, a functional element, a functional film, and the like, for example.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" might be stated. CAAC refers to an example of a crystal structure, and CAC refers to an example of a function or a material composition.

An example of a crystal structure of an oxide semiconductor or a metal oxide is described. Note that an oxide semiconductor deposited by a sputtering method using an In—Ga—Zn oxide target (In:Ga:Zn=4:2:4.1 in an atomic ratio) is described below as an example. An oxide semiconductor formed by a sputtering method using the above-mentioned target at a substrate temperature of higher than or equal to 100° C. and lower than or equal to 130° C. is referred to as sIGZO, and an oxide semiconductor formed by a sputtering method using the above-mentioned target with the substrate temperature set at room temperature (R.T.) is referred to as tIGZO. For example, sIGZO has one or both crystal structures of nano crystal (nc) and CAAC. Furthermore, tIGZO has a crystal structure of nc. Note that room temperature (R.T.) herein also refers to a temperature of the time when a substrate is not heated intentionally.

In this specification and the like, CAC-OS or CAC-metal oxide has a function of a conductor in a part of the material and has a function of a dielectric (or insulator) in another part of the material; as a whole, CAC-OS or CAC-metal oxide has a function of a semiconductor. In the case where CAC-OS or CAC-metal oxide is used in a semiconductor layer of a transistor, the conductor has a function of letting electrons (or holes) serving as carriers flow, and the dielectric has a function of not letting electrons serving as carriers flow. By the complementary action of the function as a conductor and the function as a dielectric, CAC-OS or CAC-metal oxide can have a switching function (on/off function). In the CAC-OS or CAC-metal oxide, separation of the functions can maximize each function.

In this specification and the like, CAC-OS or CAC-metal oxide includes conductor regions and dielectric regions. The conductor regions have the above-described function of the conductor, and the dielectric regions have the above-described function of the dielectric. In some cases, the conductor regions and the dielectric regions in the material are separated at the nanoparticle level. In some cases, the conductor regions and the dielectric regions are unevenly distributed in the material. When observed, the conductor regions are coupled in a cloud-like manner with their boundaries blurred, in some cases.

In other words, CAC-OS or CAC-metal oxide can be called a matrix composite or a metal matrix composite.

Furthermore, in the CAC-OS or CAC-metal oxide, the conductor regions and the dielectric regions each have a size of more than or equal to 0.5 nm and less than or equal to 10 nm, preferably more than or equal to 0.5 nm and less than or equal to 3 nm and are dispersed in the material, in some cases.

(Embodiment 1)

In this embodiment, a separation method of one embodiment of the present invention and a manufacturing method of a display device of one embodiment of the present invention will be described with reference to FIGS. 1A to 1E, FIGS. 2A to 2C, FIGS. 3A to 3C, FIGS. 4A, 4B, 4C, 4D1, 4D2, and 4E, FIGS. 5A, 5B1, and 5B2, FIGS. 6A and 6B, FIGS. 7A to 7C, FIGS. 8A and 8B, FIGS. 9A to 9C, FIGS. 10A to 10C, FIGS. 11A to 11C, FIGS. 12A and 12B, FIGS. 13A and 13B, FIGS. 14A and 14B, FIGS. 15A and 15B, FIGS. 16A and 16B, FIGS. 17A to 17E, FIGS. 18A and 18B, FIGS. 19A and 19B, and FIGS. 20A and 20B.

In this embodiment, a display device that includes a transistor and an organic EL element (also referred to as an active matrix organic EL display device) will be described as an example. The display device can have flexibility by using a flexible material for a substrate. Note that one embodiment of the present invention is not limited to a light-emitting device, a display device, and an input/output device (e.g., a touch panel) that include organic EL elements, and one embodiment of the present invention can be applied to a variety of devices such as a semiconductor device, a light-emitting device, a display device, and an input/output device that include other kinds of functional elements.

In the separation method of one embodiment of the present invention, first, a material including a resin or a resin precursor is formed as a first layer over the substrate. Then, first heat treatment is performed on the first layer, whereby a first resin layer is formed. Then, a layer to be separated is formed over the first resin layer. Then, the layer to be separated and the substrate are separated from each other. The first heat treatment is performed in an atmosphere containing oxygen. The first heat treatment is preferably performed while supplying a gas containing oxygen.

The first resin layer formed by heating the first layer in an atmosphere containing enough oxygen includes a large amount of oxygen and thus can be easily separated from the substrate.

In the separation method of one embodiment of the present invention, the first resin layer can be easily separated from the substrate by controlling heat conditions used to form the first resin layer. That is, a step of irradiating an entire surface of the first resin layer with laser light to increase the separability of the first resin layer is not necessary.

If the entire surface of the first resin layer is irradiated with laser light, use of a linear laser beam is suitable, but a laser apparatus for the linear laser beam irradiation is expensive and requires high running costs. In the separation method of one embodiment of the present invention, the laser apparatus is not necessary, leading to significant cost savings. Moreover, the separation method is easily applicable to a large-sized substrate.

Because the step of irradiating the entire surface of the first resin layer with laser light through the substrate is not performed, the substrate can be prevented from being damaged by the laser light irradiation. The substrate after being used once is less likely to decrease in strength; thus, the substrate can be reused, leading to cost savings.

In another separation method of one embodiment of the present invention, first, a material including a resin or a resin precursor is formed as a first layer over a substrate. Then, first heat treatment is performed on the first layer, whereby a first resin layer is formed. Then, an insulating layer covering an end portion of the first resin layer is formed over the substrate and the first resin layer. Then, a transistor including metal oxide in a channel formation region is formed over the first resin layer with the insulating layer positioned between the first resin layer and the transistor. Then, a separation starting point is formed by separating at least part of the first resin layer from the substrate. Then, the transistor and the substrate are separated from each other.

The first heat treatment is performed in an atmosphere containing oxygen. The first heat treatment is preferably performed while supplying a gas containing oxygen.

A portion that is in contact with the first resin layer and a portion that is in contact with the insulating layer are provided for the substrate. The insulating layer is formed covering the end portion of the first resin layer. The adhesion of the insulating layer to the substrate is stronger than the adhesion of the first resin layer to the substrate. By the formation of the insulating layer covering the end portion of the first resin layer, unintentional separation of the first resin layer from the substrate can be inhibited even in the case where the first resin layer has high separability. For example, separation of the first resin layer that will occur at the time of transferring the substrate can be inhibited. Furthermore, the separation starting point enables separation of the substrate and the first resin layer from each other at a desired time. That is, in the separation method of this embodiment, the time at which the separation occurs can be controlled and high separability can be achieved. This can improve the yield of the separation process and the manufacturing process of the display device.

In another separation method of one embodiment of the present invention, first, a material including a resin or a resin precursor is formed as a first layer over a substrate. Then, first heat treatment is performed on the first layer in an atmosphere containing oxygen, whereby a first resin layer is formed. Then, a second layer covering an end portion of the first resin layer is formed over the substrate and the first resin layer. Then, second heat treatment is performed on the second layer in an atmosphere containing less oxygen than the atmosphere of the first heat treatment, whereby a second resin layer covering the end portion of the first resin layer is formed. Then, a transistor including metal oxide in a channel formation region is formed over the first resin layer with the second resin layer positioned between the first resin layer and the transistor. Then, a separation starting point is formed by separating at least part of the first resin layer from the substrate. Then, the transistor and the substrate are separated from each other.

The first heat treatment is performed in an atmosphere containing oxygen. The first heat treatment is preferably performed while supplying a gas containing oxygen.

The second heat treatment is preferably performed in an atmosphere containing less oxygen than the atmosphere of the first heat treatment. The second heat treatment is preferably performed without supplying a gas containing oxygen or while supplying a gas whose proportion of oxygen is lower than that of a gas used in the first heat treatment.

The separability of the second resin layer is lower than the separability of the first resin layer because the second resin layer is formed by heating in the atmosphere containing less oxygen than the atmosphere of the first heat treatment.

Note that in some cases, it can be confirmed that the amount of oxygen contained in the first resin layer is larger than the amount of oxygen contained in the second resin layer through analysis of the oxygen amount or oxygen concentration in the film or of the film surface. Specifically, analysis using secondary ion mass spectrometry (SIMS), XPS, or the like can be used.

A portion that is in contact with the first resin layer and a portion that is in contact with the second resin layer are provided for the substrate. The second resin layer is formed covering the end portion of the first resin layer. The adhesion of the second resin layer to the substrate is stronger than the adhesion of the first resin layer to the substrate. By the formation of the second resin layer covering the end portion of the first resin layer, separation of the first resin layer from the substrate that will occur at an unintended time can be inhibited even in the case where the first resin layer has high separability. Furthermore, the separation starting point enables separation of the substrate and the first resin layer from each other at a desired time. That is, in the separation method of this embodiment, the time at which the separation occurs can be controlled and high separability can be achieved. This can improve the yield of the separation process and the manufacturing process of the display device.

Note that even when the atmosphere of the first heat treatment is the same as the atmosphere of the second heat treatment, the separability of the first resin layer can be made different from the separability of the second resin layer in some cases by setting the temperature of the second heat treatment sufficiently lower than the temperature of the first heat treatment.

The first layer and the second layer may be formed using a photosensitive material. With the photosensitive material, a resin layer with a desired shape can be easily formed.

The display device of this embodiment preferably includes metal oxide in the channel formation region of the transistor. The metal oxide can serve as an oxide semiconductor.

In the case where low temperature polysilicon (LTPS) is used for the channel formation region of the transistor, the first resin layer and the second resin layer are required to have heat resistance because heat at a temperature of approximately 500° C. to 550° C. needs to be applied. Furthermore, the first resin layer and the second resin layer need to have a large thickness so that damage in a step of laser crystallization is reduced.

In contrast, the transistor including the metal oxide in the channel formation region can be formed at a temperature lower than or equal to 350° C., or even lower than or equal to 300° C. Thus, the first resin layer and the second resin layer are not required to have high heat resistance. Accordingly, the heat resistant temperature of the first resin layer and the second resin layer can be low, and the range of choices for the materials can be widened. Furthermore, the transistor including metal oxide in the channel formation region does not need a laser crystallization step; thus, the first resin layer and the second resin layer can be thin. Since first resin layer and the second resin layer are not required to have high heat resistance and can be thinned, the manufacturing costs of a device can be significantly reduced. Metal oxide is preferably used, in which case the steps can be simplified as compared with the case where LTPS is used.

The first resin layer and the second resin layer may each have a thickness greater than or equal to 0.1 μm and less than or equal to 3 μm. By forming the first resin layer and the second resin layer thin, the display device can be manufactured at low cost. The display device can be light-weight and thin. The display device can have higher flexibility.

In this embodiment, the transistor or the like is formed at a temperature lower than or equal to the heat resistance temperature of the first resin layer and lower than or equal to the heat resistance temperature of the second resin layer. The heat resistance of the resin layer can be measured by, for example, a weight loss percentage due to heat, specifically, the 5% weight loss temperature. In the separation method and the manufacturing method of the display device of this embodiment, the maximum process temperature can be low. For example, the 5% weight loss temperature of the first resin layer and the 5% weight loss temperature of the second resin layer can each be higher than or equal to 200° C. and lower than or equal to 550° C., higher than or equal to 200°

C. and lower than or equal to 450° C., higher than or equal to 200° C. and lower than or equal to 400° C., or higher than or equal to 200° C. and lower than or equal to 350° C. Thus, the range of choices for the material is widened. Note that the 5% weight loss temperature of the first resin layer or the second resin layer may be higher than 550° C.

The manufacturing method of the display device of this embodiment will be specifically described below.

Note that the thin films included in the display device (i.e., the insulating film, the semiconductor film, the conductive film, and the like) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As an example of the thermal CVD method, a metal organic chemical vapor deposition (MOCVD) method may be used.

Alternatively, the thin films constituting the display device (i.e., the insulating film, the semiconductor film, the conductive film, and the like) can be formed by a method such as spin coating, dipping, spray coating, inkjet printing, dispensing, screen printing, or offset printing, or with a doctor knife, a slit coater, a roll coater, a curtain coater, or a knife coater.

When thin films included in the display device are processed, a lithography method or the like can be used for the processing. Alternatively, island-shaped thin films may be formed by a film formation method using a blocking mask. Alternatively, the thin films may be processed by a nano-imprinting method, a sandblasting method, a lift-off method, or the like. As the photolithography method, there are a method in which a resist mask is formed over a thin film to be processed, the thin film is processed by etching or the like, and the resist mask is removed and a method in which a photosensitive thin film is formed, and the photosensitive thin film is exposed to light and developed to be processed in a desirable shape.

In the case of using light in the lithography method, any of an i-line (light with a wavelength of 365 nm), a g-line (light with a wavelength of 436 nm), and an h-line (light with a wavelength of 405 nm), or combined light of any of them can be used for exposure. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of the thin film, dry etching, wet etching, a sandblast method, or the like can be used.

[Manufacturing Method Example 1]

First, a first layer 24a is formed over a formation substrate 14 (FIG. 1A).

In FIG. 1A, an example of forming the first layer 24a over an entire surface of the formation substrate 14 by a coating method is shown. The formation method is not limited to a coating method, and the first layer 24a may be formed over the formation substrate 14 by a printing method or the like. The first layer 24a that has an island-like shape, the first layer 24a that has an opening or an uneven shape, or the like may be formed over the formation substrate 14.

The first layer 24a can be formed using any of a variety of resin materials (including a resin precursor).

The first layer 24a is preferably formed using a thermosetting material.

The first layer 24a may be formed using a material having photosensitivity or a material that does not have photosensitivity (also referred to as a non-photosensitive material).

In the case where a photosensitive material is used for the first layer 24a, part of the first layer 24a can be removed by a lithography method using light, whereby the first resin layer 23a with a desired shape can be formed.

The first layer 24a is preferably formed using a material containing a polyimide resin or a polyimide resin precursor. The first layer 24a can be formed using, for example, a material containing a polyimide resin and a solvent or a material containing polyamic acid and a solvent. A polyimide is a material that is suitably used for formation of a planarization film or the like of a display device, and therefore, the film formation apparatus and the material can be shared. Thus, there is no need to prepare another apparatus and another material to obtain the structure of one embodiment of the present invention.

Examples of resin materials which can be used to form the first resin layer 24a include an acrylic resin, an epoxy resin, a polyamide resin, a polyimide-amide resin, a siloxane resin, a benzocyclobutene-based resin, and a phenol resin, a precursor of any of the resins, and the like.

The first layer 24a is preferably formed with a spin coater. The spin coating method enables formation of a uniform thin film over a large substrate.

The first layer 24a is preferably formed using a solution having a viscosity of greater than or equal to 5 cP and less than 500 cP, further preferably greater than or equal to 5 cP and less than 100 cP, still further preferably greater than or equal to 10 cP and less than or equal to 50 cP. The lower the viscosity of the solution is, the easier the coating is. Furthermore, the lower the viscosity of the solution is, the more the entry of bubbles can be prevented, leading to a film with good quality.

Alternatively, the first layer 24a can be formed by dipping, spray coating, ink-jetting, dispensing, screen printing, or offset printing, or with a doctor knife, a slit coater, a roll coater, a curtain coater, or a knife coater, for example.

The formation substrate 14 has stiffness high enough for easy transfer and has resistance to heat applied in the manufacturing process. Examples of a material that can be used for the formation substrate 14 include glass, quartz, ceramics, sapphire, a resin, a semiconductor, a metal, and an alloy. Examples of the glass include alkali-free glass, barium borosilicate glass, and aluminoborosilicate glass.

Figure 1B:
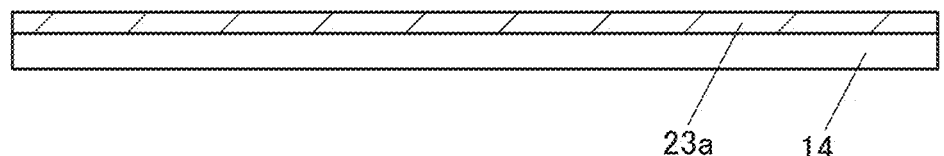

Then, first heat treatment is performed on the first layer 24a, whereby the first resin layer 23a is formed (FIG. 1B).

The first heat treatment is performed in an atmosphere containing oxygen.

The larger the amount of oxygen contained in the first resin layer 23a is, the smaller the force required for separation of the first resin layer 23a can be. The higher the proportion of oxygen in the atmosphere of the first heat treatment is, the larger the amount of oxygen contained in the first resin layer 23a can be, so that the separability of the first resin layer 23a can be increased.

The first heat treatment can be performed using an atmosphere containing oxygen in a chamber of a heating apparatus, for example. Alternatively, the first heat treatment can be performed with a hot plate or the like in an air atmosphere.

The partial pressure of oxygen in the atmosphere at the time of performing the first heat treatment is preferably higher than or equal to 5% and lower than 100%, further preferably higher than or equal to 10% and lower than 100%, still further preferably higher than or equal to 15% and lower than 100%.

The first heat treatment is preferably performed while supplying a gas containing oxygen into the chamber of the heating apparatus. For example, the first heat treatment is preferably performed while supplying only an oxygen gas or a mixed gas containing an oxygen gas. Specifically, a mixed gas containing oxygen and nitrogen or a rare gas (such as argon) can be used.

Some heat apparatuses deteriorate in the case where the proportion of oxygen in the atmosphere is high. Therefore, in the case where a mixed gas containing an oxygen gas is used, the proportion of the flow rate of the oxygen gas in the flow rate of the whole mixed gas is preferably set higher than or equal to 5% and lower than or equal to 50%, further preferably higher than or equal to 10% and lower than or equal to 50%, still further preferably higher than or equal to 15% and lower than or equal to 50%.

The temperature of the first heat treatment is preferably higher than or equal to 200° C. and lower than or equal to 500° C., further preferably higher than or equal to 250° C. and lower than or equal to 475° C., still further preferably higher than or equal to 300° C. and lower than or equal to 450° C.

The higher the temperature of the first heat treatment is, the higher the separability of the first resin layer 23a can be.

By the first heat treatment, released gas components (e.g., hydrogen or water) in the first resin layer 23a can be reduced. In particular, heating is preferably performed at a temperature higher than or equal to the formation temperature of each layer formed over the first resin layer 23a. Thus, a gas released from the first resin layer 23a in the manufacturing process of the transistor can be significantly reduced.

For example, in the case where the manufacturing temperature of the transistor is below 350° C., a film to be the first resin layer 23a is preferably heated at a temperature higher than or equal to 350° C. and lower than or equal to 450° C., further preferably higher than or equal to 350° C. and lower than or equal to 400° C., still further preferably higher than or equal to 350° C. and lower than or equal to 375° C. Thus, a gas released from the first resin layer 23a in the manufacturing process of the transistor can be significantly reduced.

The maximum temperature in manufacturing the transistor is preferably equal to the temperature of the first heat treatment, in which case the maximum temperature in manufacturing the display device can be prevented from being increased by the first heat treatment.

The longer the heating time of the first heat treatment is, the higher the separability of the first resin layer 23a can be.

By increasing the heating time of the treatment, even when the heating temperature is comparatively low, the separability equivalent to that obtained in heating at a high temperature can be obtained in some cases. Therefore, in the case where the heating temperature cannot be increased because of the structure of the heating apparatus, it is preferable to increase the heating time of the treatment.

The heating time of the first heat treatment is preferably longer than or equal to 5 minutes and shorter than or equal to 24 hours, further preferably longer than or equal to 30 minutes and shorter than or equal to 12 hours, still further preferably longer than or equal to 1 hour and shorter than or equal to 6 hours, for example. Note that the heating time of the first heat treatment is not limited to this. The heating time of the first heat treatment may be shorter than 5 minutes in the case where the first heat treatment is performed by rapid thermal annealing (RTA), for example.

As the heating apparatus, any of a variety of apparatuses, e.g., an electric furnace or an apparatus for heating an object by heat conduction or heat radiation from a heating element such as a resistance heating element, can be used. For example, an RTA apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. With the RTA apparatus, the process time can be shortened and thus the RTA apparatus is preferred for mass production. Alternatively, an in-line heating apparatus may be used in the heat treatment.

In the case where a resin is used in a planarization layer or the like of the display device, for example, heating is generally performed under the conditions where oxygen is hardly contained and at the lowest temperature in a temperature range in which the resin is cured, thereby preventing change in quality of the resin due to oxidation. In contrast, in one embodiment of the present invention, heating is performed at a comparatively high temperature (e.g., a temperature higher than or equal to 200° C.) with a surface of the first layer 24a to be the first resin layer 23a exposed to an atmosphere positively containing oxygen. Thus, the first resin layer 23a can have high separability.

Note that by the heat treatment, the thickness of the first resin layer 23a is changed from the thickness of the first layer 24a in some cases. For example, by the removal of a solvent contained in the first layer 24a or density increase due to the increase in stiffness, the volume is decreased, so that the thickness of the first resin layer 23a becomes smaller than the thickness of the first layer 24a in some cases. Alternatively, owing to oxygen contained at the time of performing the heat treatment, the volume is increased, so that the thickness of the first resin layer 23a becomes larger than the thickness of the first layer 24a in some cases.

Before the first heat treatment is performed, thermal treatment (also referred to as pre-baking treatment) for removing a solvent contained in the first layer 24a may be performed. The temperature of the pre-baking treatment can be determined as appropriate in consideration of a material to be used. The pre-baking treatment can be performed at a temperature of, for example, higher than or equal to 50° C. and lower than or equal to 180° C., higher than or equal to 80° C. and lower than or equal to 150° C., or higher than or equal to 90° C. and lower than or equal to 120° C. The first heat treatment may also serve as the pre-baking treatment; that is, a solvent contained in the first layer 24a may be removed by the first heat treatment.

The first resin layer 23a has flexibility. The formation substrate 14 has lower flexibility than the first resin layer 23a.

The first resin layer 23a preferably has a thickness greater than or equal to 0.01 μm and less than 10 μm, further preferably greater than or equal to 0.1 μm and less than or equal to 3 μm, and still further preferably greater than or equal to 0.5 μm and less than or equal to 2 μm. With the use of a solution with low viscosity, the first resin layer 23a can be easily made thin. When the first resin layer 23a has a thickness in the above range, the display device can have higher flexibility. The force required for separating the first resin layer 23a is found to be small when the thickness of the first resin layer 23a is large (see Example 2). Accordingly, the first resin layer 23a preferably has a thickness of 1 µm or more. The thickness of the first resin layer 23a is not limited thereto, and may be greater than or equal to 10 µm. For example, the first resin layer 23a may have a thickness greater than or equal to 10 µm and less than or equal to 200 µm. The first resin layer 23a having a thickness greater than or equal to 10 µm is favorable because the rigidity of the display device can be increased.

The first resin layer 23a preferably has a thermal expansion coefficient greater than or equal to 0.1 ppm/° C. and less than or equal to 50 ppm/° C., further preferably greater than or equal to 0.1 ppm/° C. and less than or equal to 20 ppm/° C., still further preferably greater than or equal to 0.1 ppm/° C. and less than or equal to 10 ppm/° C. As the first resin layer 23a has a lower thermal expansion coefficient, generation of a crack in a layer included in a transistor or the like and breakage of a transistor or the like which are caused owing to the heat treatment can be further prevented.

In the case where the first resin layer 23a is positioned on the display surface side of the display device, the first resin layer 23a preferably has a high visible-light transmitting property.

Figure 1C:
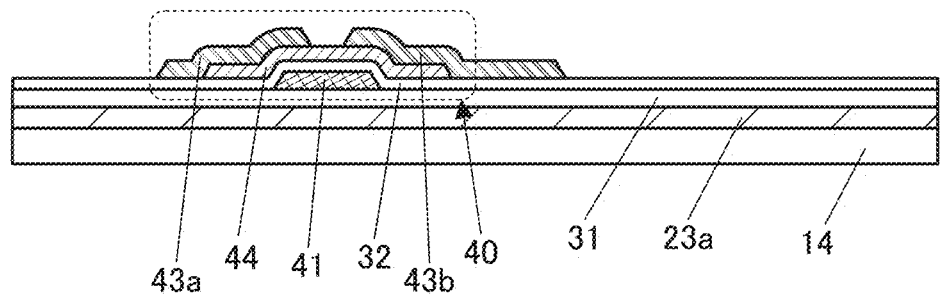

Next, an insulating layer 31 is formed over the first resin layer 23a (FIG. 1C).

The insulating layer 31 is formed at a temperature lower than or equal to the heat resistant temperature of the first resin layer 23a. The insulating layer 31 is preferably formed at a temperature lower than or equal to the temperature of the first heat treatment and may be formed at a temperature lower than the temperature of the first heat treatment.

The insulating layer 31 can be used as a barrier layer that prevents impurities contained in the first resin layer 23a from diffusing into a transistor and a display element formed later. For example, the insulating layer 31 preferably prevents moisture and the like contained in the first resin layer 23a from diffusing into the transistor and the display element when the first resin layer 23a is heated. Thus, the insulating layer 31 preferably has a high barrier property.

For the insulating layer 31, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, a yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. It is particularly preferable that a silicon nitride film be formed over the first resin layer 23a and a silicon oxide film be formed over the silicon nitride film.

Note that in this specification and the like, silicon oxynitride contains more oxygen than nitrogen, and silicon nitride oxide contains more nitrogen than oxygen.

An inorganic insulating film is preferably formed at high temperatures because the film can have higher density and barrier property as the deposition temperature becomes higher.

The substrate temperature during the deposition of the insulating layer 31 is preferably higher than or equal to room temperature (25° C.) and lower than or equal to 350° C., further preferably higher than or equal to 100° C. and lower than or equal to 300° C.

Next, a transistor 40 is formed over the insulating layer 31 (FIG. 1C).

There is no particular limitation on the structure of the transistor in the display device. For example, a planar transistor, a staggered transistor, or an inverted staggered transistor may be used. A top-gate transistor or a bottom-gate transistor may be used. Gate electrodes may be provided above and below a channel.

Here, the case where a bottom-gate transistor including a metal oxide layer 44 is formed as the transistor 40 is described. The metal oxide layer 44 can serve as a semiconductor layer of the transistor 40. Metal oxide can serve as an oxide semiconductor.

In this embodiment, an oxide semiconductor is used as a semiconductor in the transistor. A semiconductor material having a wider band gap and a lower carrier density than silicon is preferably used because off-state current of the transistor can be reduced.

The transistor 40 is formed at a temperature lower than or equal to the heat resistant temperature of the first resin layer 23a. The transistor 40 is preferably formed at a temperature lower than or equal to the temperature of the first heat treatment and may be formed at a temperature lower than the temperature of the first heat treatment.

Specifically, first, a conductive layer 41 is formed over the insulating layer 31. The conductive layer 41 can be formed in the following manner: a conductive film is formed, a resist mask is formed, the conductive film is etched, and the resist mask is removed.

The substrate temperature during the deposition of the conductive film is preferably higher than or equal to room temperature and lower than or equal to 350° C., further preferably higher than or equal to room temperature and lower than or equal to 300° C.

The conductive layers included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO containing gallium, or ITO containing silicon may be used. Alternatively, a semiconductor such as an oxide semiconductor or polycrystalline silicon whose resistance is lowered by containing an impurity element or the like, or silicide such as nickel silicide may be used. A film including graphene may be used as well. The film including graphene can be formed, for example, by reducing a film containing graphene oxide. A semiconductor such as an oxide semiconductor containing an impurity element may be used. Alternatively, the film including graphene may be formed using a conductive paste of silver, carbon, copper, or the like or a conductive polymer such as a polythiophene. A conductive paste is preferable because it is inexpensive. A conductive polymer is preferable because it is easily applied.

Next, an insulating layer 32 is formed. For the insulating layer 32, the description of the inorganic insulating film that can be used for the insulating layer 31 can be referred to.

Then, the metal oxide layer 44 is formed. The metal oxide layer 44 can be formed in the following manner: a metal oxide film is formed, a resist mask is formed, the metal oxide film is etched, and the resist mask is removed.

The substrate temperature during the deposition of the metal oxide film is preferably lower than or equal to 350° C., further preferably higher than or equal to room temperature and lower than or equal to 200° C., still further preferably higher than or equal to room temperature and lower than or equal to 130° C.

The metal oxide film can be formed using one of or both an inert gas and an oxygen gas. Note that there is no particular limitation on the flow rate ratio of oxygen (the partial pressure of oxygen) during the deposition of the metal oxide film. To obtain a transistor having high field-effect mobility, the percentage of oxygen flow rate (the partial pressure of oxygen) during the deposition of the metal oxide film is preferably higher than or equal to 0% and lower than or equal to 30%, further preferably higher than or equal to 5% and lower than or equal to 30%, still further preferably higher than or equal to 7% and lower than or equal to 15%.

The metal oxide film preferably contains at least indium or zinc. In particular, indium and zinc are preferably contained.

The energy gap of the metal oxide is preferably 2 eV or more, further preferably 2.5 eV or more, and still further preferably 3 eV or more. With the use of metal oxide having such a wide energy gap, the off-state current of the transistor can be reduced.

Such a metal oxide film can be formed by a sputtering method. Alternatively, a PLD method, a PECVD method, a thermal CVD method, an ALD method, a vacuum evaporation method, or the like may be used.

Next, a conductive layer 43a and a conductive layer 43b are formed. The conductive layers 43a and 43b can be formed in the following manner: a conductive film is formed, a resist mask is formed, the conductive film is etched, and the resist mask is removed. Each of the conductive layers 43a and 43b is connected to the metal oxide layer 44.

Note that during the processing of the conductive layers 43a and 43b, the metal oxide layer 44 might be partly etched to be thin in a region not covered by the resist mask.

The substrate temperature during the deposition of the conductive film is preferably higher than or equal to room temperature and lower than or equal to 350° C., further preferably higher than or equal to room temperature and lower than or equal to 300° C.

In the above manner, the transistor 40 can be formed (FIG. 1C). In the transistor 40, part of the conductive layer 41 functions as a gate, part of the insulating layer 32 functions as a gate insulating layer, and the conductive layer 43a and the conductive layer 43b function as a source and a drain.

Figure 1D:
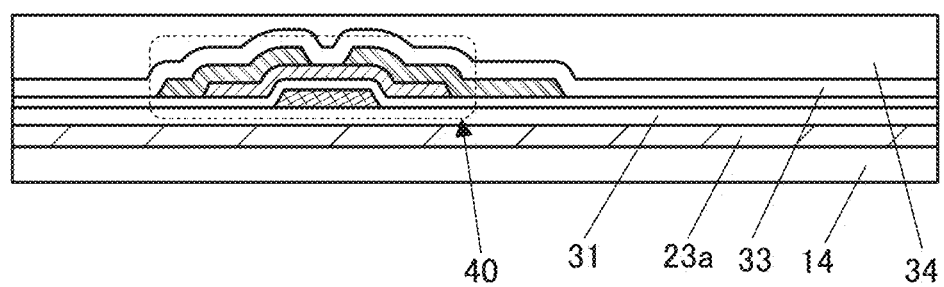

After that, an insulating layer 33 that covers the transistor 40 is formed (FIG. 1D). The insulating layer 33 can be formed in a manner similar to that of the insulating layer 31.

It is preferable to use an oxide insulating film, such as a silicon oxide film or a silicon oxynitride film, formed in an atmosphere containing oxygen for the insulating layer 33. An insulating film with low oxygen diffusibility and oxygen permeability, such as a silicon nitride film, is preferably stacked over the silicon oxide film or the silicon oxynitride film. The oxide insulating film formed in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the metal oxide layer 44.

As a result, oxygen vacancies in the metal oxide layer 44 can be filled and defects at the interface between the metal oxide layer 44 and the insulating layer 33 can be repaired, leading to a reduction in defect levels. Accordingly, an extremely highly reliable display device can be fabricated.

Through the above steps, the insulating layer 31, the transistor 40, and the insulating layer 33 can be formed over the first resin layer 23a (FIG. 1D).

If the formation substrate 14 and the transistor 40 are separated from each other at this stage by a method described later, a device including no display element can be manufactured. For example, the transistor 40 is formed, a capacitor, a resistor, a wiring, and the like are formed in addition to the transistor 40, and the formation substrate 14 and the transistor 40 are separated from each other by a method described later, so that a semiconductor device can be manufactured, for example.

Then, an insulating layer 34 is formed over the insulating layer 33 (FIG. 1D). The display element is formed on the insulating layer 34 in a later step; thus, the insulating layer 34 preferably functions as a planarization layer. For the insulating layer 34, the description of the organic insulating film or the inorganic insulating film that can be used for the insulating layer 31 can be referred to.

The insulating layer 34 is formed at a temperature lower than or equal to the heat resistant temperature of the first resin layer 23a. The insulating layer 34 is preferably formed at a temperature lower than or equal to the temperature of the first heat treatment and may be formed at a temperature lower than the temperature of the first heat treatment.

In the case of using an organic insulating film for the insulating layer 34, a temperature applied to the first resin layer 23a at the formation of the insulating layer 34 is preferably higher than or equal to room temperature and lower than or equal to 350° C. and further preferably higher than or equal to room temperature and lower than or equal to 300° C.

In the case of using an inorganic insulating film for the insulating layer 34, substrate temperature during the deposition is preferably higher than or equal to room temperature and lower than or equal to 350° C., and further preferably higher than or equal to 100° C. and lower than or equal to 300° C.

Next, an opening reaching the conductive layer 43b is formed in the insulating layer 34 and the insulating layer 33.

Figure 1E:
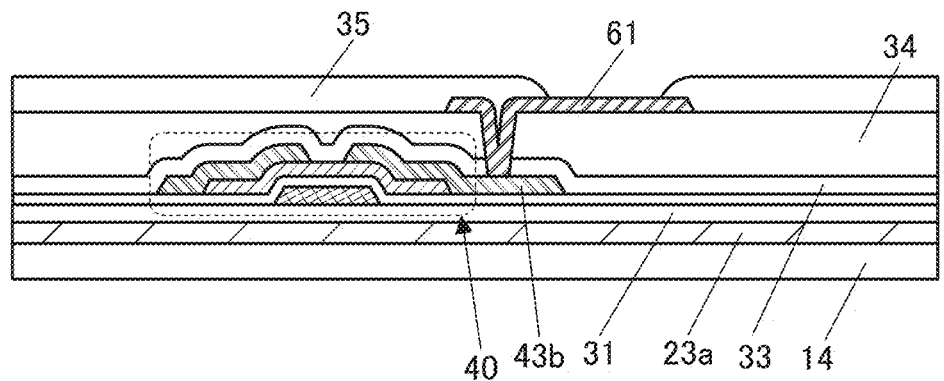

Then, a conductive layer 61 is formed (FIG. 1E). Part of the conductive layer 61 functions as a pixel electrode of the light-emitting element 60. The conductive layer 61 can be formed in the following manner: a conductive film is formed, a resist mask is formed, the conductive film is etched, and the resist mask is removed.

The conductive layer 61 is formed at a temperature lower than or equal to the heat resistant temperature of the first resin layer 23a. The conductive layer 61 is preferably formed at a temperature lower than or equal to the temperature of the first heat treatment and may be formed at a temperature lower than the temperature of the first heat treatment.

The substrate temperature during the deposition of the conductive film is preferably higher than or equal to room temperature and lower than or equal to 350° C., further preferably higher than or equal to room temperature and lower than or equal to 300° C.

Then, an insulating layer 35 that covers an end portion of the conductive layer 61 is formed (FIG. 1E). For the insulating layer 35, the description of the organic insulating film or the inorganic insulating film that can be used for the insulating layer 31 can be referred to.

The insulating layer 35 is formed at a temperature lower than or equal to the heat resistant temperature of the first resin layer 23a. The insulating layer 35 is preferably formed at a temperature lower than or equal to the temperature of the first heat treatment and may be formed at a temperature lower than the temperature of the first heat treatment.

In the case of using an organic insulating film for the insulating layer 35, a temperature applied to the first resin layer 23a at the formation of the insulating layer 35 is preferably higher than or equal to room temperature and lower than or equal to 350° C. and further preferably higher than or equal to room temperature and lower than or equal to 300° C.

In the case of using an inorganic insulating film for the insulating layer 35, substrate temperature during the deposition is preferably higher than or equal to room temperature and lower than or equal to 350° C., and further preferably higher than or equal to 100° C. and lower than or equal to 300° C.

Figure 2A:
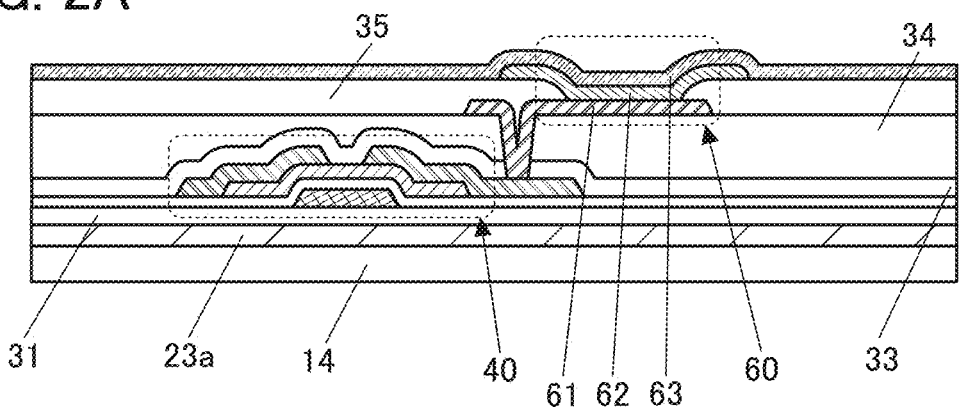
FIGS. 2A to 2C are cross-sectional views illustrating an example of a manufacturing method of a display device.

Then, an EL layer 62 and a conductive layer 63 are formed (FIG. 2A). Part of the conductive layer 63 functions as a common electrode of the light-emitting element 60.

The EL layer 62 can be formed by an evaporation method, a coating method, a printing method, a discharge method, or the like. In the case where the EL layer 62 is formed for each individual pixel, an evaporation method using a blocking mask such as a metal mask, an ink-jet method, or the like can be used. In the case of sharing the EL layer 62 by some pixels, an evaporation method not using a metal mask can be used.

Either a low molecular compound or a high molecular compound can be used for the EL layer 62, and an inorganic compound may also be included.

The conductive layer 63 can be formed by an evaporation method, a sputtering method, or the like.

The conductive layer 63 is formed at a temperature lower than or equal to the heat resistant temperature of the first resin layer 23a and lower than or equal to the heat resistant temperature of the EL layer 62. The conductive layer 63 is preferably formed at a temperature lower than or equal to the temperature of the first heat treatment and may be formed at a temperature lower than the temperature of the first heat treatment.

In the above manner, the light-emitting element 60 can be completed (FIG. 2A). In the light-emitting element 60, the conductive layer 61 part of which functions as a pixel electrode, the EL layer 62, and the conductive layer 63 part of which functions as a common electrode are stacked.

Although a top-emission light-emitting element is formed as the light-emitting element 60 here, one embodiment of the present invention is not limited thereto.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

Figure 2B:
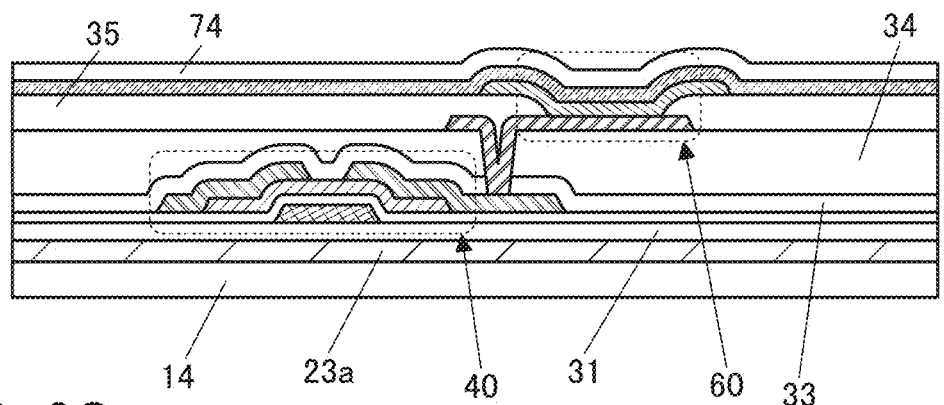

Then, an insulating layer 74 is formed covering the conductive layer 63 (FIG. 2B). The insulating layer 74 functions as a protective layer that prevents diffusion of impurities such as water into the light-emitting element 60. The light-emitting element 60 is sealed with the insulating layer 74. After the conductive layer 63 is formed, the insulating layer 74 is preferably formed without exposure to the air.

The insulating layer 74 is formed at a temperature lower than or equal to the heat resistant temperature of the first resin layer 23a and lower than or equal to the heat resistant temperature of the light-emitting element 60. The insulating layer 74 is preferably formed at a temperature lower than or equal to the temperature of the first heat treatment and may be formed at a temperature lower than the temperature of the first heat treatment.

The insulating layer 74 preferably includes an inorganic insulating film with a high barrier property that can be used for the insulating layer 31. A stack including an inorganic insulating film and an organic insulating film can also be used.

The insulating layer 74 can be formed by an ALD method, a sputtering method, or the like. An ALD method and a sputtering method are preferable because a film can be formed at low temperatures. An ALD method is preferable because the coverage of the insulating layer 74 is improved.

Figure 2C:
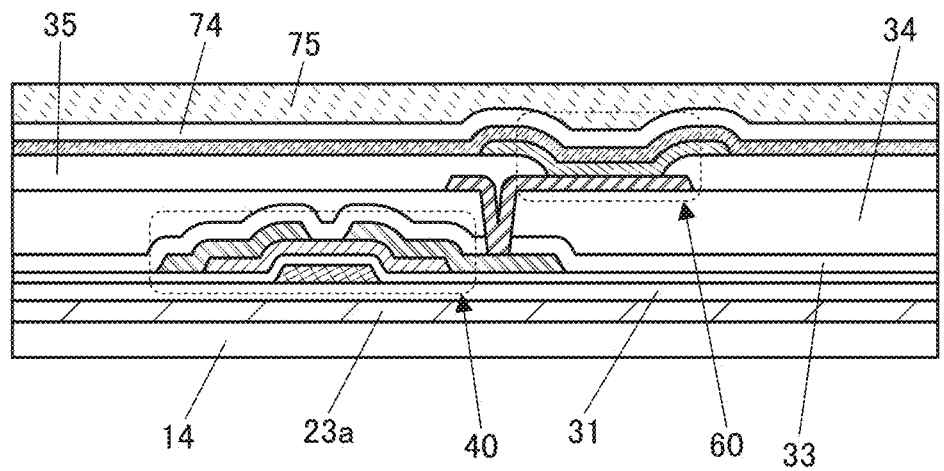

Then, a protective layer 75 is formed over the insulating layer 74 (FIG. 2C). The protective layer 75 can be used as a layer positioned on the outermost surface of the display device. The protective layer 75 preferably has a high visible-light transmitting property.

The above-described organic insulating film that can be used for the insulating layer 31 is preferably used for the protective layer 75 because the surface of the display device can be prevented from being damaged or cracked.

Figure 3A:
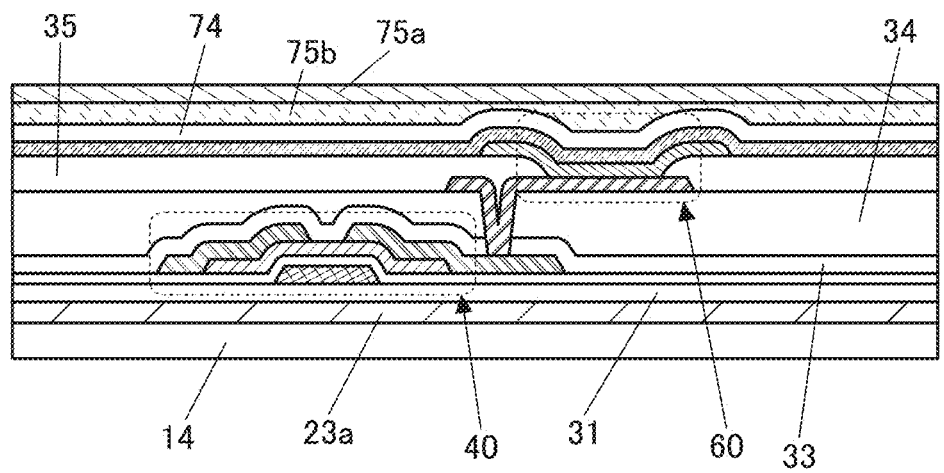
FIGS. 3A to 3C are cross-sectional views illustrating an example of a manufacturing method of a display device.

FIG. 3A illustrates an example in which a substrate 75a is attached to the insulating layer 74 with a bonding layer 75b.

As the bonding layer 75b, any of a variety of curable adhesives such as a reactive curable adhesive, a thermosetting adhesive, an anaerobic adhesive, and a photocurable adhesive such as an ultraviolet curable adhesive can be used. Still alternatively, an adhesive sheet or the like may be used.

For the substrate 75a, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. The substrate 75a formed using any of a variety of materials such as glass, quartz, a resin, a metal, an alloy, and a semiconductor may be thin enough to be flexible.

Figure 3B:
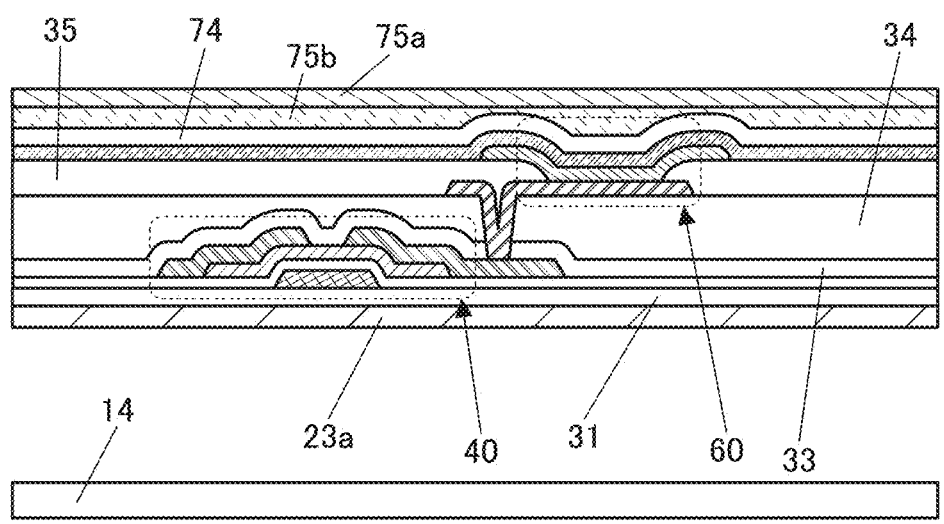

Then, the formation substrate 14 and the first resin layer 23a are separated from each other (FIG. 3B).

For example, the first resin layer 23a can be separated from the formation substrate 14 by applying a perpendicular tensile force to the first resin layer 23a. Specifically, the first resin layer 23a can be separated from the formation substrate 14 by pulling up the substrate 75a by part of its suction-attached top surface.

Here, if separation is performed in such a manner that liquid containing water such as water or an aqueous solution is added to the separation interface and the liquid penetrates into the separation interface, separation can be easily performed. Furthermore, an adverse effect of static electricity caused at separation on the functional element such as a transistor (e.g., damage to a semiconductor element from static electricity) can be suppressed.

Before the separation, a separation starting point may be formed by separating part of the first resin layer 23a from the formation substrate 14. For example, a separation starting point may be formed by inserting a sharp instrument such as a knife between the formation substrate 14 and the first resin layer 23a. Alternatively, a separation starting point may be formed by cutting the first resin layer 23a from the substrate 75a side with a sharp instrument. The separation starting point may be formed by a method using a laser such as a laser ablation method.

In the manufacturing method example 1, the first heat treatment is performed in the atmosphere containing oxygen at the time of forming the first resin layer 23a; thus, the formation substrate 14 and the first resin layer 23a can be separated from each other without performing laser irradiation on the entire surface of the first resin layer 23a. Consequently, the display device can be manufactured at low cost.

Figure 3C:
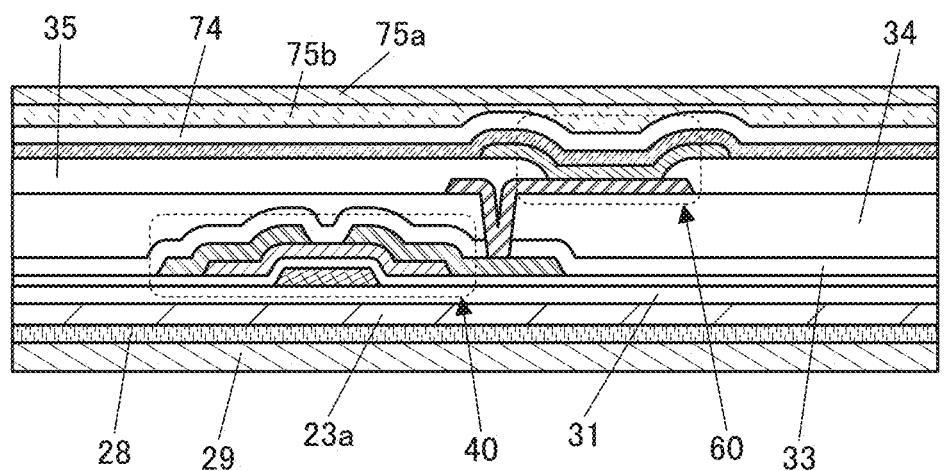

The first resin layer 23a that is exposed by being separated from the formation substrate 14 may be attached to a substrate 29 using a bonding layer 28 (FIG. 3C). The substrate 29 can serve as a support substrate of the display device.

The material that can be used for the bonding layer 75b can be used for the bonding layer 28. The material that can be used for the substrate 75a can be used for the substrate 29.

Through the above steps, the display device using metal oxide for the channel formation region of the transistor and a separate coloring method for an EL element can be fabricated.

[Manufacturing Method Example 2]

In a manufacturing method example given below, description of a portion similar to that in the above-described manufacturing method example is omitted in some cases.

Figure 4A:
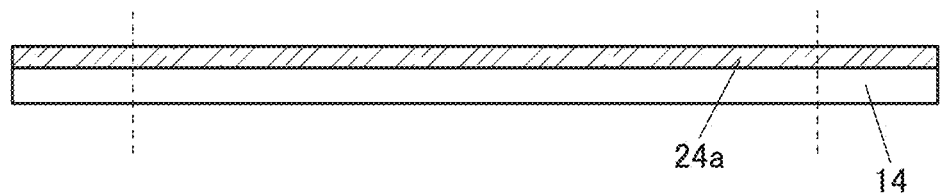

First, the first layer 24a is formed over the formation substrate 14 (FIG. 4A).

For a material and a method that are used to form the first layer 24a, the manufacturing method example 1 can be referred to.

In this embodiment, the first layer 24a is formed using a photosensitive and thermosetting material. Note that the first layer 24a may be formed using a non-photosensitive material.

Figure 4B:
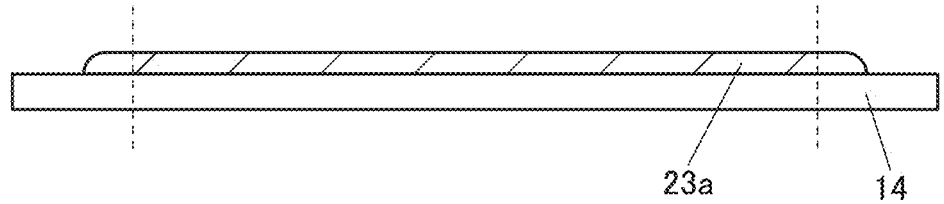

Heat treatment (prebaking treatment) for removing a solvent is performed after formation of the first layer 24a, and then light exposure is performed using a photomask. Next, development is performed, whereby an unnecessary portion can be removed. Subsequently, the first heat treatment is performed on the first layer 24a that has been processed into a desired shape, so that the first resin layer 23a is formed (FIG. 4B). In the example illustrated in FIG. 4B, the first resin layer 23a having an island-like shape is formed.

Note that the first resin layer 23a is not necessarily in the form of a single island and may be in the form of a plurality of islands or have an opening, for example. In addition, unevenness may be formed on the surface of the first resin layer 23a by an exposure technique using a half-tone mask or a gray-tone mask, a multiple exposure technique, or the like.

A mask such as a resist mask or a hard mask is formed over the first layer 24a or the first resin layer 23a and etching is performed, whereby the first resin layer 23a with a desired shape can be formed. This method is particularly suitable for the case of using a non-photosensitive material. The mask is preferably formed to be extremely thin so that it can be removed at the same time as it is etched, in which case the step of removing the mask can be omitted.

In a manner similar to that of the manufacturing method example 1, the first heat treatment is performed in an atmosphere containing oxygen. The first heat treatment is preferably performed while supplying a gas containing oxygen.

Figure 4C:
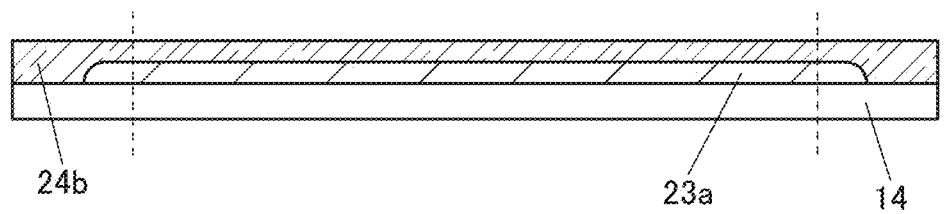
Figure 4C:
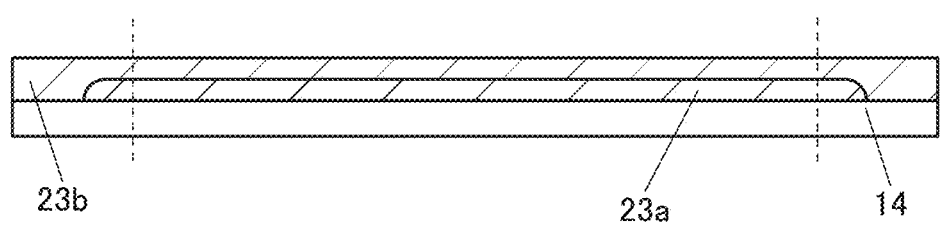
Figure 4C:
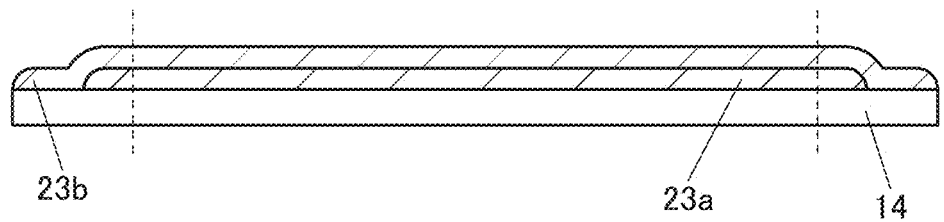

Then, a second layer 24b is formed over the formation substrate 14 and the first resin layer 23a (FIG. 4C). A portion where the first resin layer 23a is not provided exists over the formation substrate 14. Thus, a portion that is in contact with the second layer 24b can be formed on the formation substrate 14.

The second layer 24b can be formed using a material and a method that can be used to form the first layer 24a.

The second layer 24b is preferably formed by a coating method, in which case step coverage is improved and a surface of a second resin layer 23b described later can be flat.

The second layer 24b is preferably formed using a thermosetting material.

The second layer 24b may be formed using a material having photosensitivity or a material that does not have photosensitivity.

In this embodiment, the second layer 24b is formed using a photosensitive and thermosetting material.

Subsequently, the second heat treatment is performed on the second resin layer 24b, so that the second resin layer 23b is formed (FIG. 4D1).

The second heat treatment is performed in an atmosphere containing less oxygen than the atmosphere of the first heat treatment. The second heat treatment is preferably performed without supplying a gas containing oxygen or while supplying a gas whose proportion of oxygen is lower than that of a gas used in the first heat treatment.

The second heat treatment can be performed in a state where the atmosphere in a chamber of an apparatus is a nitrogen atmosphere or a rare gas atmosphere, for example.

The partial pressure of oxygen in performing the first heat treatment is preferably higher than or equal to 0% and lower than 15%, further preferably higher than or equal to 0% and lower than or equal to 10%, still further preferably higher than or equal to 0% and lower than or equal to 5%.

The second heat treatment is preferably performed while a gas that does not contain oxygen or a gas in which the proportion of oxygen is lower than the proportion of oxygen in the gas used in the first heat treatment is supplied into the chamber of the apparatus. The second heat treatment is preferably performed while only a nitrogen gas, only an argon gas, or a mixed gas containing oxygen is supplied. Specifically, a mixed gas containing oxygen and nitrogen or a rare gas (e.g., argon) can be used. The proportion of the flow rate of the oxygen gas in the flow rate of the whole mixed gas is preferably higher than 0% and lower than 15%, further preferably higher than 0% and lower than or equal to 10%, still further preferably higher than 0% and lower than or equal to 5%.

The temperature of the second heat treatment is preferably higher than or equal to 200° C. and lower than or equal to 500° C., further preferably higher than or equal to 250° C. and lower than or equal to 475° C., still further preferably higher than or equal to 300° C. and lower than or equal to 450° C.

By the second heat treatment, released gas components (e.g., hydrogen or water) in the second resin layer 23b can be reduced. In particular, heating is preferably performed at a temperature higher than or equal to the formation temperature of each layer formed over the second resin layer 23b. Thus, a gas released from the second resin layer 23b in the manufacturing process of the transistor can be significantly reduced.

For example, in the case where the manufacturing temperature of the transistor is below 350° C., a film to be the second resin layer 23*b* is preferably heated at a temperature higher than or equal to 350° C. and lower than or equal to 450° C., further preferably lower than or equal to 400° C., still further preferably lower than or equal to 375° C. Thus, a gas released from the second resin layer 23*b* in the manufacturing process of the transistor can be significantly reduced.

The maximum temperature in manufacturing the transistor is preferably equal to the temperature of the second heat treatment, in which case the maximum temperature in manufacturing the device can be prevented from being increased by the second heat treatment.

The longer the second heat treatment time is, the more sufficiently released gas components in the second resin layer 23*b* can be reduced.

By increasing the heating time of the heat treatment, even when the heating temperature is comparatively low, an effect equivalent to that obtained in heating at a high temperature can be obtained in some cases. Therefore, in the case where the heating temperature cannot be increased because of the structure of the apparatus, it is preferable to increase the heating time of the treatment.

The heating time of the second heat treatment is preferably longer than or equal to 5 minutes and shorter than or equal to 24 hours, further preferably longer than or equal to 30 minutes and shorter than or equal to 12 hours, still further preferably longer than or equal to 1 hour and shorter than or equal to 6 hours, for example. Note that the heating time of the second heat treatment is not limited to this. The heating time of the second heat treatment may be shorter than 5 minutes in the case where the second heat treatment is performed by RTA, for example.

Note that by the heat treatment, the thickness of the second resin layer 23*b* is changed from the thickness of the second layer 24*b* in some cases.

Before the second heat treatment is performed, thermal treatment (pre-baking treatment) for removing a solvent contained in the second layer 24*b* may be performed. The second heat treatment may also serve as the pre-baking treatment; that is, a solvent contained in the second layer 24*b* may be removed by the second heat treatment.

The second resin layer 23*b* has flexibility. The formation substrate 14 has lower flexibility than the second resin layer 23*b*.

The second resin layer 23*b* preferably has a thickness greater than or equal to 0.01 μm and less than 10 μm, further preferably greater than or equal to 0.1 μm and less than or equal to 3 μm, and still further preferably greater than or equal to 0.5 μm and less than or equal to 2 μm. With the use of a solution having low viscosity, the second resin layer 23*b* having a small thickness can be easily formed. When the second resin layer 23*b* has a thickness in the above range, the display device can have higher flexibility. The thickness of the second resin layer 23*b* is found not to affect the force required for separating the first resin layer 23*a* (see Example 2). Thus, it is considered that the second resin layer 23*b* can be formed thinner than the first resin layer 23*a*. Without being limited thereto, the thickness of the second resin layer 23*b* may be greater than or equal to 10 μm. For example, the second resin layer 23*b* may have a thickness greater than or equal to 10 μm and less than or equal to 200 μm. The second resin layer 23*b* that has a thickness greater than or equal to 10 μm is favorable because the rigidity of the display device can be increased.

The second resin layer 23*b* preferably has a thermal expansion coefficient greater than or equal to 0.1 ppm/° C. and less than or equal to 50 ppm/° C., further preferably greater than or equal to 0.1 ppm/° C. and less than or equal to 20 ppm/° C., still further preferably greater than or equal to 0.1 ppm/° C. and less than or equal to 10 ppm/° C. As the second resin layer 23*b* has a lower thermal expansion coefficient, generation of a crack in a layer included in a transistor or the like and breakage of a transistor or the like which are caused owing to the heat treatment can be further prevented.

In the case where the second resin layer 23*b* is positioned on the display surface side of the display device, the second resin layer 23*b* preferably has a high visible-light transmitting property.

The second resin layer 23*b* that does not have a planarizing function may be used. Although the second resin layer 23*b* has a flat top surface in an example shown in FIG. 4D1, the second resin layer 23*b* may have an uneven top surface as shown in FIG. 4D2.

Although the second resin layer 23*b* shown in FIG. 4D1 has an angular shape, the second resin layer 23*b* as well as the first resin layer 23*a* may have a tapered end portion.

The first resin layer 23*a* and the second resin layer 23*b* may be formed using different materials or the same material. The same material is preferably used because the cost can be reduced. Even when the same material is used, the degree of adhesion between the formation substrate 14 and the first resin layer 23*a* can be made different from that between the formation substrate 14 and the second resin layer 23*b* by performing the first treatment and the second heat treatment under different conditions.

Figure 4E:
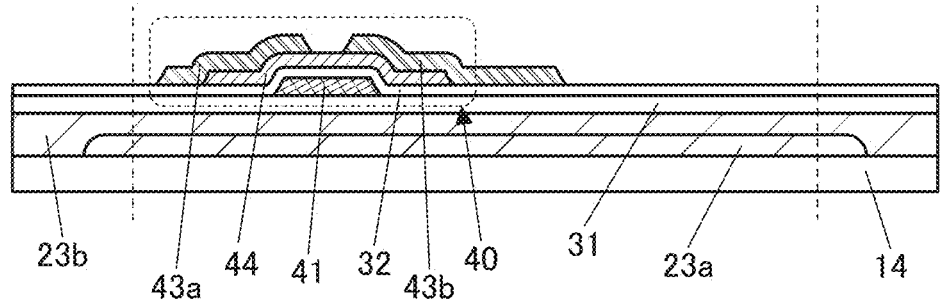

Next, the insulating layer 31 is formed over the second resin layer 23*b* (FIG. 4E).

The insulating layer 31 is formed at a temperature lower than or equal to the heat resistance temperature of the first resin layer 23*a* and lower than or equal to the heat resistance temperature of the second resin layer 23*b*. The insulating layer 31 is preferably formed at a temperature lower than or equal to the temperature of the first heat treatment and lower than or equal to the temperature of the second heat treatment and may be formed at a temperature lower than both of the temperature of the first heat treatment and the temperature of the second heat treatment.

The insulating layer 31 can be used as a barrier layer that prevents diffusion of impurities contained in the first resin layer 23*a* and the second resin layer 23*b* into a transistor and a display element formed later. For example, the insulating layer 31 preferably prevents moisture and the like contained in the first resin layer 23*a* and the second resin layer 23*b* from diffusing into the transistor and the display element when the first resin layer 23*a* and the second resin layer 23*b* are heated. Thus, the insulating layer 31 preferably has a high barrier property.

For the insulating layer 31, the material given as an example in the manufacturing method example 1 can be used.

Next, the transistor 40 is formed over the insulating layer 31 (FIG. 4E).

The transistor 40 is formed at a temperature lower than or equal to the heat resistance temperature of the first resin layer 23*a* and lower than or equal to the heat resistance temperature of the second resin layer 23*b*. The transistor 40 is preferably formed at a temperature lower than or equal to the temperature of the first heat treatment and lower than or equal to the temperature of the second heat treatment and may be formed at a temperature lower than both of the temperature of the first heat treatment and the temperature of the second heat treatment.

Figure 5A:
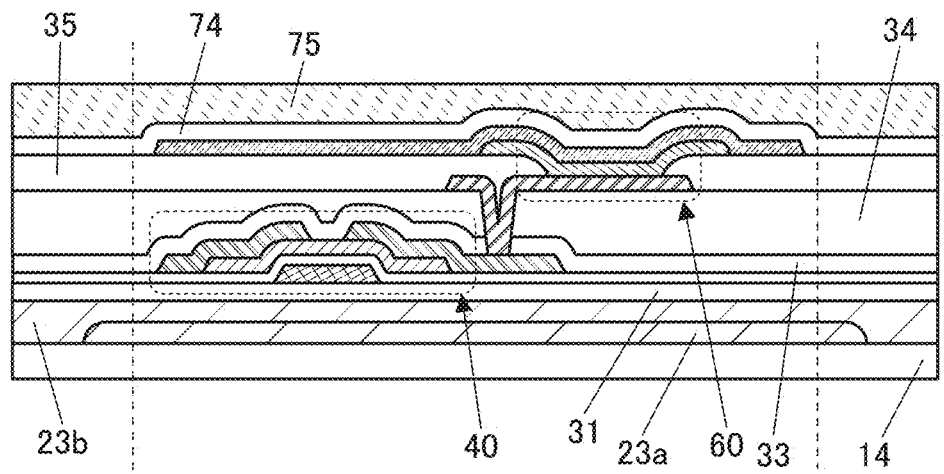
Figure 5A:
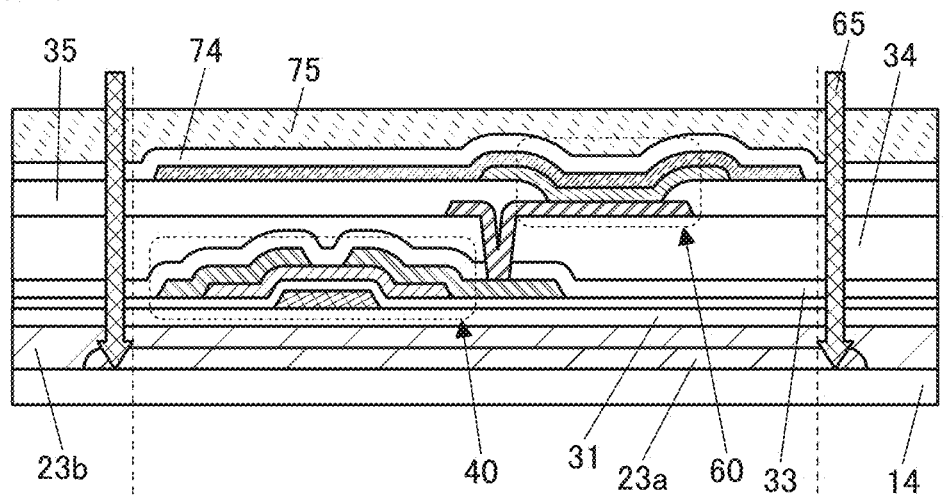
Figure 5A:
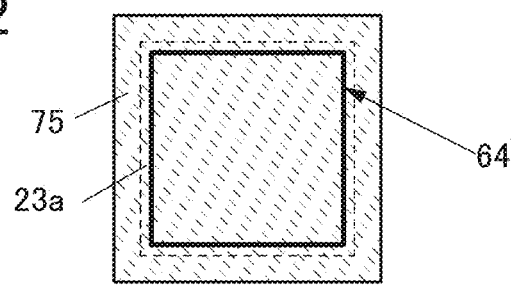

Then, in a manner similar to that described in the manufacturing method example 1, constituents from the insulating layer 33 to the protective layer 75 are formed (FIG. 5A). Note that the constituents are formed at a temperature lower than or equal to the heat resistance temperature of the first resin layer 23a and lower than or equal to the heat resistance temperature of the second resin layer 23b. The constituents are preferably formed at a temperature lower than or equal to the temperature of the first heat treatment and lower than or equal to the temperature of the second heat treatment and may be formed at a temperature lower than both of the temperature of the first heat treatment and the temperature of the second heat treatment.

Then, the separation starting point is formed in the first resin layer 23a (FIGS. 5B1 and 5B2).

For example, a sharp instrument 65 such as a knife is inserted from the protective layer 75 side into a portion inward from an end portion of the first resin layer 23a to form a frame-like-shaped cut 64.

The first resin layer 23a may be irradiated with laser light in a frame-like shape.

In the manufacturing method example 2, a portion that is in contact with the first resin layer 23a and a portion that is in contact with the second resin layer 23b are provided for the formation substrate 14. By the first heat treatment performed in the atmosphere containing oxygen, the first resin layer 23a becomes easy to separate from the formation substrate 14. In contrast, the second resin layer 23b is difficult to separate from the formation substrate 14 because the second heat treatment is performed in the atmosphere containing less oxygen than the atmosphere of the first heat treatment. Thus, separation of the first resin layer 23a from the formation substrate 14 that will occur at an unintended time can be inhibited. Furthermore, the separation starting point enables separation of the formation substrate 14 and the first resin layer 23a from each other at a desired time. As a result, the time at which the separation occurs can be controlled and high separability can be achieved. This can improve the yield of the separation process and the manufacturing process of the display device.

Figure 6A:
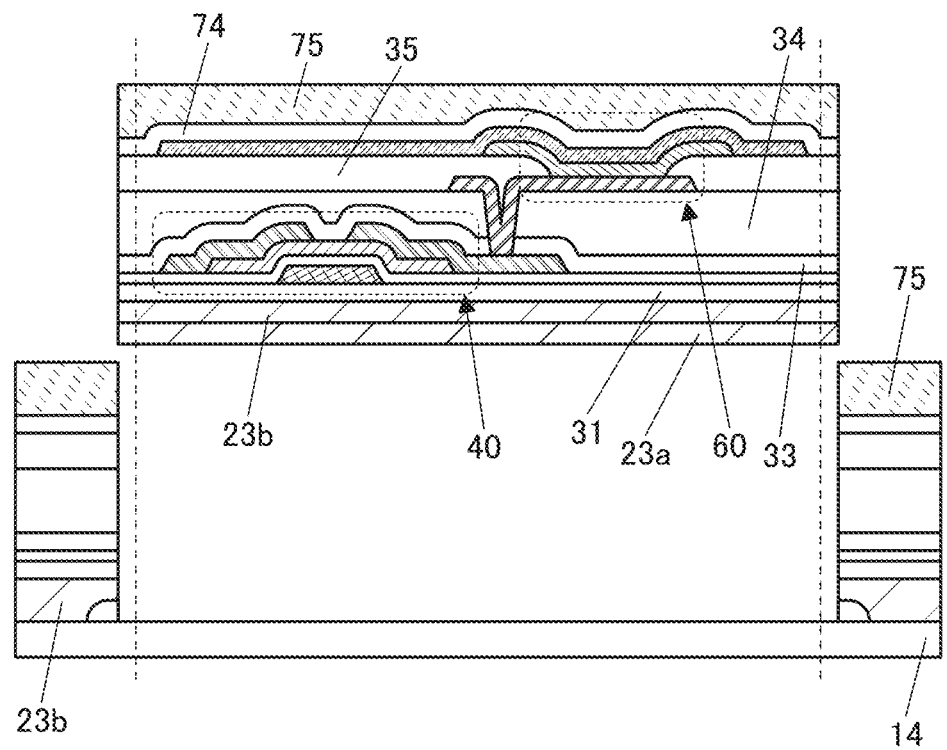
FIGS. 6A and 6B are cross-sectional views illustrating an example of a manufacturing method of a display device.

Then, the formation substrate 14 and the transistor 40 are separated from each other (FIG. 6A).

In the manufacturing method example 2, the first heat treatment is performed in the atmosphere containing oxygen at the time of forming the first resin layer 23a; thus, the formation substrate 14 and the first resin layer 23a can be separated from each other without performing laser irradiation on the entire surface of the first resin layer 23a. Consequently, the display device can be manufactured at low cost.

Figure 6B:
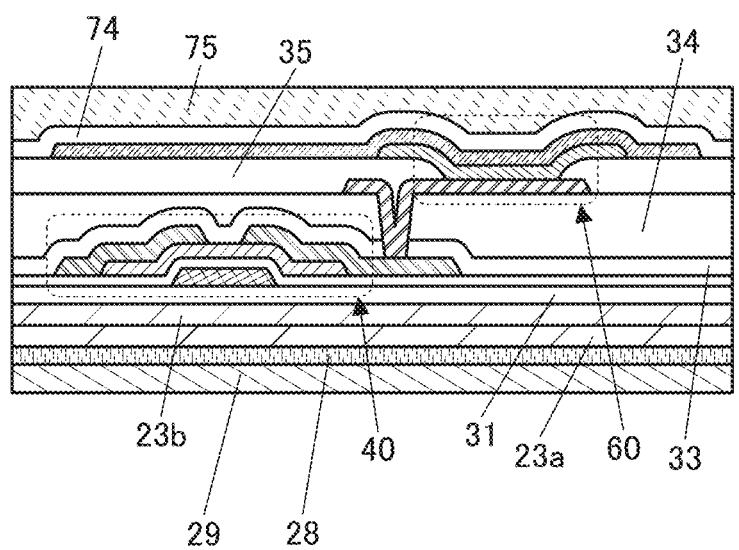

Then, the first resin layer 23a that is exposed by being separated from the formation substrate 14 is attached to the substrate 29 using the bonding layer 28 (FIG. 6B). The substrate 29 can serve as a support substrate of the display device.

Through the above steps, the display device using metal oxide in the channel formation region of the transistor and a separate coloring method for an EL element can be fabricated.

[Structure Example 1 of Display Device]

Figure 7A:
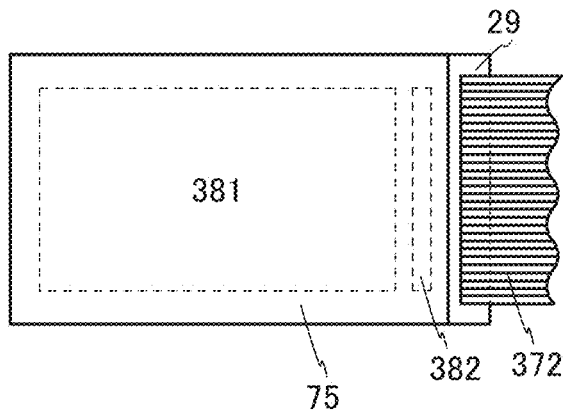
FIGS. 7A to 7C are a top view and cross-sectional views illustrating an example of a display device.
Figure 7B:
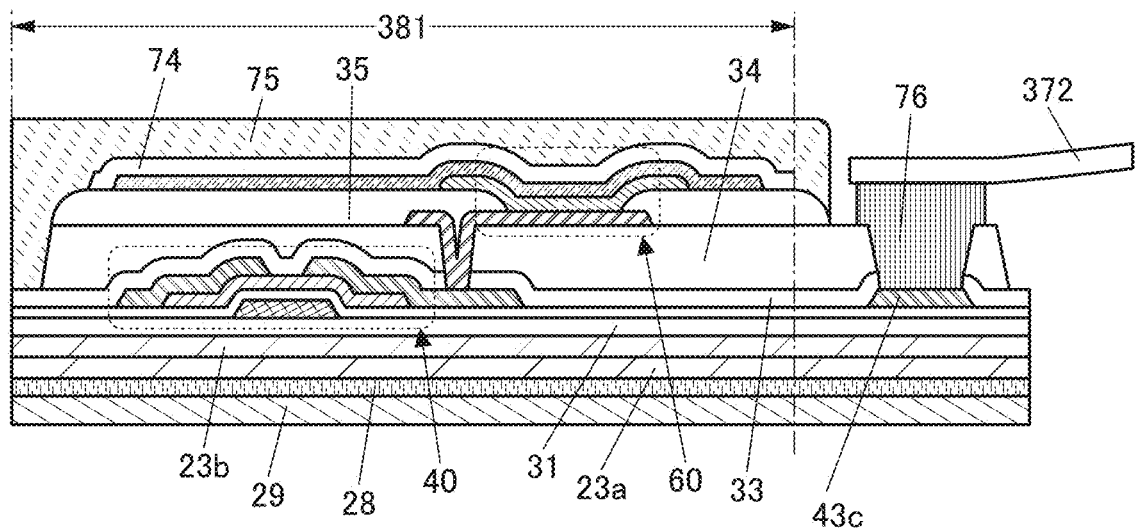
Figure 7C:
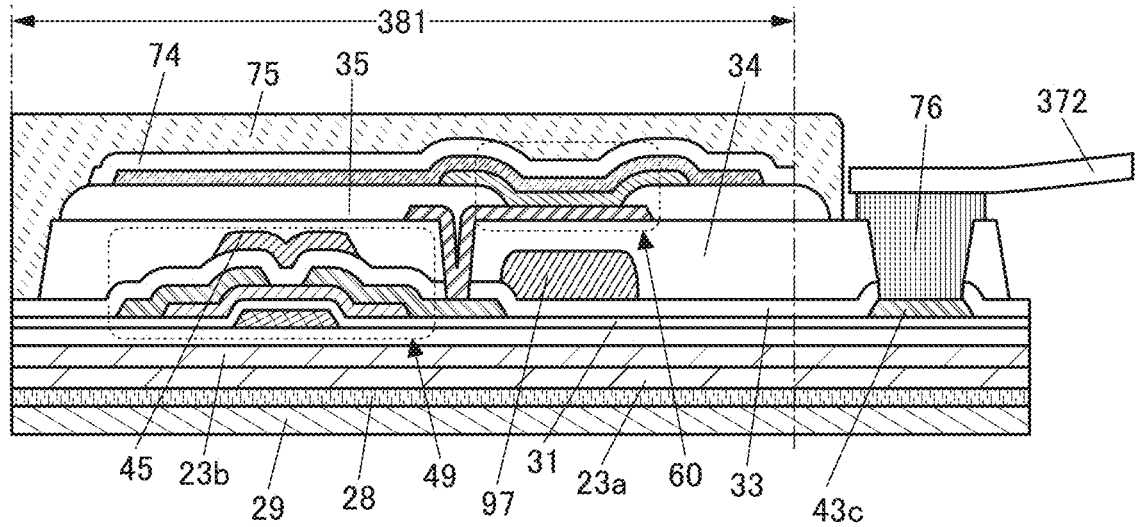

FIG. 7A is a top view of a display device 10A. FIGS. 7B and 7C show examples of a cross-sectional view of a display portion 381 and a cross-sectional view of a connection portion for connection to an FPC 372 in the display device 10A.

The display device 10A can be manufactured by the manufacturing method example 2. The display device 10A can remain being bent or can be bent repeatedly, for example.

The display device 10A includes the protective layer 75 and the substrate 29. The protective layer 75 side corresponds to the display surface side of the display device. The display device 10A includes the display portion 381 and a driver circuit portion 382. The FPC 372 is attached to the display device 10A.

A conductive layer 43c is electrically connected to the FPC 372 through a connector 76 (FIGS. 7B and 7C). The conductive layer 43c can be formed using the same material and the same step as those used to form the source and the drain of the transistor.

As the connector 76, any of various anisotropic conductive films (ACF), anisotropic conductive pastes (ACP), and the like can be used.

The display device shown in FIG. 7C is different from the display device shown in FIG. 7B in that a transistor 49 is included instead of the transistor 40 and that a coloring layer 97 is provided over the insulating layer 33. In the case where the light-emitting element 60 is a bottom-emission type light-emitting element, the coloring layer 97 can be provided closer to the substrate 29 than the light-emitting element 60 is.

In the transistor 49 shown in FIG. 7C, a conductive layer 45 serving as a gate is added to the structure of the transistor 40 shown in FIG. 7B.

The structure in which the semiconductor layer where a channel is formed is provided between two gates is used as an example of the transistor 49. Such a structure enables control of threshold voltages of transistor. In that case, the two gates may be connected to each other and supplied with the same signal to operate the transistor. Such a transistor can have a higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display device in which the number of wirings is increased because of increase in size or definition.

Alternatively, by supplying a potential for controlling the threshold voltage to one of the two gates and a potential for driving to the other, the threshold voltage of the transistor can be controlled.

As described above, by the heat treatment performed in the atmosphere containing oxygen, the first resin layer 23a can be separated from the formation substrate without performing laser irradiation on the entire surface of the first resin layer 23a. Therefore, in some cases, it is shown by analysis that a large amount of oxygen is contained in the first resin layer 23a included in the display device manufactured by the manufacturing method of the display device of this embodiment. Specifically, the oxygen concentration can be measured by analyzing, using XPS, a surface of the first resin layer 23a on the separation surface side (the surface is also referred to as the surface on the formation substrate side and corresponds to a surface in contact with the bonding layer 28 in FIGS. 7B and 7C). In particular, the oxygen concentration measured by the XPS analysis performed on the surface of the first resin layer 23a on the bonding layer 28 side is preferably higher than or equal to 10 atomic %, further preferably higher than or equal to 15 atomic %.

[Manufacturing Method Example 3]

Although the first resin layer 23a and the second resin layer 23b are formed in the manufacturing method example 2, the second resin layer 23b is not necessarily provided depending on the level of adhesion between the insulating layer 31 and the formation substrate 14.

Figure 8A:
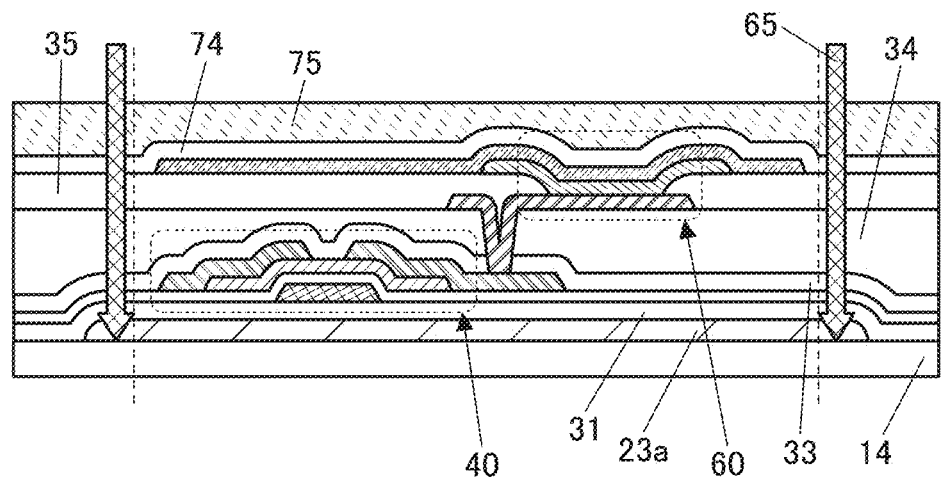
FIGS. 8A and 8B are cross-sectional views illustrating an example of a manufacturing method of a display device.

Specifically, after the first resin layer 23a is formed over the formation substrate 14, the insulating layer 31 may be formed in contact with top surfaces of the formation substrate 14 and the first resin layer 23a. Then, constituents from the transistor 40 to the protective layer 75 are formed over the insulating layer 31 (FIG. 8A).

Figure 8B:
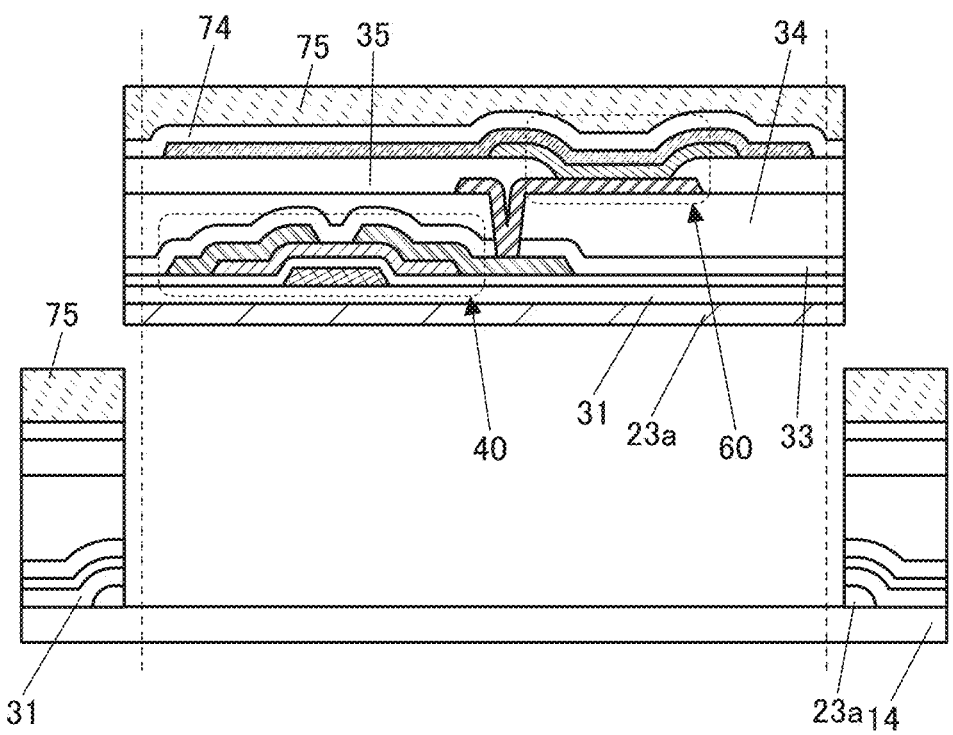

In the manufacturing method example 3, the portion that is in contact with the first resin layer 23a and a portion that is in contact with the insulating layer 31 are provided for the formation substrate 14. When the formation substrate 14 and the insulating layer 31 adhere to each other with sufficiently high adhesion, unintentional separation of the first resin layer 23a from the formation substrate 14 can be inhibited even in the case where the first resin layer 23a has high separability. Furthermore, the separation starting point is formed (see the instrument 65 shown in FIG. 8A), whereby the formation substrate 14 and the first resin layer 23a can be separated from each other at a desired time (FIG. 8B). As a result, the time at which the separation occurs can be controlled and high separability can be achieved. This can improve the yield of the separation process and the manufacturing process of the display device.

[Manufacturing Method Example 4]

Figure 9A:
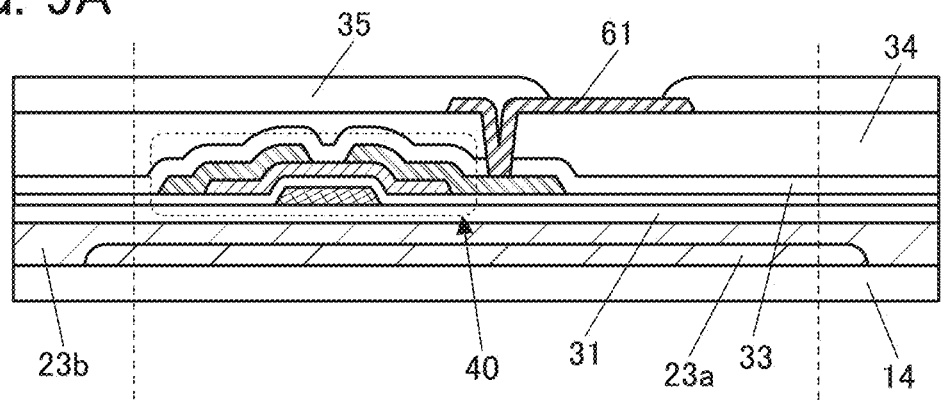
FIGS. 9A to 9C are cross-sectional views illustrating an example of a manufacturing method of a display device.

First, constituents from the first resin layer 23a to the insulating layer 35 are formed in order over the formation substrate 14 in a manner similar to that in the manufacturing method example 2 (FIG. 9A).

Figure 9B:
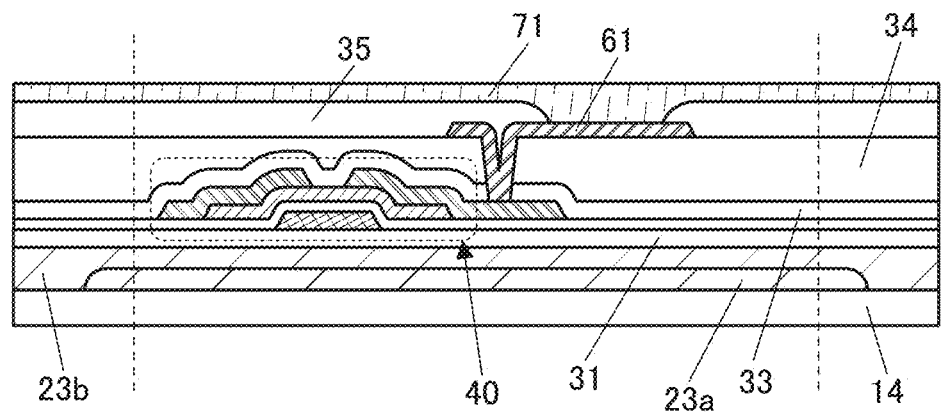

Then, the protective layer 71 is formed as illustrated in FIG. 9B.

The protective layer 71 has a function of protecting surfaces of the insulating layer 35 and the conductive layer 61 in a separation step. The protective layer 71 can be formed using a material that can be easily removed.

For the protective layer 71 that can be removed, a water-soluble resin can be used, for example. A water-soluble resin is applied to an uneven surface to cover the unevenness, which facilitates the protection of the surface. A stack of a water-soluble resin and an adhesive that can be separated by light or heat may be used for the protective layer 71 that can be removed.

For the protective layer 71 that can be removed, a base material having a property in which adhesion is strong in a normal state but weakened when irradiated with light or heated may be used. For example, a thermal separation tape whose adhesion is weakened by heat, a UV-separation tape whose adhesion is weakened by ultraviolet irradiation, or the like may be used. Alternatively, a weak adhesion tape with weak adhesiveness in a normal state, or the like can be used.

Figure 9C:
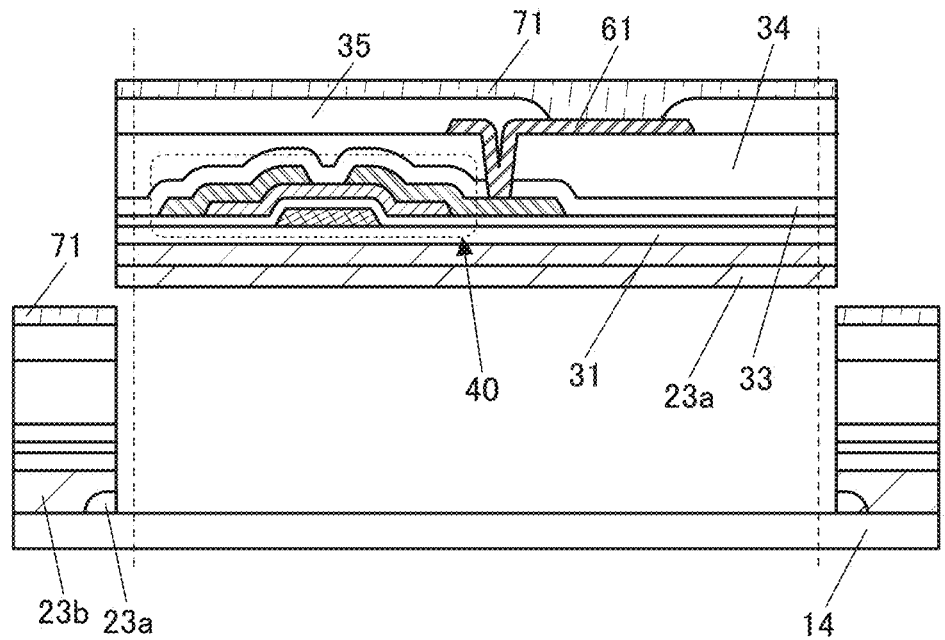

Then, the formation substrate 14 and the transistor 40 are separated from each other in a manner similar to that in the manufacturing method example 2 (FIG. 9C).

After the formation substrate 14 and the insulating layer 31 are separated from each other, the protective layer 71 is removed.

Then, the EL layer 62 and the conductive layer 63 are formed, whereby the light-emitting element 60 is obtained. Thus, by sealing the light-emitting element 60, the display device can be obtained. For sealing of the light-emitting element 60, one or more of the insulating layer 74, the protective layer 75, the substrate 75a, the bonding layer 75b, and the like can be used.

Although the EL layer 62 and the conductive layer 63 may be formed while the first resin layer 23a is fixed to a stage, they are preferably formed while the first resin layer 23a is fixed to a supporting substrate by a tape or the like and the supporting substrate is placed on the stage of the deposition apparatus. Fixing the first resin layer 23a to the supporting substrate can facilitate the transfer of the first resin layer 23a in an apparatus and between apparatuses. The substrate that can be used as the formation substrate 14 can be used as the supporting substrate.

In the manufacturing method example 4, an EL layer or the like is formed after the separation of the formation substrate 14, whereby the display element can be formed. In the case where the stacked layer structure of the EL layer and the like include a portion having a low adhesion, forming these layers after the separation can suppress a reduction in the yield of separation. Thus, by using the manufacturing method example 4, the material can be selected more freely, leading to fabrication of a highly reliable display device at lower cost.

[Manufacturing Method Example 5]

Figure 10A:
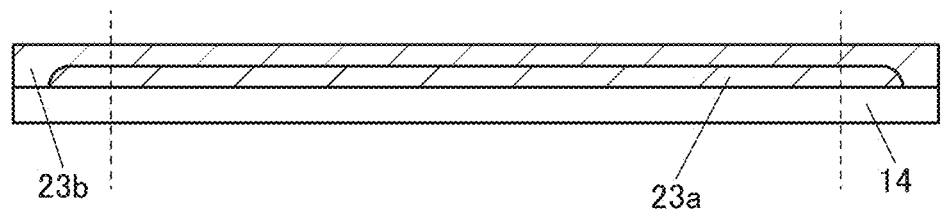
FIGS. 10A to 10C are cross-sectional views illustrating an example of a manufacturing method of a display device.

First, the first island-shaped resin layer 23a is formed over the formation substrate 14 in a manner similar to that in the manufacturing method example 2. Then, the second resin layer 23b is formed over the formation substrate 14 and the first resin layer 23a (FIG. 10A).

Specifically, the first layer 24a is formed over the formation substrate 14, and a first heat treatment is performed on the first layer 24a having a desired shape, whereby the first resin layer 23a is formed. The first heat treatment is performed in an atmosphere containing oxygen. Then, the second layer 24b is formed over the formation substrate 14 and the first resin layer 23a, and a second heat treatment is performed on the second layer 24b, whereby the second resin layer 23b is formed. The second heat treatment is performed in an atmosphere containing less oxygen than the atmosphere of the first heat treatment.

Figure 10B:
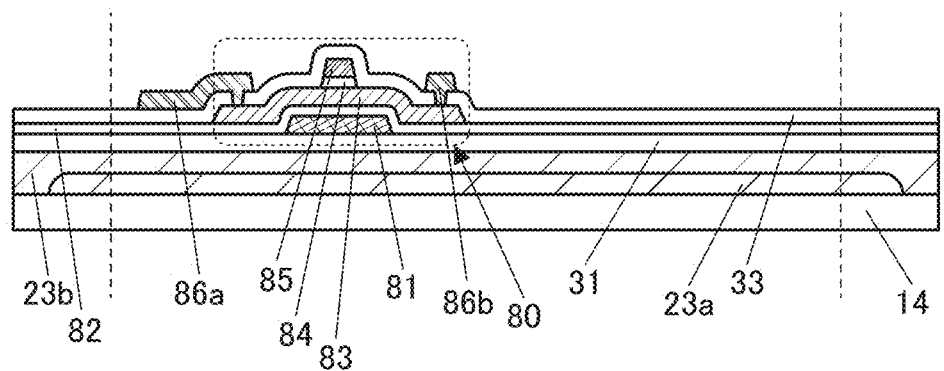

Next, the insulating layer 31 is formed over the second resin layer 23b in a manner similar to that in manufacturing method example 2 (FIG. 10B).

Then, a transistor 80 is formed over the insulating layer 31 (FIG. 10B).

Here, the case where a transistor including a metal oxide layer 83 and two gates is formed as the transistor 80 is described.

The transistor 80 is formed at a temperature lower than or equal to the heat resistance temperature of the first resin layer 23a and lower than or equal to the heat resistance temperature of the second resin layer 23b. The transistor 80 is preferably formed at a temperature lower than or equal to the temperature of the first heat treatment and lower than or equal to the temperature of the second heat treatment and may be formed at a temperature lower than both of the temperature of the first heat treatment and the temperature of the second heat treatment.

Specifically, first, a conductive layer 81 is formed over the insulating layer 31. The conductive layer 81 can be formed in the following manner: a conductive film is formed, a resist mask is formed, the conductive film is etched, and the resist mask is removed.

Next, an insulating layer 82 is formed. For the insulating layer 82, the description of the inorganic insulating film that can be used to form the insulating layer 31 can be referred to.

Then, the metal oxide layer 83 is formed. The metal oxide layer 83 can be formed in the following manner: a metal oxide film is formed, a resist mask is formed, the metal oxide film is etched, and the resist mask is removed. For the metal oxide layer 83, the description of the material that can be used for the metal oxide layer 44 can be referred to.

Then, an insulating layer 84 and a conductive layer 85 are formed. For the insulating layer 84, the description of the inorganic insulating film that can be used to form the insulating layer 31 can be referred to. The insulating layer 84 and the conductive layer 85 can be formed in the following manner: an insulating film to be the insulating layer 84 and a conductive film to be the conductive layer 85 are formed, a resist mask is formed, the insulating film and the conductive film are etched, and the resist mask is removed.

Next, the insulating layer 33 that covers the metal oxide layer 83, the insulating layer 84, and the conductive layer 85 is formed. The insulating layer 33 can be formed in a manner similar to that of forming the insulating layer 31.

Note that the insulating layer 33 preferably contains hydrogen. Hydrogen contained in the insulating layer 33 diffuses into the metal oxide layer 83 that is in contact with the insulating layer 33, so that the resistance of part of the metal oxide layer 83 is reduced. The metal oxide layer 83 that is in contact with the insulating layer 33 serves as a low-resistance region, and thus, the on-state current and the field-effect mobility of the transistor 80 can be increased.

Then, openings reaching the metal oxide layer 83 are formed in the insulating layer 33.

Then, a conductive layer 86a and a conductive layer 86b are formed. The conductive layers 86a and 86b can be formed in the following manner: a conductive film is formed, a resist mask is formed, the conductive film is etched, and the resist mask is removed. The conductive layers 86a and 86b are electrically connected to the metal oxide layer 83 through the openings formed in the insulating layer 33.

In the above manner, the transistor 80 can be formed (FIG. 10B). In the transistor 80, part of the conductive layer 81 functions as a gate, part of the insulating layer 84 functions as a gate insulating layer, part of the insulating layer 82 functions as a gate insulating layer, and part of the conductive layer 85 functions as a gate. The metal oxide layer 83 includes a channel region and a low-resistance region. The channel region overlaps with the conductive layer 85 with the insulating layer 84 provided therebetween. The low-resistance region includes a region connected to the conductive layer 86a and a region connected to the conductive layer 86b.

Figure 10C:
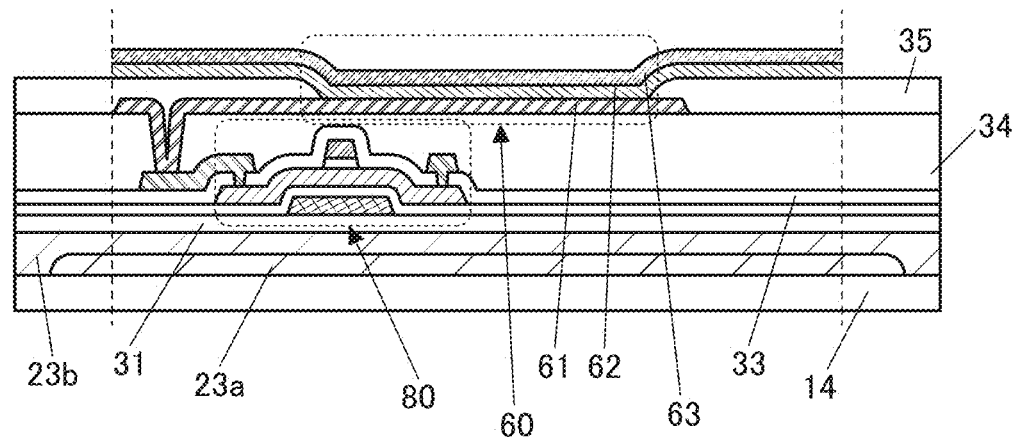

Next, constituents from the insulating layer 34 to the light-emitting element 60 are formed over the insulating layer 33 (FIG. 10C). For these steps, the description of the manufacturing method example 1 can be referred to.

Figure 11A:
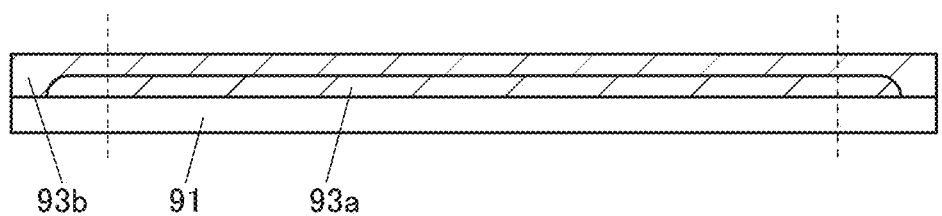
FIGS. 11A to 11C are cross-sectional views illustrating an example of a manufacturing method of a display device.
Figure 11B:
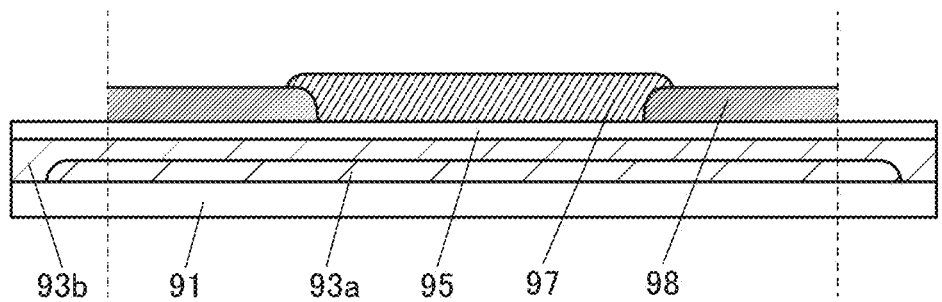

Furthermore, steps shown in FIGS. 11A and 11B are performed independently of the steps shown in FIGS. 10A to 10C. As in the step of forming the first resin layer 23a over the formation substrate 14, an island-like-shaped first resin layer 93a is formed over a formation substrate 91. Then, as in a step of forming the second resin layer 23b over the formation substrate 14 and the first resin layer 23a, a second resin layer 93b is formed over the formation substrate 91 and the first resin layer 93a (FIG. 11A).

Specifically, a first layer is formed over the formation substrate 91, and the first heat treatment is performed on the first layer having a desired shape, whereby the first resin layer 93a is formed. The first heat treatment is performed in an atmosphere containing oxygen. Then, a second layer is formed over the formation substrate 91 and the first resin layer 93a, and the second heat treatment is performed on the second layer, whereby the second resin layer 93b is formed. The second heat treatment is performed in an atmosphere containing less oxygen than an atmosphere of the first heat treatment.

The first resin layer 93a and the second resin layer 93b may be formed using different materials or the same material. The same material is preferably used because the cost can be reduced. Even when the same material is used, the degree of adhesion between the formation substrate 91 and the first resin layer 93a can be made different from that between the formation substrate 91 and the second resin layer 93b by performing the first treatment and the second heat treatment under different conditions.

The first resin layer 23a, the second resin layer 23b, the first resin layer 93a, and the second resin layer 93b may be formed using different materials or the same material. The same material is preferably used because the cost can be reduced. Even when the same material is used, the separability of the resin layers can be controlled by performing heat treatment on the resin layers under different conditions.

Then, an insulating layer 95 is formed over the second resin layer 93b. Then, the coloring layer 97 and a light-blocking layer 98 are formed over the insulating layer 95 (FIG. 11B).

For the insulating layer 95, the description of the insulating layer 31 can be referred to.

A color filter or the like can be used as the coloring layer 97. The coloring layer 97 is provided to overlap with a display region of the light-emitting element 60.

A black matrix or the like can be used as the light-blocking layer 98. The light-blocking layer 98 is provided to overlap with the insulating layer 35.

Figure 11C:
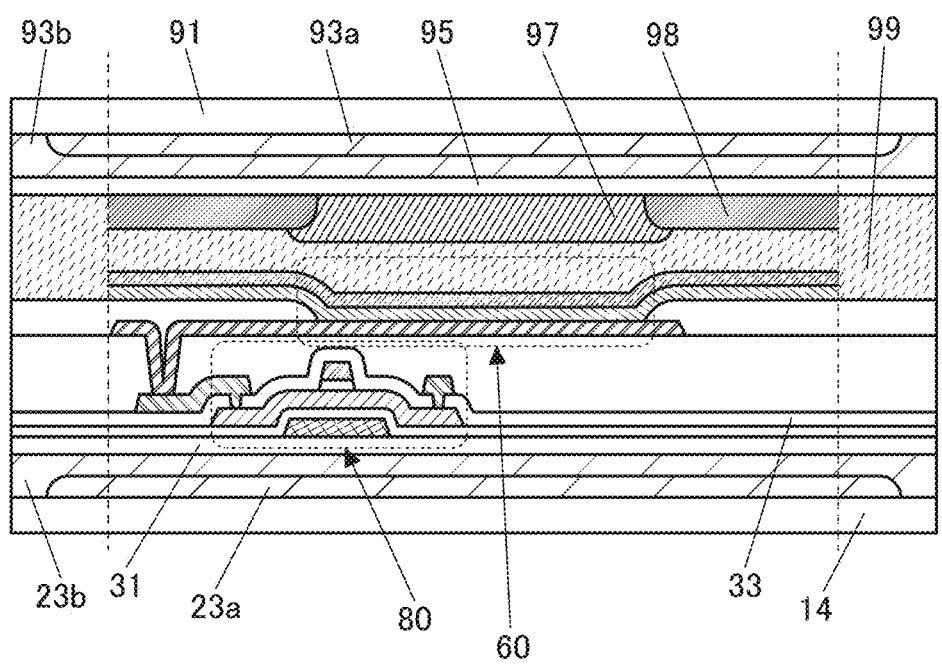

Next, a surface of the formation substrate 14 on which the transistor 80 and the like are formed and a surface of the formation substrate 91 on which the coloring layer 97 and the like are formed are attached to each other with a bonding layer 99 (FIG. 11C).

Figure 12A:
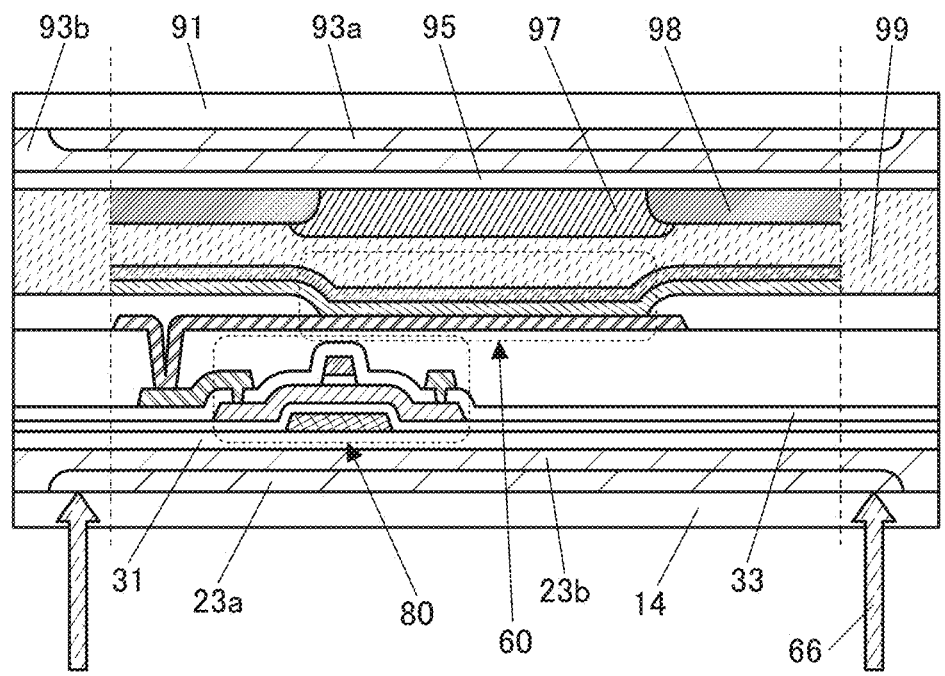
FIGS. 12A and 12B are a cross-sectional view and a top view illustrating an example of a manufacturing method of a display device.
Figure 12B:
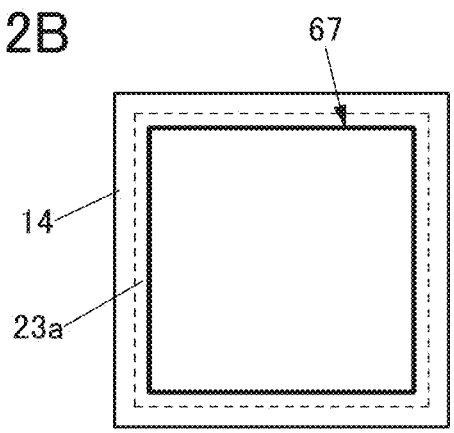

Then, the separation starting point is formed in the first resin layer 23a (FIGS. 12A and 12B). Either of the formation substrate 14 and the formation substrate 91 may be separated earlier. In the example shown here, the formation substrate 14 is separated earlier than the formation substrate 91.

For example, the first resin layer 23a is irradiated with laser light 66 in a frame-like shape from the formation substrate 14 side (see a laser-light irradiation region 67 shown in FIG. 12B). This method is suitable in the case of using hard substrates such as glass substrates as the formation substrate 14 and the formation substrate 91.

There is no particular limitation on a laser used to form the separation starting point. For example, a continuous wave laser or a pulsed oscillation laser can be used. Note that a condition for laser irradiation such as frequency, power density, energy density, or beam profile is controlled as appropriate in consideration of thicknesses, materials, or the like of the formation substrate and the first resin layer.

In the manufacturing method example 5, a portion that is in contact with the first resin layer 23a and a portion that is in contact with the second resin layer 23b are provided for the formation substrate 14. By the first heat treatment performed in the atmosphere containing oxygen, the first resin layer 23a becomes easy to separate from the formation substrate 14. In contrast, the second resin layer 23b is difficult to separate from the formation substrate 14 because the second heat treatment is performed in the atmosphere containing less oxygen than the atmosphere of the first heat treatment. Thus, separation of the first resin layer 23a from the formation substrate 14 that will occur at an unintended time can be inhibited. Similarly, a portion that is in contact with the first resin layer 93a and a portion that is in contact with the second resin layer 93b are provided for the formation substrate 91. The first resin layer 93a is easy to separate from the formation substrate 91, and the second resin layer 93b is difficult to separate from the formation substrate 91. Thus, separation of the first resin layer 93a from the formation substrate 91 that will occur at an unintended time can be inhibited.

A separation starting point is formed on either the first resin layer 23a or the first resin layer 93a. The timing of forming a separation starting point can be different between the first resin layer 23a and the first resin layer 93a; therefore, the formation substrate 14 and the formation substrate 91 can be separated in different steps. This can increase the yield of the separation process and the manufacturing process of a display device.

Irradiation with the laser light 66 does not need to be performed on the entire area of the first resin layer 23a and is performed on part of the resin layer. Accordingly, an expensive laser apparatus requiring high running costs is not needed.

Figure 13A:
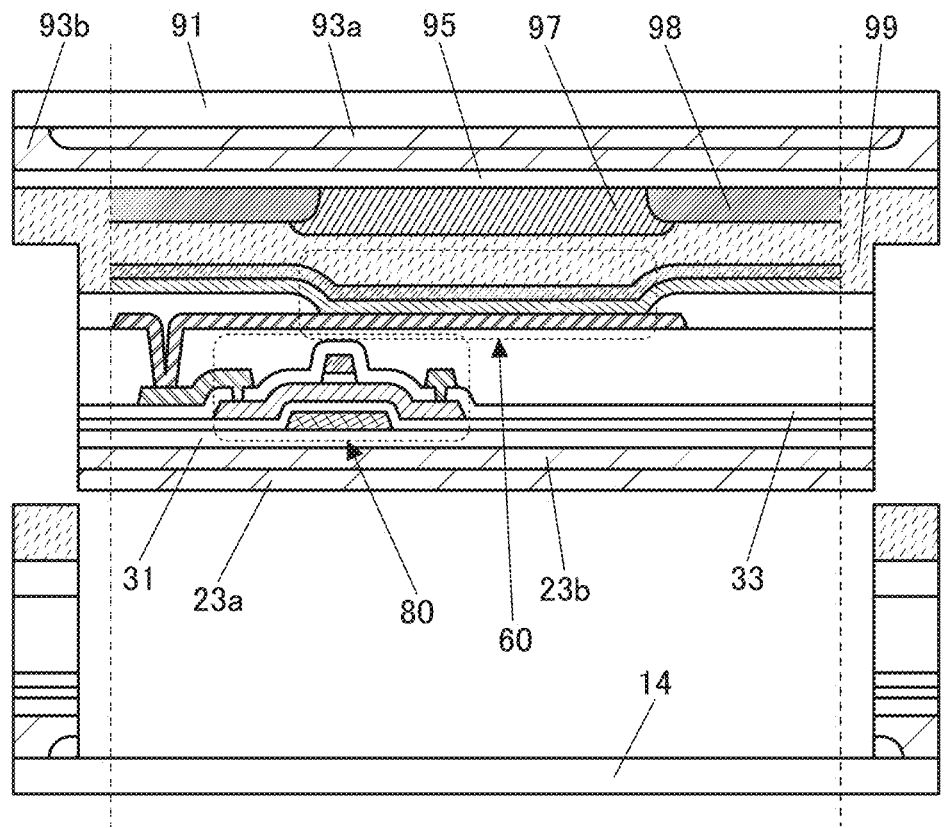
FIGS. 13A and 13B are cross-sectional views illustrating an example of a manufacturing method of a display device.

Next, the formation substrate 14 and the transistor 80 are separated from each other (FIG. 13A). In this example, the formation substrate 14 and a portion inside the region irradiated with the laser light 66 in a frame-like shape (i.e., a portion inside the laser-light irradiation region 67 illustrated in FIG. 12B) are separated from each other. Although in the example illustrated in FIG. 13A separation occurs in the bonding layer 99 (cohesive failure of the bonding layer 99 occurs) outside the region irradiated with the laser light 66 in a frame-like shape, one embodiment of the present invention is not limited to this example. For example, outside the irradiation region 67, separation (interfacial failure or adhesive failure) might occur at the interface between the bonding layer 99 and the insulating layer 95 or the insulating layer 33.

In the manufacturing method example 5, the first heat treatment is performed in the atmosphere containing oxygen at the time of forming the first resin layer 23a; thus, the formation substrate 14 and the first resin layer 23a can be separated from each other without performing laser irradiation on the entire surface of the first resin layer 23a. Consequently, the display device can be manufactured at low cost.

Figure 13B:
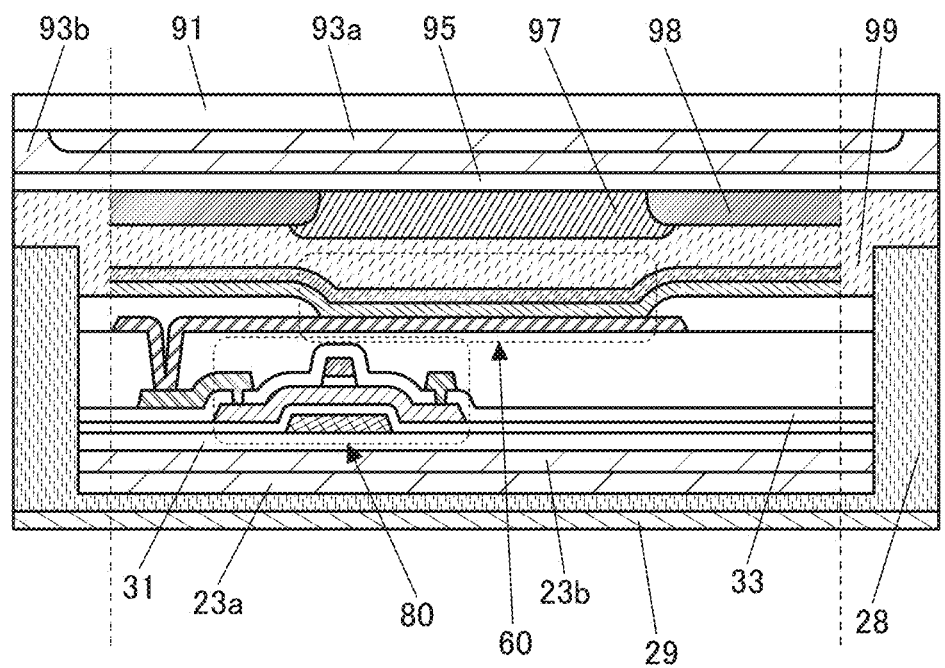

Then, the first resin layer 23a that is exposed by being separated from the formation substrate 14 is attached to the substrate 29 using the bonding layer 28 (FIG. 13B). The substrate 29 can serve as a support substrate of the display device.

Figure 14A:
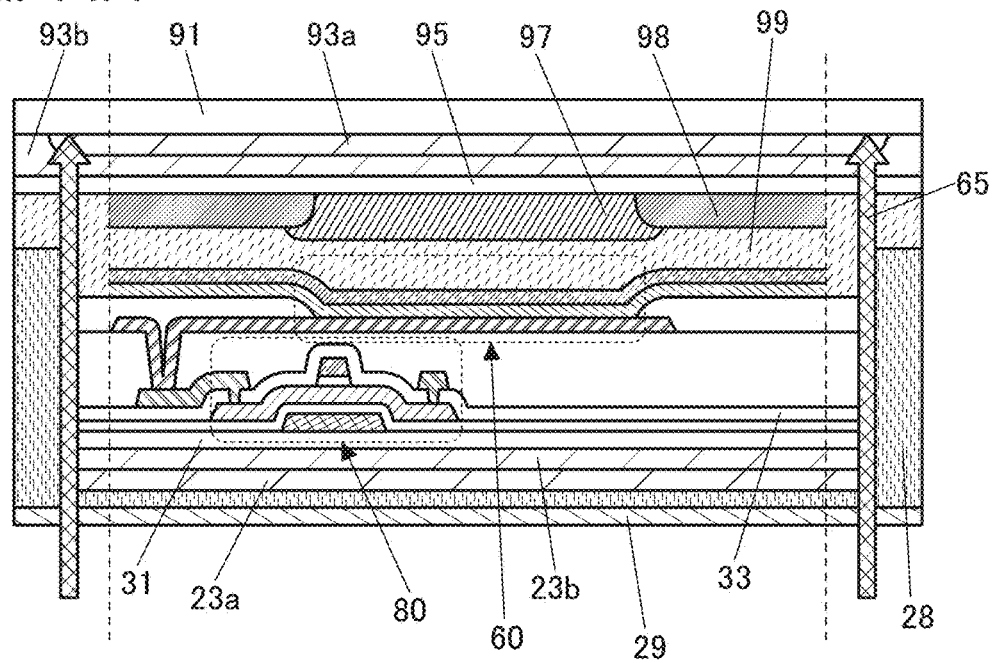
FIGS. 14A and 14B are cross-sectional views illustrating an example of a manufacturing method of a display device.

Then, the separation starting point is formed in the first resin layer 93a (FIG. 14A).

In FIG. 14A, the sharp instrument 65 such as a knife is inserted from the substrate 29 side into a portion inward from an end portion of the first resin layer 93a to form a frame-like-shaped cut. This method is suitable in the case of using a resin as the substrate 29.

Alternatively, in a manner similar to that of the formation of the separation starting point in the first resin layer 23a, the first resin layer 93a may be irradiated with laser light in a frame-like shape from the formation substrate 91 side.

The separation starting point enables separation of the formation substrate 91 and the first resin layer 93a from each other at a desired time. As a result, the time at which the separation occurs can be controlled and high separability can be achieved. This can improve the yield of the separation process and the manufacturing process of the display device.

Figure 14B:
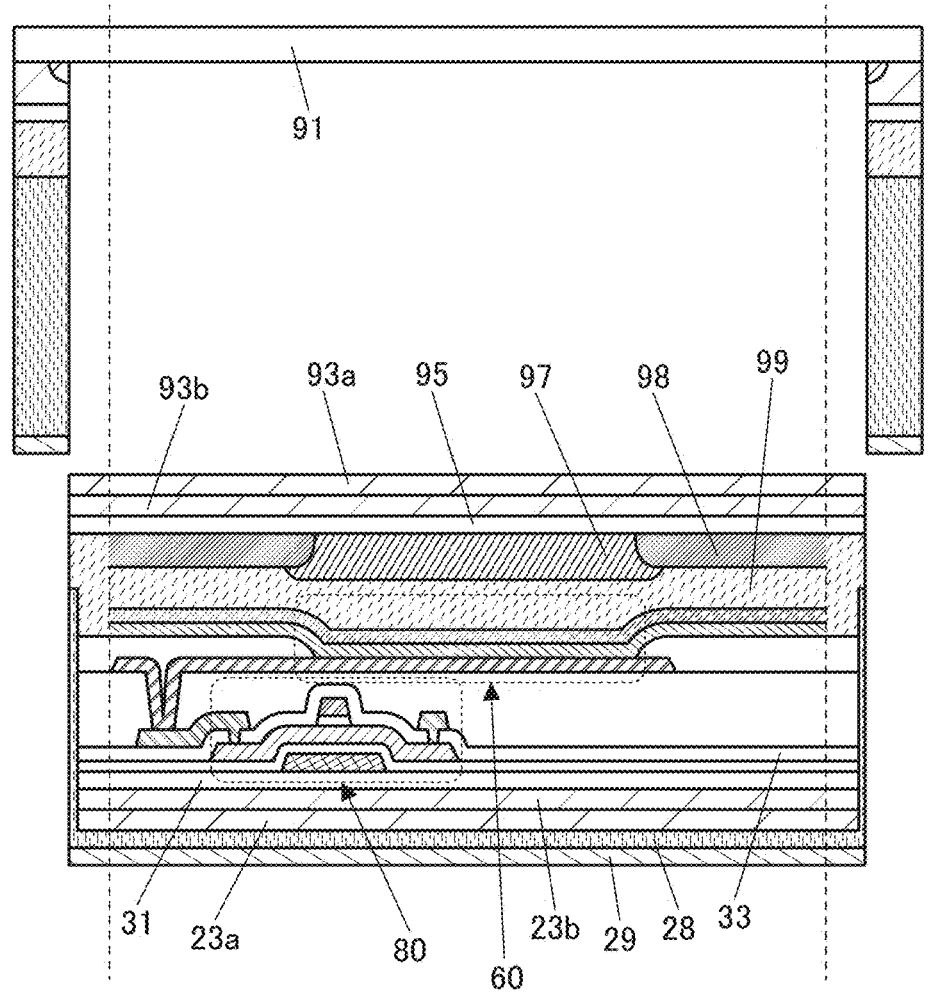

Then, the formation substrate 91 and the transistor 80 are separated from each other (FIG. 14B). In the example shown here, a portion inside the frame-like-shaped cut is separated from the formation substrate 91.

In the manufacturing method example 5, the first heat treatment is performed in the atmosphere containing oxygen at the time of forming the first resin layer 93a; thus, the formation substrate 91 and the first resin layer 93a can be separated from each other without performing laser irradiation on the entire surface of the first resin layer 93a. Consequently, the display device can be manufactured at low cost.

Figure 15A:
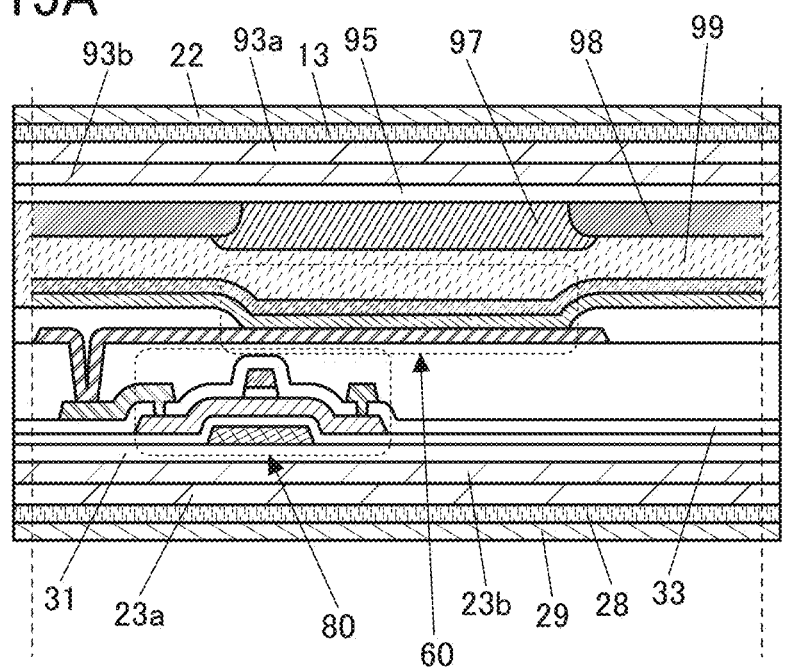
FIGS. 15A and 15B are cross-sectional views illustrating an example of a manufacturing method of a display device.
Figure 15B:
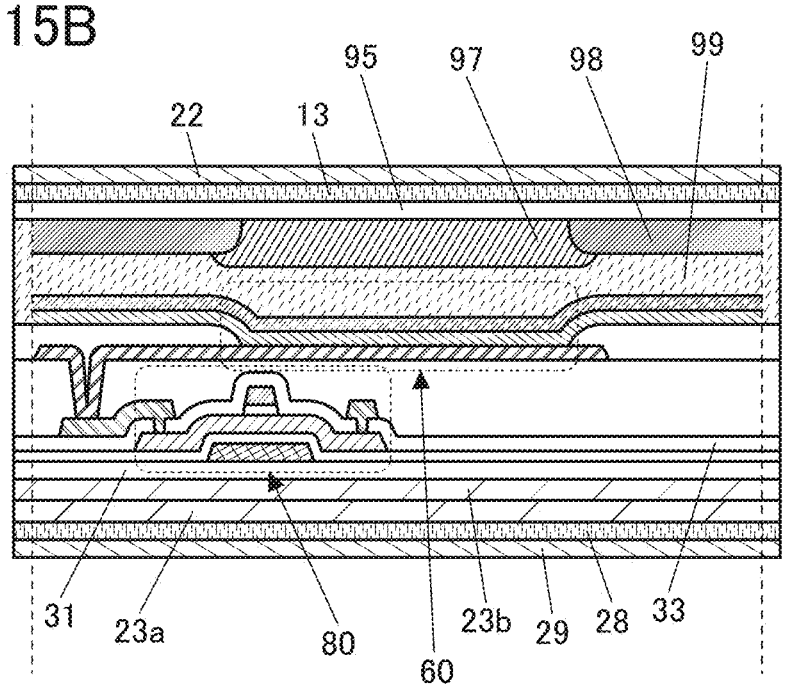

Then, the first resin layer 93a that is exposed by being separated from the formation substrate 91 is attached to a substrate 22 using a bonding layer 13 (FIG. 15A). The substrate 22 can serve as a support substrate of the display device.

In FIG. 15A, light emitted from the light-emitting element 60 is extracted to the outside of the display device through the coloring layer 97, the second resin layer 93b, and the first resin layer 93a. Therefore, the first resin layer 93a and the second resin layer 93b each preferably have a high visible light transmittance. In the separation method of one embodiment of the present invention, the thickness of each of the first resin layer 93a and the second resin layer 93b can be reduced. Thus, the first resin layer 93a and the second resin layer 93b can each have a high visible light transmittance, which can inhibit reduction of the light extraction efficiency of the light-emitting element 60.

One or both of the first resin layer 93a and the second resin layer 93b may be removed. This can further increase the light extraction efficiency of the light-emitting element 60. In the example shown in FIG. 15B, both of the first resin layer 93a and the second resin layer 93b are removed and the substrate 22 is attached to the insulating layer 95 with the bonding layer 13.

The material that can be used for the bonding layer 75b can be used for the bonding layer 13.

The material that can be used for the substrate 75a can be used for the substrate 22.

The manufacturing method example 5 is an example in which the separation method of one embodiment of the present invention is performed twice to fabricate the display device. In one embodiment of the present invention, each of the functional elements and the like included in the display device is formed over the formation substrate; thus, even in the case where a high-resolution display device is manufactured, high alignment accuracy of a flexible substrate is not required. It is thus easy to attach the flexible substrate.

[Modification Example]

In the manufacturing method example 5 (FIG. 11C), the bonding layer 99 overlaps with both a portion where the formation substrate 14 and the second resin layer 23b are in contact with each other and a portion where the formation substrate 91 and the second resin layer 93b are in contact with each other.

The adhesion between the formation substrate 14 and the second resin layer 23b is higher than that between the formation substrate 14 and the first resin layer 23a. The adhesion between the formation substrate 91 and the second resin layer 93b is higher than that between the formation substrate 91 and the first resin layer 93a.

When separation is caused at the interface between the formation substrate and the second resin layer, separation might be failed, for example, reducing the yield of separation. Therefore, the process is suitable in which only the portion that overlaps with the first resin layer is separated from the formation substrate after formation of a separation starting point in the first resin layer in a frame-like shape.

Figure 16A:
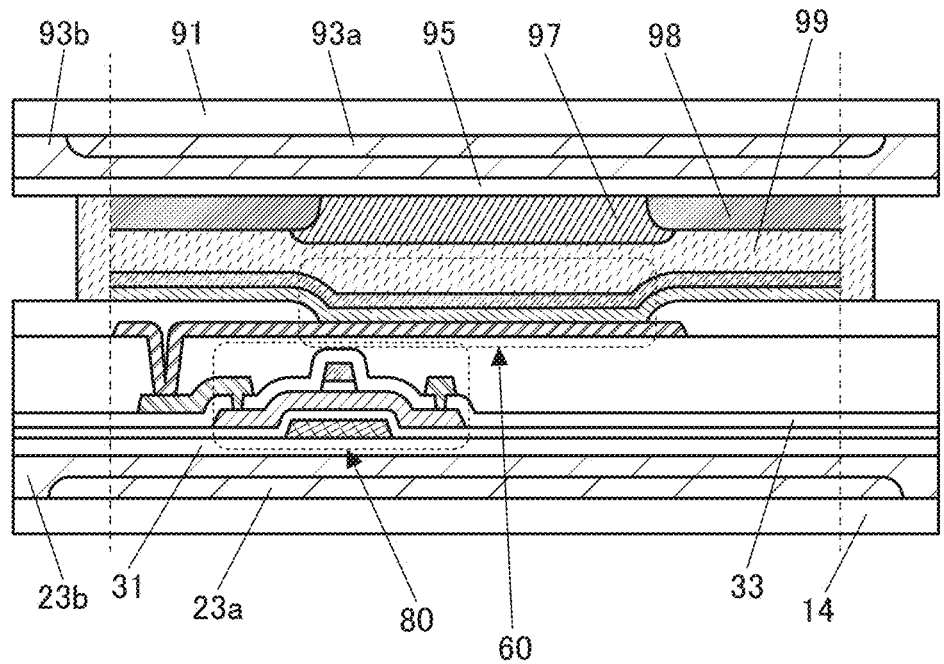
FIGS. 16A and 16B are cross-sectional views illustrating an example of a manufacturing method of a display device.
Figure 16B:
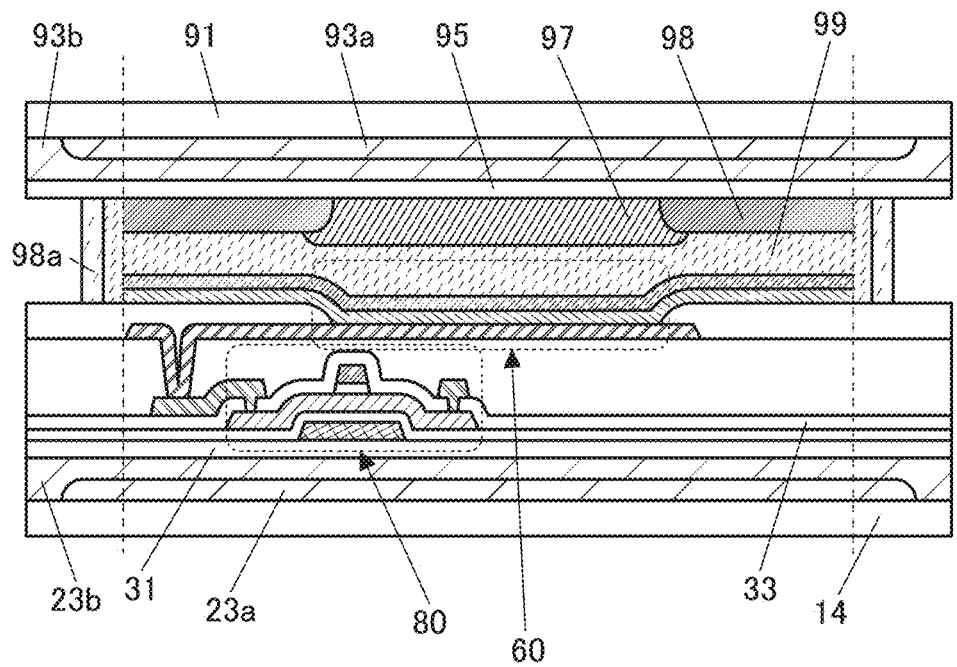

It is also possible to employ a structure in which the bonding layer 99 does not overlap with the portion where the formation substrate 14 and the second resin layer 23b are in contact with each other and the portion where the formation substrate 91 and the second resin layer 93b are in contact with each other, as illustrated in FIGS. 16A and 16B.

When an adhesive or an adhesive sheet having a low fluidity, for example, is used for the bonding layer 99, the bonding layer 99 can be easily formed to have an island-like shape (FIG. 16A).

Alternatively, a partition 98a having a frame-like shape may be formed and the space surrounded by the partition 98a may be filled with the bonding layer 99 (FIG. 16B).

In the case where the partition 98a is used as a component of a display device, the partition 98a is preferably formed using a cured resin. In that case, it is preferable that the partition 98a not overlap with the portion where the formation substrate 14 and the second resin layer 23b are in contact with each other and the portion where the formation substrate 91 and the second resin layer 93b are in contact with each other, either.

In the case where the partition 98a is not used as a component of a display device, the partition 98a is preferably formed using an uncured resin or a semi-cured resin. In that case, the partition 98a may overlap with one or both of the portion where the formation substrate 14 and the second resin layer 23b are in contact with each other and the portion where the formation substrate 91 and the second resin layer 93b are in contact with each other.

In the example described in this embodiment, the partition 98a is formed using an uncured resin, and the partition 98a does not overlap with the portion where the formation substrate 14 and the second resin layer 23b are in contact with each other and the portion where the formation substrate 91 and the second resin layer 93b are in contact with each other.

Description is made on a method for forming a separation starting point in the case where the bonding layer 99 does not overlap with the portion where the formation substrate 14 and the second resin layer 23b are in contact with each other and the portion where the formation substrate 91 and the second resin layer 93b are in contact with each other. Here, an example in which the formation substrate 91 is separated ahead of the formation substrate 14 is shown.

FIGS. 17A to 17E illustrate positions of irradiation with the laser light 66 in the case where the formation substrate 91 and the first resin layer 93a are separated from each other.

Figure 17A:
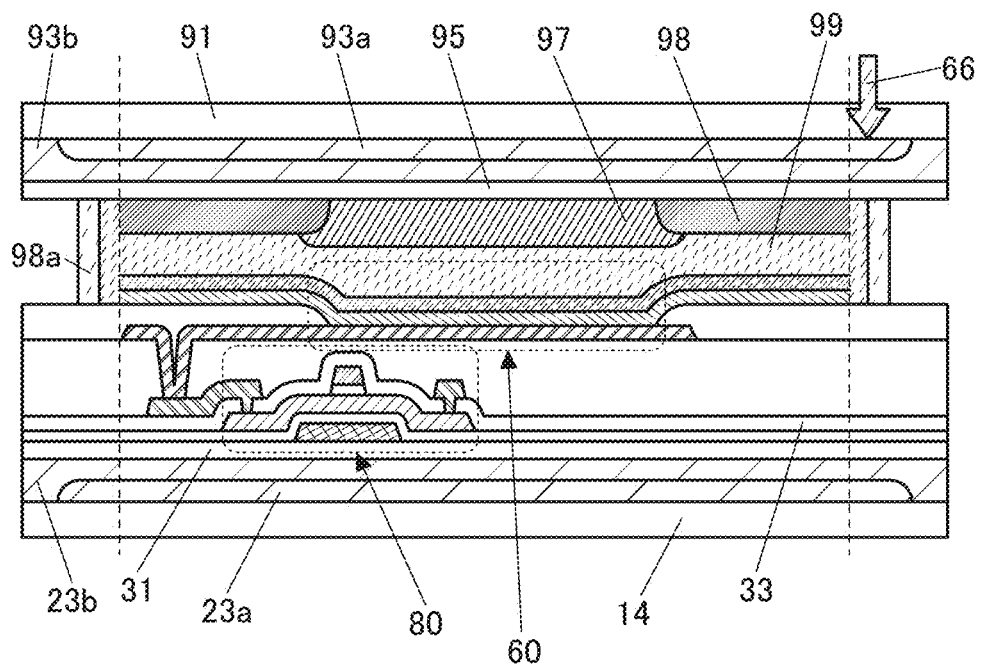
FIGS. 17A to 17E are a cross-sectional view and top views illustrating an example of a manufacturing method of a display device.

As illustrated in FIG. 17A, at least one place of a region where the first resin layer 93a and the bonding layer 99 overlap with each other is irradiated with the laser light 66, whereby the separation starting point can be formed.

It is preferable that the force for separating the formation substrate 91 and the first resin layer 93a from each other be locally exerted on the separation starting point; therefore, the separation starting point is preferably formed in the vicinity of an end portion of the bonding layer 99 rather than at the center of the bonding layer 99. It is particularly preferable to form the separation starting point in the vicinity of the corner portion compared to the vicinity of the side portion among the vicinities of the end portion.

FIGS. 17B to 17E illustrate examples of the laser-light irradiation region 67.

Figure 17B:
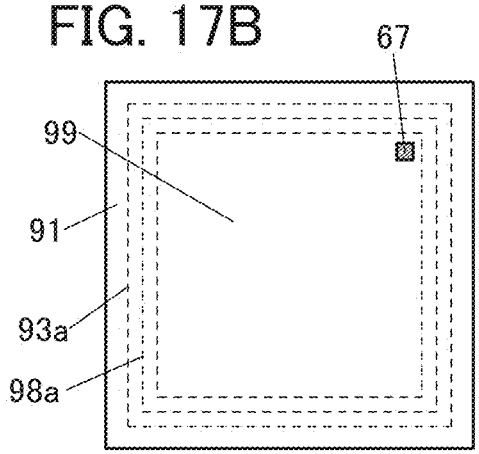

In FIG. 17B, one laser-light irradiation region 67 is provided at the corner portion of the bonding layer 99.

Figure 17C:
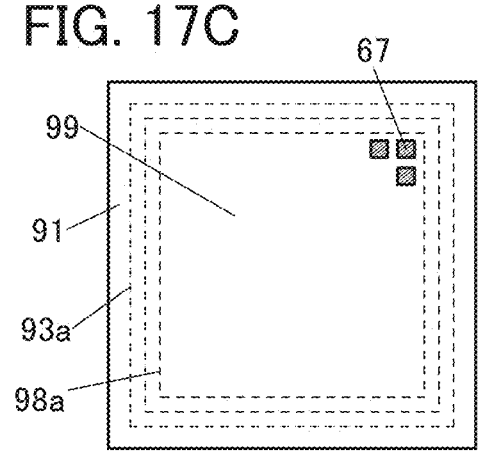
Figure 17D:
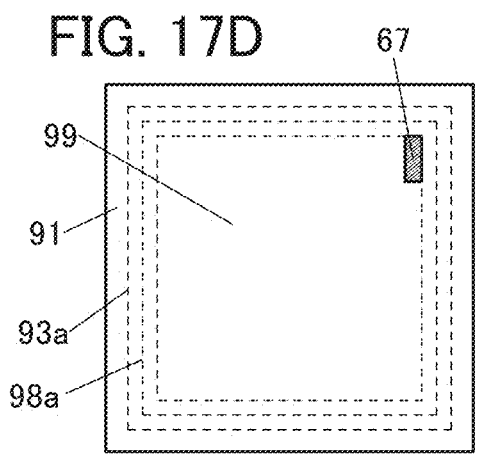
Figure 17E:
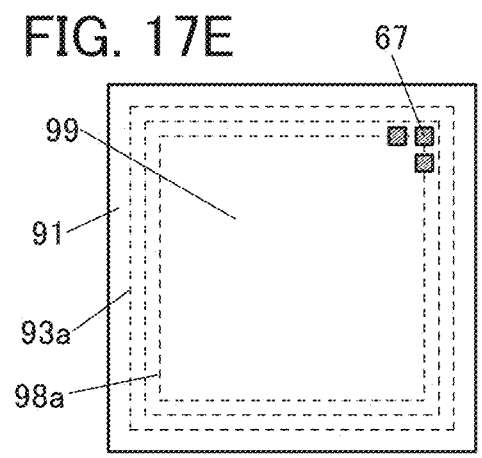

The separation starting point can be formed in the form of a solid line or a dashed line by continuous or intermittent irradiation with laser light. In FIG. 17C, three laser-light irradiation regions 67 are provided at the corner portion of the bonding layer 99. FIG. 17D illustrates an example in which the laser-light irradiation region 67 abuts on and extends along one side of the bonding layer 99. As illustrated in FIG. 17E, the laser-light irradiation region 67 may be positioned not only in a region where the bonding layer 99 and the first resin layer 93a overlap with each other but also in a region where the partition 98a not cured and the first resin layer 93a overlap with each other.

Figure 18A:
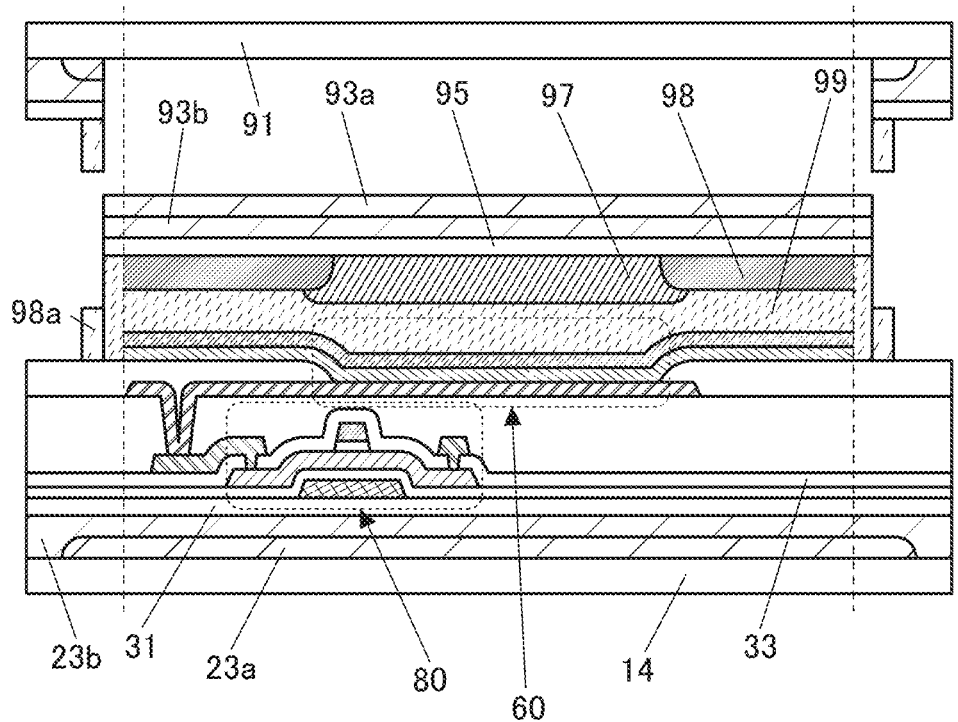
FIGS. 18A and 18B are cross-sectional views illustrating an example of a manufacturing method of a display device.

Then, the formation substrate 91 and the first resin layer 93a can be separated from each other (FIG. 18A). Note that part of the partition 98a remains on the formation substrate 14 side in some cases. The partition 98a may be removed or the next step may be performed without removal of the partition 98a. The partition 98a is not illustrated for simplicity.

Figure 18B:
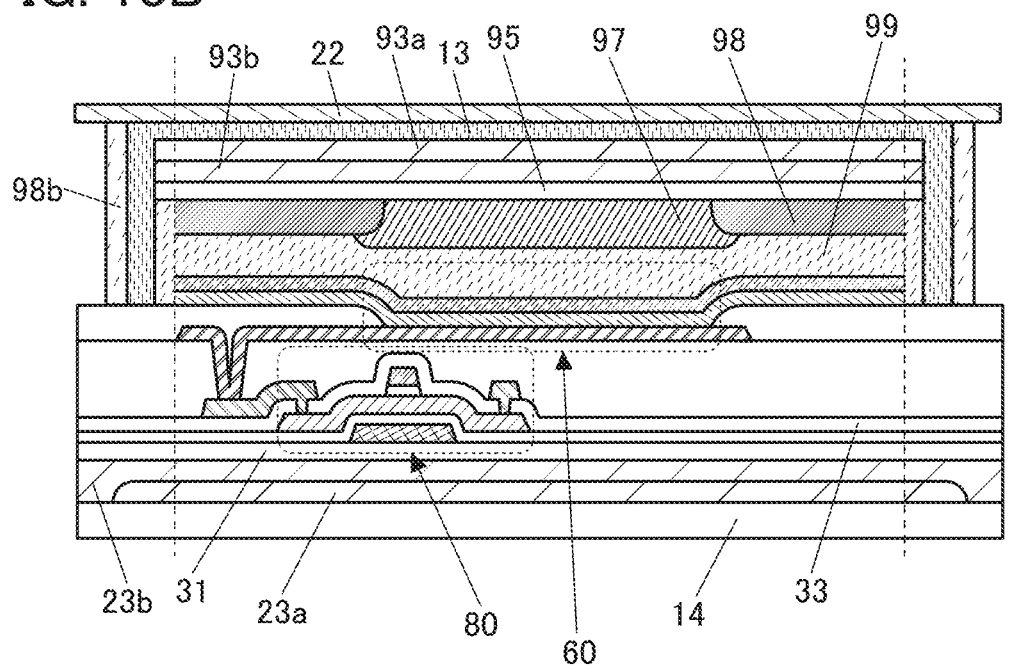

Next, the substrate 22 and the first resin layer 93a that is exposed by being separated from the formation substrate 91 are bonded to each other using the adhesive layer 13 (FIG. 18B).

The adhesive layer 13 as well as the adhesive layer 99 does not overlap with a portion where the formation substrate 14 and the second resin layer 23b are in contact with each other.

In the case where the partition wall 98b is used as a component of the display device, cured resin is preferably used for the partition wall 98b. Here, it is preferable that the partition wall 98b do not overlap with the portion where the formation substrate 14 and the second resin layer 23b are in contact with each other.

In the case where the partition wall 98b is not used as a component of the display device, an uncured resin or a semi-cured resin is preferably used for the partition wall 98b. Here, the partition wall 98b may overlap with the portion where the formation substrate 14 and the second resin layer 23b are in contact with each other.

This embodiment shows an example where an uncured resin is used for the partition wall 98b, and the partition wall 98b overlaps with a portion where the formation substrate 14 is in contact with the second resin layer 23b.

Figure 19A:
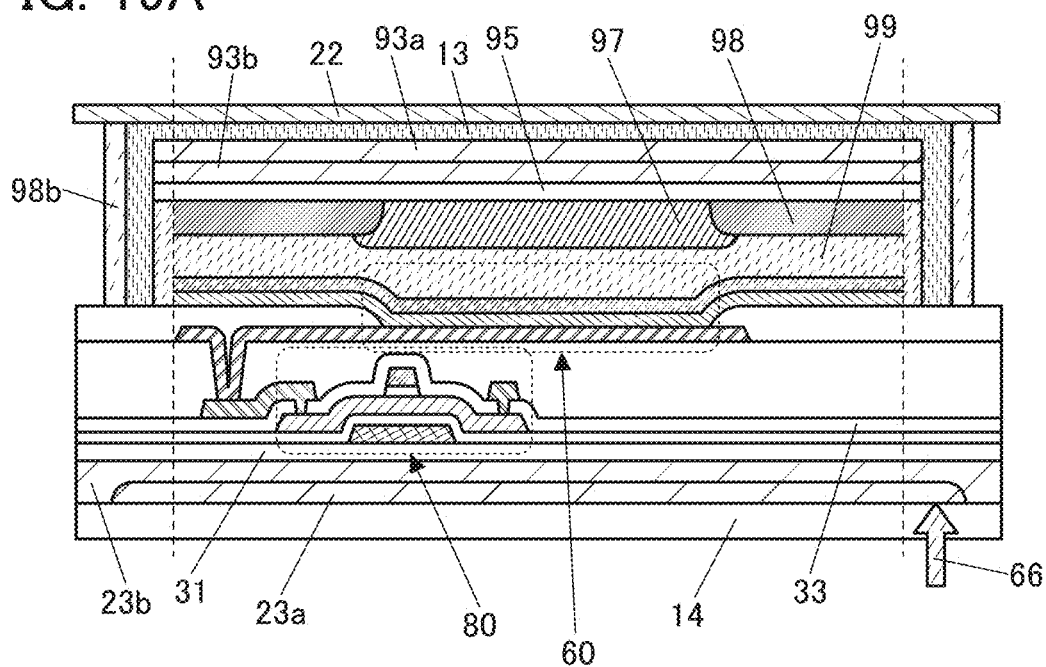
FIGS. 19A and 19B are cross-sectional views illustrating an example of a manufacturing method of a display device.

Thus, as illustrated in FIG. 19A, at least one place of a region where the first resin layer 23a and the bonding layer 13 overlap with each other is irradiated with the laser light 66, whereby the separation starting point can be formed.

Figure 19B:
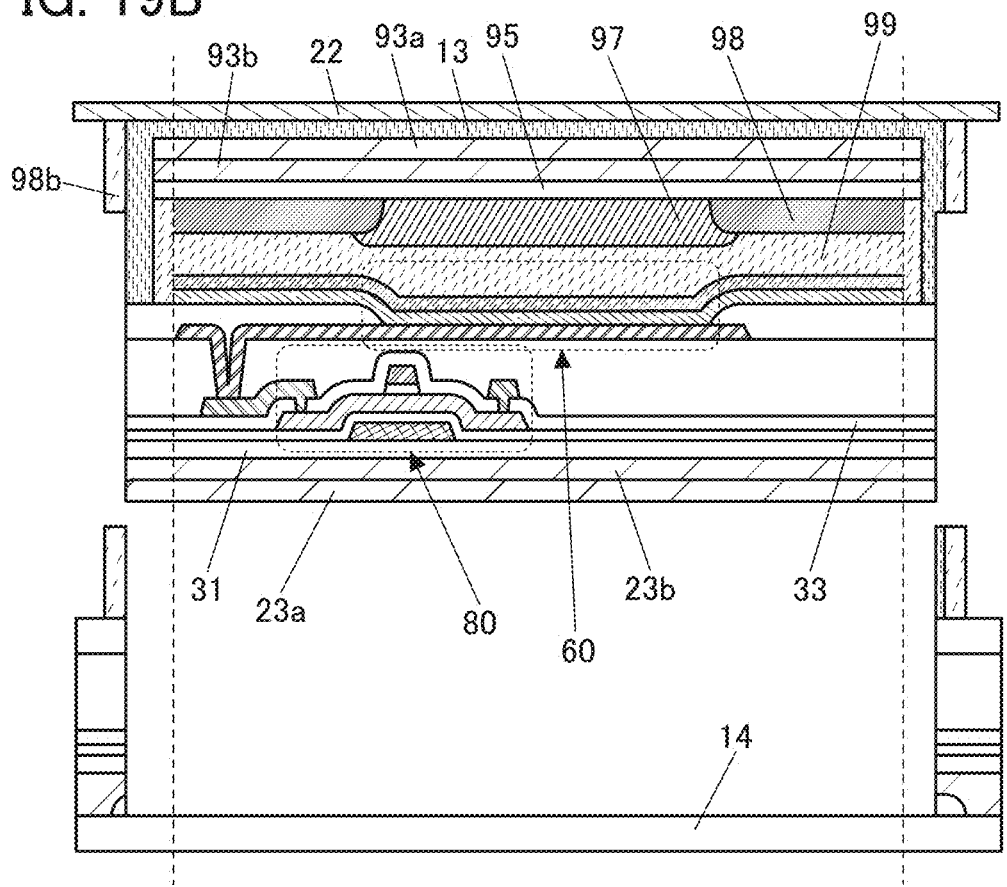

Then, the formation substrate 14 and the first resin layer 23a can be separated from each other (FIG. 19B).

[Structure Example 2 of Display Device]

Figure 20A:
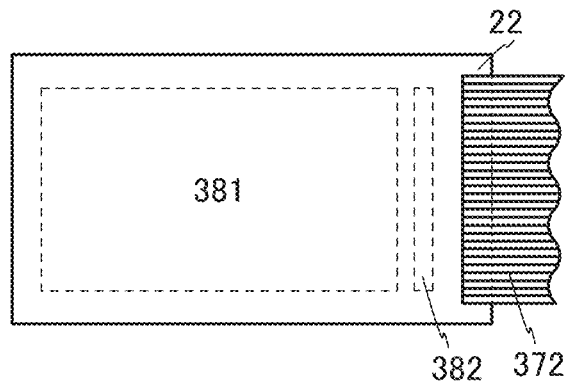
FIGS. 20A and 20B are a top view and a cross-sectional view illustrating an example of a display device.
Figure 20B:
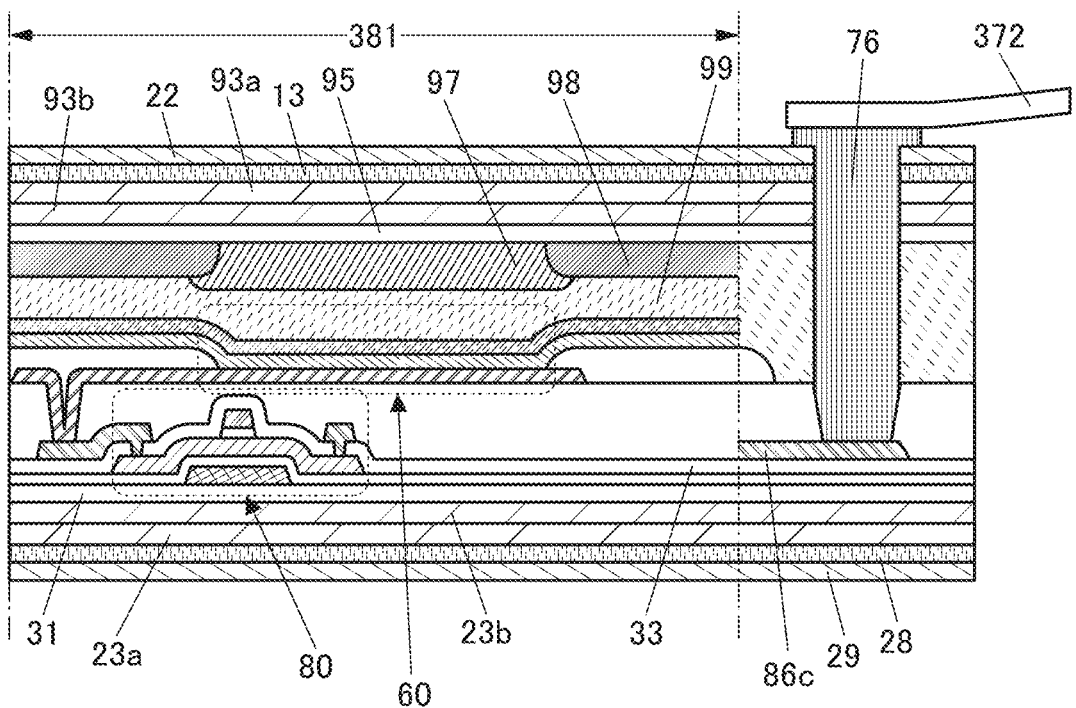

FIG. 20A is a top view of a display device 10B. FIG. 20B is an example of a cross-sectional view illustrating the display portion 381 of the display device 10B and a portion for connection to the FPC 372.

The display device 10B can be manufactured with the use of the above manufacturing method example 5. The display device 10B can be held in a bent state and can be bent repeatedly, for example.

The display device 10B includes the substrate 22 and the substrate 29. The substrate 22 side is the display surface side of the display device 10B. The display device 10B includes the display portion 381 and the driver circuit portion 382. The FPC 372 is attached to the display device 10B.

A conductive layer 86c and the FPC 372 are electrically connected through the connector 76 (FIG. 20B). The conductive layer 86c can be formed using the same material and the same step as those of the source and the drain of the transistor.

As described above, the heat treatment performed in an oxygen-containing atmosphere enables the first resin layer to be separated from the formation substrate without laser irradiation of the entire area of the first resin layer. Thus, a large amount of oxygen is sometimes observed by analysis in the first resin layer of the display device that is manufactured by the manufacturing method of a display device described in this embodiment. Specifically, the oxygen concentration can be obtained by analyzing the surface of the first resin layer on the separation surface side by XPS. The oxygen concentration that is obtained by analyzing the surface of the first resin layer 23a on the bonding layer 28 side by XPS is preferably higher than or equal to 10 atomic %, further preferably higher than or equal to 15 atomic %. The oxygen concentration that is obtained by analyzing the surface of the first resin layer 93a on the bonding layer 13 side by XPS is preferably higher than or equal to 10 atomic %, further preferably higher than or equal to 15 atomic %.

As described above, in the separation method of this embodiment, the separability of the resin layer with respect to the formation substrate is controlled by heat conditions used to form the resin layer. Treatment that uses an expensive apparatus, such as linear laser beam irradiation, is not necessary for the separation method; accordingly, the costs can be reduced. Moreover, use of a stack of two resin layers differing in separability with respect to the formation substrate enables separation of the formation substrate and the resin layer from each other to occur at a desired time. Thus, by the separation method of this embodiment, display devices and the like can be manufactured at low cost with high mass productivity.

This embodiment can be combined with any of other embodiments as appropriate.

(Embodiment 2)

In this embodiment, a separation method of one embodiment of the present invention and a method for manufacturing a display device are described with reference to FIGS. 21A to 21E and FIGS. 22A1, 22A2, and 22B.

In this embodiment, the case where low-temperature polysilicon (LTPS) is used for a channel region of the transistor is described.

In the case where LTPS is used, a first resin layer and a second resin layer are preferably thick films formed using a material having high heat resistance. Thus, a high-temperature process becomes possible and damage in a step for laser crystallization can be reduced.

Figure 21A:
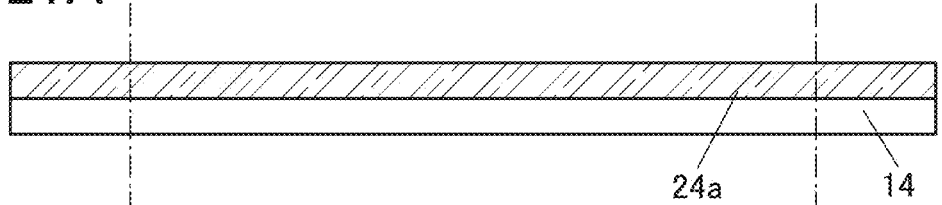
FIGS. 21A to 21E are cross-sectional views illustrating an example of a manufacturing method of a display device.

First, the first layer 24a is formed over the formation substrate 14 (FIG. 21A).

For the material and the formation method of the first layer 24a, Embodiment 1 can be referred to. It is preferable that the heat resistance of the material of the first layer 24a used in this embodiment be sufficiently high.

Figure 21B:
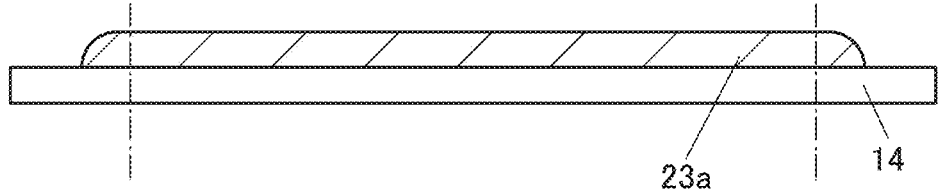

Next, a first heat treatment is performed on the first layer 24a having a desired shape, whereby the first resin layer 23a is formed (FIG. 21B). Here, the first resin layer 23a having an island shape is formed.

The first heat treatment is performed in an atmosphere containing oxygen.

Conditions of the first heat treatment can be referred to the description in Embodiment 1.

In this embodiment, since a material having high heat resistance is used for the first layer 24a, the first heat treatment can be performed at a temperature higher than the heating temperature in Embodiment 1. For example, the temperature of the first heat treatment is preferably greater than or equal to 400° C. and less than or equal to 600° C., further preferably greater than or equal to 450° C. and less than or equal to 550° C.

The thickness of the first resin layer 23a is preferably greater than or equal to 10 µm and less than or equal to 200 µm, further preferably greater than or equal to 10 µm and less than or equal to 100 µm, and still further preferably greater than or equal to 10 µm and less than or equal to 50 µm. When the thickness of the first resin layer 23a is sufficiently large, damage in a step of laser crystallization can be reduced.

The 5% weight loss temperature of the first resin layer 23a is preferably greater than or equal to 400° C. and less than or equal to 600° C., further preferably greater than or equal to 450° C. and less than or equal to 600° C., and still further preferably greater than or equal to 500° C. and less than or equal to 600° C.

Figure 21C:
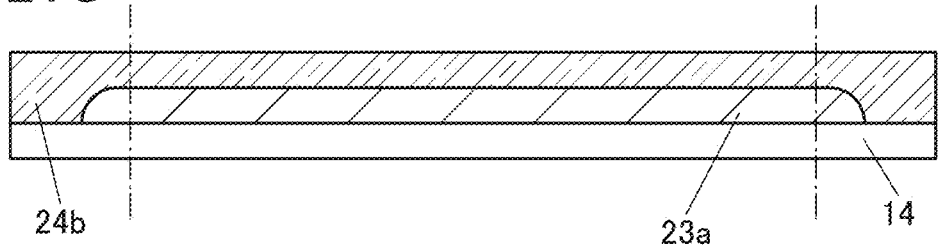

Then, a second layer 24b is formed over the formation substrate 14 and the first resin layer 23a (FIG. 21C).

The second layer 24b can be formed using a material and a method that can be used to form the first layer 24a. In particular, it is preferable that the heat resistance of the material of the second layer 24b used in this embodiment be sufficiently high.

Figure 21D:
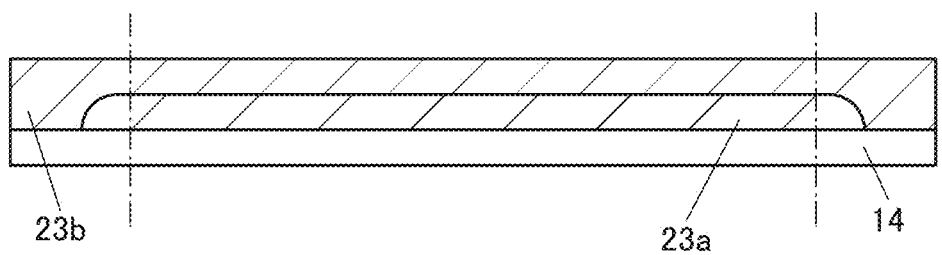

Subsequently, the second heat treatment is performed on the second resin layer 24b, so that the second resin layer 23b is formed (FIG. 21D).

The second heat treatment is performed in an atmosphere containing less oxygen than an atmosphere of the first heat treatment.

Conditions of the second heat treatment can be referred to the description in Embodiment 1.

In this embodiment, since a material having high heat resistance is used for the second layer 24b, the second heat treatment can be performed at a temperature higher than the heating temperature in Embodiment 1. For example, the temperature of the second heat treatment is preferably greater than or equal to 400° C. and less than or equal to 600° C., further preferably greater than or equal to 450° C. and less than or equal to 550° C.

The thickness of the second resin layer 23b is preferably greater than or equal to 10 µm and less than or equal to 200 µm, further preferably greater than or equal to 10 µm and less than or equal to 100 µm, still further preferably greater than or equal to 10 µm and less than or equal to 50 µm. When the thickness of the second resin layer 23b is sufficiently large, damage in a step of laser crystallization can be reduced.

In the case where the thickness of one of the first resin layer 23a and the second resin layer 23b is sufficiently large (e.g., greater than or equal to 20 µm), the thickness of the other may be less than 10 µm.

The 5% weight loss temperature of the second resin layer 23b is preferably greater than or equal to 400° C. and less than or equal to 600° C., further preferably greater than or equal to 450° C. and less than or equal to 600° C., and still further preferably greater than or equal to 500° C. and less than or equal to 600° C.

The first resin layer 23a and the second resin layer 23b may be formed using different materials or the same material. The same material is preferably used because the cost can be reduced. Even when the same material is used, the degree of adhesion between the formation substrate 14 and the first resin layer 23a can be made different from that between the formation substrate 14 and the second resin layer 23b by performing the first treatment and the second heat treatment under different conditions.

Figure 21E:
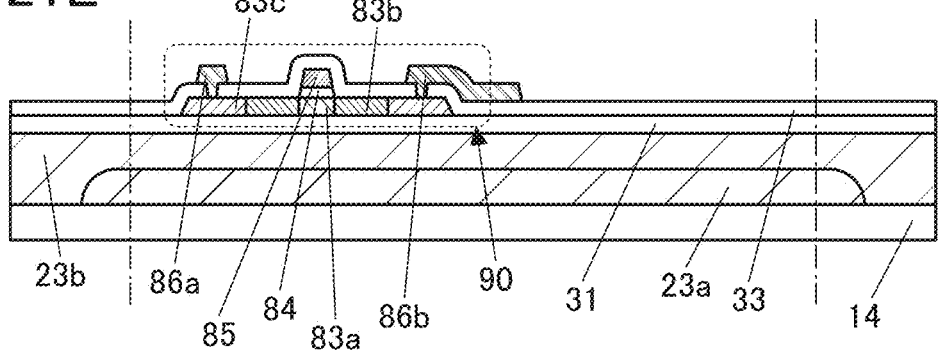

Next, the insulating layer 31 is formed over the second resin layer 23b (FIG. 21E).

The insulating layer 31 is formed at a temperature lower than or equal to the heat resistance temperature of the first resin layer 23a and lower than or equal to the heat resistance temperature of the second resin layer 23b. The insulating layer 31 is preferably formed at a temperature lower than or equal to the temperature of the first heat treatment and lower than or equal to the temperature of the second heat treatment and may be formed at a temperature lower than both of the temperature of the first heat treatment and the temperature of the second heat treatment.

The insulating layer 31 can be used as a barrier layer that prevents diffusion of impurities contained in the first resin layer 23a and the second resin layer 23b into a transistor and a display element formed later. For example, the insulating layer 31 preferably prevents moisture and the like contained in the first resin layer 23a and the second resin layer 23b from diffusing into the transistor and the display element when the first resin layer 23a and the second resin layer 23b are heated. Thus, the insulating layer 31 preferably has a high barrier property.

For the insulating layer 31, any of the materials described in Embodiment 1 can be used.

Next, the transistor 90 is formed over the insulating layer 31 (FIG. 21E).

Here, the case where a top-gate transistor including LTPS in a channel formation region is formed as the transistor 90 is shown.

First, a semiconductor film is formed over the insulating layer 31 by a sputtering method, a CVD method, or the like. In this embodiment, a 50-nm-thick amorphous silicon film is formed with a plasma CVD apparatus.

Next, heat treatment is preferably performed on the amorphous silicon film. Thus, hydrogen can be released from the amorphous silicon film. Specifically, the amorphous silicon film is preferably heated at a temperature higher than or equal to 400° C. and less than or equal to 550° C. For example, when the amount of hydrogen contained in the amorphous silicon film is smaller than or equal to 5 atomic %, manufacturing yield in the crystallization step can be improved. The heat treatment may be omitted in the case where the amount of hydrogen contained in the amorphous silicon film is small.

In this embodiment, since the first resin layer 23a and the second resin layer 23b have high heat resistance, heat treatment can be performed at a high temperature to sufficiently release hydrogen from the amorphous silicon film.

Next, the semiconductor film is crystallized to form a semiconductor having a crystalline structure.

The semiconductor film can be crystallized by irradiation with a laser light from above the semiconductor film. The laser light with a wavelength of 193 nm, 248 nm, 308 nm, or 351 nm, for example, can be used. Alternatively, the semiconductor film may be crystallized by using a metal catalyst element.

In this embodiment, since the first resin layer 23a and the second resin layer 23b are formed to be thick, damage due to crystallization can be reduced.

Next, channel doping may be performed on the semiconductor film having a crystalline structure.

Next, the semiconductor film is processed to form an island-shaped semiconductor film.

The semiconductor film can be processed by a wet etching method and/or a dry etching method.

Next, the insulating layer 84 and the conductive layer 85 are formed over the insulating layer 31 and the semiconductor film. For the insulating layer 84, the description of the inorganic insulating film that can be used for the insulating layer 31 can be referred to. The insulating layer 84 and the conductive layer 85 can be formed in the following manner: an insulating film to be the insulating layer 84 is formed, a conductive film to be the conductive layer 85 is formed, a mask is formed, the insulating film and the conductive film are etched, and the mask is removed.

An impurity element is added to part of the semiconductor film, whereby a channel region 83a and low-resistance regions 83c (also referred to as a source region and a drain region) are formed. The impurity element may be added plural times to form lightly doped drain (LDD) regions 83b. The insulating layer 84, the conductive layer 85, and a mask for forming these layers can function as a mask for adding impurity elements.

In the case of forming an n-channel transistor, an impurity element imparting n-type conductivity to a semiconductor film is used. For example, an element such as P, As, Sb, S, Te, or Se can be used.

In the case of forming a p-channel transistor, an impurity element imparting p-type conductivity to a semiconductor film is used. For example, an element such as B, Al, or Ga can be used.

Next, the insulating layer 33 that covers the semiconductor layer, the insulating layer 84, and the conductive layer 85 is formed. The insulating layer 33 can be formed in a manner similar to that of the insulating layer 31.

Next, heat treatment is performed. Thus, the impurity element which is added to the semiconductor layer is activated. The heat treatment is preferably performed after the formation of the insulating layer 33 so as to prevent oxidation of the conductive layer 85.

In this embodiment, since the heat resistance of the first resin layer 23a and the second resin layer 23b is high, heat treatment for activating the impurity element can be performed at a high temperature. Thus, the characteristics of the transistor can be improved.

The insulating layer 33 may include an insulating film containing hydrogen. When heat treatment is performed after the insulating film containing hydrogen is formed over the transistor 90, hydrogen is supplied from the insulating film containing hydrogen to the semiconductor layer (especially to the channel region 83a); thus, defects in the semiconductor layer can be terminated with hydrogen. The heat treatment is performed at a temperature lower than the temperature of the heat treatment which is performed on the amorphous silicon film in order to release hydrogen.

In this embodiment, since heat resistance of the first resin layer 23a and the second resin layer 23b is high, heat treatment for hydrogenation can be performed at a high temperature. Thus, the characteristics of the transistor can be improved.

Next, openings reaching the low-resistance regions 83c of the semiconductor layer are formed in the insulating layer 33.

Then, the conductive layer 86a and the conductive layer 86b are formed. The conductive layers 86a and 86b can be formed in the following manner: a conductive film is formed, a resist mask is formed, the conductive film is etched, and the resist mask is removed. The conductive layers 86a and 86b are electrically connected to the low-resistance regions 83c through the openings formed in the insulating layer 33.

In the above manner, the transistor 90 can be fabricated (FIG. 21E). In the transistor 90, part of the conductive layer 85 functions as a gate and part of the insulating layer 84 functions as a gate insulating layer. The semiconductor layer includes the channel region 83a, the LDD regions 83b, and the low-resistance regions 83c. The channel region 83a overlaps with the conductive layer 85 with the insulating layer 84 provided therebetween. The low-resistance regions 83c include a region connected to the conductive layer 86a and a region connected to the conductive layer 86b.

Next, constituents from the insulating layer 34 to the protective layer 75 are formed over the insulating layer 33 (see FIG. 22A1). For these steps, Embodiment 1 can be referred to.

Then, the separation starting point is formed in the first resin layer 23a (FIGS. 22A1 and 22A2).

For example, a sharp instrument 65 such as a knife is inserted from the protective layer 75 side into a portion inward from an end portion of the first resin layer 23a to form a frame-like-shaped cut 64.

In this embodiment, a portion that is in contact with the first resin layer 23a and a portion that is in contact with the second resin layer 23b are provided for the formation substrate 14. Thus, separation of the first resin layer 23a from the formation substrate 14 that will occur at an unintended time can be inhibited. Furthermore, the separation starting point enables separation of the formation substrate 14 and the first resin layer 23a from each other at a desired time. As a result, the time at which the separation occurs can be controlled and high separability can be achieved. This can improve the yield of the separation process and the manufacturing process of the display device.

Next, the formation substrate 14 and the transistor 90 are separated from each other (FIG. 22B).

The first heat treatment is performed in the atmosphere containing oxygen at the time of forming the first resin layer 23a; thus, the formation substrate 14 and the first resin layer 23a can be separated from each other without performing laser irradiation on the entire surface of the first resin layer 23a. Consequently, the display device can be manufactured at low cost.

As described above, the first resin layer and the second resin layer are formed to be thick using a high heat-resistant material, whereby a display device including LTPS in a transistor can be manufactured.

This embodiment can be combined with any of other embodiments as appropriate.

(Embodiment 3)

In this embodiment, a display device of one embodiment of the present invention and a manufacturing method thereof will be described with reference to drawings.

The display device of this embodiment includes a first display element reflecting visible light and a second display element emitting visible light.

The display device of this embodiment has a function of displaying an image using one or both of light reflected by the first display element and light emitted from the second display element.

As the first display element, an element which displays an image by reflecting external light can be used. Such an element does not include a light source (or does not require an artificial light source); thus, power consumed in displaying an image can be significantly reduced.

As a typical example of the first display element, a reflective liquid crystal element can be given. As the first display element, an element using a microcapsule method, an electrophoretic method, an electrowetting method, an Electronic Liquid Powder (registered trademark) method, or the like can also be used, other than micro electro mechanical systems (MEMS) shutter element or an optical interference type MEMS element.

As the second display element, a light-emitting element is preferably used. Since the luminance and the chromaticity of light emitted from such a display element are not affected by external light, a clear image that has high color reproducibility (wide color gamut) and a high contrast can be displayed.

As the second display element, a self-luminous light-emitting element such as an organic light-emitting diode (OLED), a light-emitting diode (LED), or a quantum-dot light-emitting diode (QLED) can be used.

The display device of this embodiment has a first mode in which an image is displayed using only the first display element, a second mode in which an image is displayed using only the second display element, and a third mode in which an image is displayed using both the first display element and the second display element. The display device of this embodiment can be switched between these modes automatically or manually.

In the first mode, an image is displayed using the first display element and external light. Because a light source is unnecessary in the first mode, power consumed in this mode is extremely low. When sufficient external light enters the display device (e.g., in a bright environment), for example, an image can be displayed by using light reflected by the first display element. The first mode is effective in the case where external light is white light or light near white light and is sufficiently strong, for example. The first mode is suitable for displaying text. Furthermore, the first mode enables eye-friendly display owing to the use of reflected external light, which leads to an effect of easing eyestrain.

In the second mode, an image is displayed using light emitted from the second display element. Thus, an extremely vivid image (with high contrast and excellent color reproducibility) can be displayed regardless of the illuminance and the chromaticity of external light. The second mode is effective in the case of extremely low illuminance, such as in a night environment or in a dark room, for example. When a bright image is displayed in a dark environment, a user may feel that the image is too bright. To prevent this, an image with reduced luminance is preferably displayed in the second mode. In that case, glare can be reduced, and power consumption can also be reduced. The second mode is suitable for displaying a vivid (still and moving) image or the like.

In the third mode, an image is displayed using both light reflected by the first display element and light emitted from the second display element. An image displayed in the third mode can be more vivid than an image displayed in the first mode while power consumption can be lower than that in the second mode. The third mode is effective in the case where the illuminance is relatively low or in the case where the chromaticity of external light is not white, for example, in an environment under indoor illumination or in the morning or evening.

With such a structure, an all-weather display device or a highly convenient display device with high visibility regardless of the ambient brightness can be fabricated.

The display device of this embodiment includes a plurality of first pixels including the first display elements and a plurality of second pixels including the second display elements. The first pixels and the second pixels are preferably arranged in matrices.

Each of the first pixels and the second pixels can include one or more sub-pixels. For example, each pixel can include one sub-pixel (e.g., a white (W) sub-pixel), three sub-pixels (e.g., red (R), green (G), and blue (B) sub-pixels, or yellow (Y), cyan (C), and magenta (M) sub-pixels), or four sub-pixels (e.g., red (R), green (G), blue (B), and white (W) sub-pixels, or red (R), green (G), blue (B), and yellow (Y) sub-pixels).

The display device of this embodiment can display a full-color image using either the first pixels or the second pixels. Alternatively, the display device of this embodiment can display a black-and-white image or a grayscale image using the first pixels and can display a full-color image using the second pixels. The first pixels that can be used for displaying a black-and-white image or a grayscale image are suitable for displaying information that need not be displayed in color such as text information.

Structure examples of the display device in this embodiment are described with reference to FIG. 23, FIG. 24, FIG. 25, and FIG. 26.

<Structure Example 1>

Figure 23:
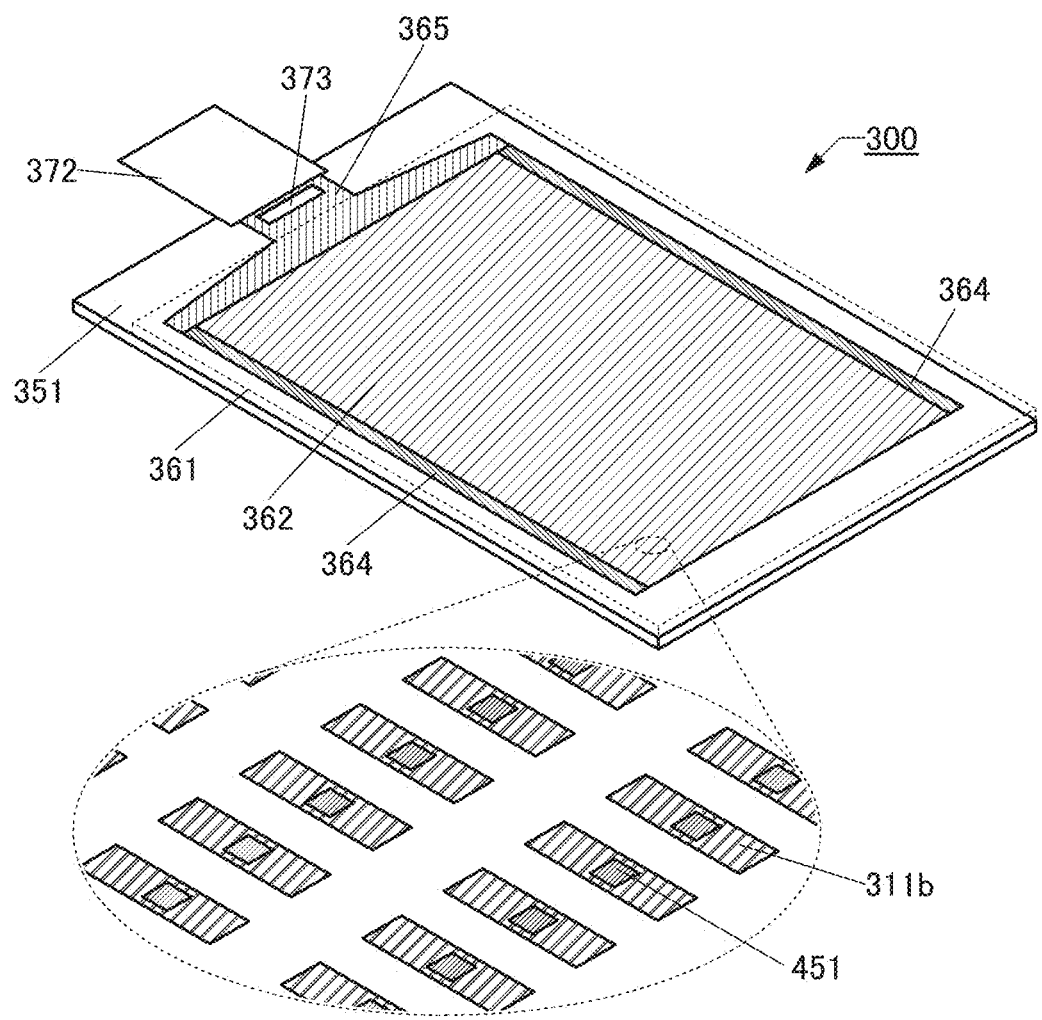
FIG. 23 is a perspective view illustrating an example of a display device.

FIG. 23 is a schematic perspective view of a display device 300. In the display device 300, the substrate 351 and the substrate 361 are bonded to each other. In FIG. 23, the substrate 361 is denoted by a dashed line.

The display device 300 includes a display portion 362, a circuit 364, a wiring 365, and the like. FIG. 23 illustrates an example in which the display device 300 is provided with an integrated circuit (IC) 373 and an FPC 372. Thus, the structure illustrated in FIG. 23 can be regarded as a display module including the display device 300, the IC, and the FPC.

As the circuit 364, for example, a scan line driver circuit can be used.

The wiring 365 has a function of supplying a signal and power to the display portion 362 and the circuit 364. The signal and power are input to the wiring 365 from the outside through the FPC 372 or from the IC 373.

FIG. 23 illustrates an example in which the IC 373 is provided over the substrate 351 by a chip on glass (COG) method, a chip on film (COF) method, or the like. An IC including a scan line driver circuit, a signal line driver circuit, or the like can be used as the IC 373, for example. Note that the display device 300 and the display module are not necessarily provided with an IC. The IC may be provided over the FPC by a COF method or the like.

FIG. 23 illustrates an enlarged view of part of the display portion 362. Electrodes 311b included in a plurality of display elements are arranged in a matrix in the display portion 362. The electrode 311b has a function of reflecting visible light, and serves as a reflective electrode of the liquid crystal element 180.

As illustrated in FIG. 23, the electrode 311b includes an opening 451. In addition, the display portion 362 includes the light-emitting element 170 that is positioned closer to the substrate 351 than the electrode 311b. Light from the light-emitting element 170 is emitted to the substrate 361 side through the opening 451 in the electrode 311b. The area of the light-emitting region of the light-emitting element 170 may be equal to the area of the opening 451. One of the area of the light-emitting region of the light-emitting element 170 and the area of the opening 451 is preferably larger than the other because a margin for misalignment can be increased. It is particularly preferable that the area of the opening 451 be larger than the area of the light-emitting region of the light-emitting element 170. When the area of the opening 451 is small, part of light from the light-emitting element 170 is blocked by the electrode 311b and cannot be extracted to the outside, in some cases. The opening 451 with a sufficiently large area can reduce waste of light emitted from the light-emitting element 170.

Figure 24:
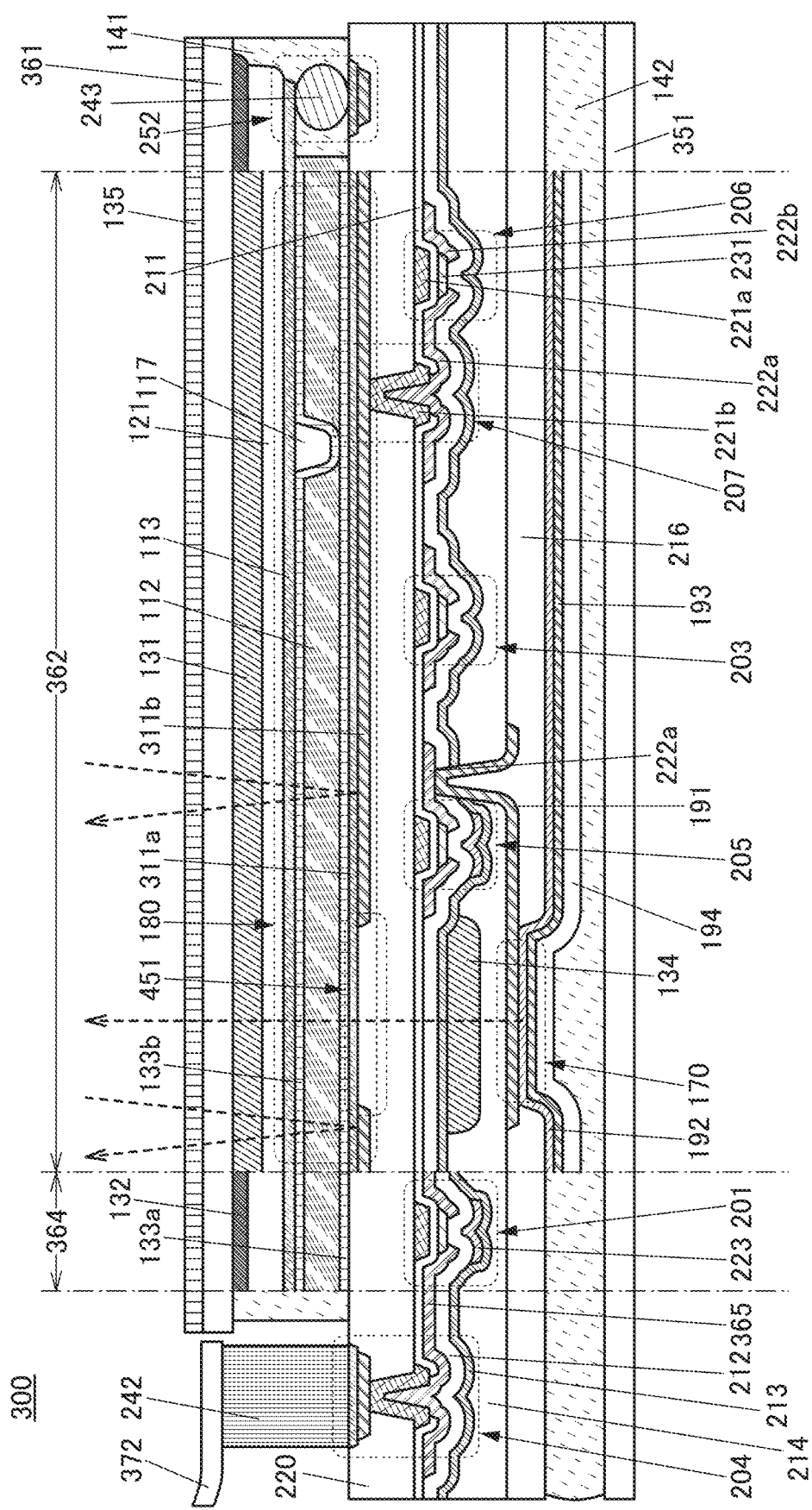
FIG. 24 is a cross-sectional view illustrating an example of a display device.

FIG. 24 illustrates an example of cross-sections of part of a region including the FPC 372, part of a region including the circuit 364, and part of a region including the display portion 362 of the display device 300 illustrated in FIG. 23.

The display device 300 illustrated in FIG. 24 includes a transistor 201, a transistor 203, a transistor 205, a transistor 206, the liquid crystal element 180, the light-emitting element 170, an insulating layer 220, a coloring layer 131, a coloring layer 134, and the like, between the substrate 351 and the substrate 361. The substrate 361 and the insulating layer 220 are bonded to each other with a bonding layer 141. The substrate 351 and the insulating layer 220 are bonded to each other with a bonding layer 142.

The substrate 361 is provided with the coloring layer 131, a light-blocking layer 132, an insulating layer 121, an electrode 113 functioning as a common electrode of the liquid crystal element 180, an alignment film 133b, an insulating layer 117, and the like. A polarizing plate 135 is provided on an outer surface of the substrate 361. The insulating layer 121 may have a function of a planarization layer. The insulating layer 121 enables the electrode 113 to have an almost flat surface, resulting in a uniform alignment state of a liquid crystal layer 112. The insulating layer 117 serves as a spacer for holding a cell gap of the liquid crystal element 180. In the case where the insulating layer 117 transmits visible light, the insulating layer 117 may be positioned to overlap with a display region of the liquid crystal element 180.

The liquid crystal element 180 is a reflective liquid crystal element. The liquid crystal element 180 has a stacked-layer structure of an electrode 311a serving as a pixel electrode, the liquid crystal layer 112, and the electrode 113. The electrode 311b that reflects visible light is provided in contact with a surface of the electrode 311a on the substrate 351 side. The electrode 311b includes the opening 451. The electrode 311a and the electrode 113 transmit visible light. An alignment film 133a is provided between the liquid crystal layer 112 and the electrode 311a. The alignment film 133b is provided between the liquid crystal layer 112 and the electrode 113.

In the liquid crystal element 180, the electrode 311b has a function of reflecting visible light, and the electrode 113 has a function of transmitting visible light. Light entering from the substrate 361 side is polarized by the polarizing plate 135, transmitted through the electrode 113 and the liquid crystal layer 112, and reflected by the electrode 311b. Then, the light is transmitted through the liquid crystal layer 112 and the electrode 113 again to reach the polarizing plate 135. In this case, alignment of a liquid crystal can be controlled with a voltage that is applied between the electrode 311b and the electrode 113, and thus optical modulation of light can be controlled. In other words, the intensity of light emitted through the polarizing plate 135 can be controlled. Light excluding light in a particular wavelength region is absorbed by the coloring layer 131 and thus, emitted light is red light, for example.

As illustrated in FIG. 24, the electrode 311a that transmits visible light is preferably provided across the opening 451. Accordingly, liquid crystals in the liquid crystal layer 112 are aligned in a region overlapping with the opening 451 as in the other regions, in which case an alignment defect of the liquid crystals in a boundary portion of these regions is prevented and undesired light leakage can be suppressed.

At a connection portion 207, the electrode 311b is electrically connected to a conductive layer 222a included in the transistor 206 via a conductive layer 221b. The transistor 206 has a function of controlling the driving of the liquid crystal element 180.

A connection portion 252 is provided in part of a region where the bonding layer 141 is provided. In the connection portion 252, a conductive layer obtained by processing the same conductive film as the electrode 311a is electrically connected to part of the electrode 113 with a connector 243. Accordingly, a signal or a potential input from the FPC 372 connected to the substrate 351 side can be supplied to the electrode 113 formed on the substrate 361 side through the connection portion 252.

As the connector 243, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. A material capable of elastic deformation or plastic deformation is preferably used for the connector 243. As illustrated in FIG. 24, the connector 243, which is the conductive particle, has a shape that is vertically crushed in some cases. With the crushed shape, the contact area between the connector 243 and a conductive layer electrically connected to the connector 243 can be increased, thereby reducing contact resistance and suppressing the generation of problems such as disconnection.

The connector 243 is preferably provided so as to be covered with the bonding layer 141. For example, the connectors 243 are dispersed in the bonding layer 141 before curing of the bonding layer 141.

The light-emitting element 170 is a bottom-emission light-emitting element. The light-emitting element 170 has a stacked-layer structure in which an electrode 191 serving as a pixel electrode, an EL layer 192, and an electrode 193 serving as a common electrode are stacked in this order from the insulating layer 220 side. The electrode 191 is connected to the conductive layer 222a included in the transistor 205 through an opening provided in an insulating layer 214. The transistor 205 has a function of controlling the driving of the light-emitting element 170. An insulating layer 216 covers an end portion of the electrode 191. The electrode 193 includes a material that reflects visible light, and the electrode 191 includes a material that transmits visible light. An insulating layer 194 is provided to cover the electrode 193. Light is emitted from the light-emitting element 170 to the substrate 361 side through the coloring layer 134, the insulating layer 220, the opening 451, the electrode 311a, and the like.

The liquid crystal element 180 and the light-emitting element 170 can exhibit various colors when the color of the coloring layer varies among pixels. The display device 300 can display a color image using the liquid crystal element 180. The display device 300 can display a color image using the light-emitting element 170.

The transistor 201, the transistor 203, the transistor 205, and the transistor 206 are formed on a plane of the insulating layer 220 on the substrate 351 side. These transistors can be fabricated through the same process.

A circuit electrically connected to the liquid crystal element 180 and a circuit electrically connected to the light-emitting element 170 are preferably formed on the same plane. In that case, the thickness of the display device can be smaller than that in the case where the two circuits are formed on different planes. Furthermore, since two transistors can be formed in the same process, a manufacturing process can be simplified as compared to the case where two transistors are formed on different planes.

The pixel electrode of the liquid crystal element 180 is positioned on the opposite side of a gate insulating layer included in the transistor from the pixel electrode of the light-emitting element 170.

In the case where a transistor including a metal oxide in its channel formation region and having an extremely low off-state current is used as the transistor 206 or in the case where a memory element electrically connected to the transistor 206 is used, for example, in displaying a still image using the liquid crystal element 180, even if writing operation to a pixel is stopped, the gray level can be maintained. In other words, an image can be kept displayed even with an extremely low frame rate. In one embodiment of the present invention, the frame rate can be extremely low and driving with low power consumption can be performed.

The transistor 203 is used for controlling whether the pixel is selected or not (such a transistor is also referred to as a switching transistor or a selection transistor). The transistor 205 is used for controlling current flowing to the light-emitting element 170 (such a transistor is also referred to as a driving transistor).

Insulating layers such as an insulating layer 211, an insulating layer 212, an insulating layer 213, and the insulating layer 214 are provided on the substrate 351 side of the insulating layer 220. Part of the insulating layer 211 functions as a gate insulating layer of each transistor. The insulating layer 212 is provided to cover the transistor 206 and the like. The insulating layer 213 is provided to cover the transistor 205 and the like. The insulating layer 214 functions as a planarization layer. Note that the number of insulating layers covering the transistor is not limited and may be one or two or more.

A material through which impurities such as water or hydrogen do not easily diffuse is preferably used for at least one of the insulating layers that cover the transistors. This is because such an insulating layer can serve as a barrier film. Such a structure can effectively suppress diffusion of the impurities into the transistors from the outside, and a highly reliable display device can be provided.

Each of the transistors 201, 203, 205, and 206 includes a conductive layer 221a functioning as a gate, the insulating layer 211 functioning as the gate insulating layer, the conductive layer 222a and a conductive layer 222b functioning as a source and a drain, and a semiconductor layer 231. Here, a plurality of layers obtained by processing the same conductive film are shown with the same hatching pattern.

The transistor 201 and the transistor 205 each include a conductive layer 223 functioning as a gate, in addition to the components of the transistor 203 or the transistor 206.

The structure in which the semiconductor layer where a channel is formed is provided between two gates is used as an example of the transistors 201 and 205. Such a structure enables the control of the threshold voltages of transistors. The two gates may be connected to each other and supplied with the same signal to operate the transistors. Such transistors can have higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can reduce display unevenness even in a display device in which the number of wirings is increased because of an increase in size or resolution.

Alternatively, by supplying a potential for controlling the threshold voltage to one of the two gates and a potential for driving to the other, the threshold voltage of the transistor can be controlled.

There is no limitation on the structure of the transistors included in the display device. The transistor included in the circuit 364 and the transistor included in the display portion 362 may have the same structure or different structures. A plurality of transistors included in the circuit 364 may have the same structure or a combination of two or more kinds of structures. Similarly, a plurality of transistors included in the display portion 362 may have the same structure or a combination of two or more kinds of structures.

It is preferable to use a conductive material containing an oxide for the conductive layer 223. A conductive film used for the conductive layer 223 is formed in an oxygen-containing atmosphere, whereby oxygen can be supplied to the insulating layer 212. The proportion of an oxygen gas in a deposition gas is preferably higher than or equal to 90% and lower than or equal to 100%. Oxygen supplied to the insulating layer 212 is then supplied to the semiconductor layer 231 by later heat treatment; as a result, oxygen vacancies in the semiconductor layer 231 can be reduced.

It is particularly preferable to use a low-resistance metal oxide for the conductive layer 223. In that case, an insulating film that releases hydrogen, such as a silicon nitride film, is preferably used for the insulating layer 213, for example, because hydrogen can be supplied to the conductive layer 223 during the formation of the insulating layer 213 or by heat treatment performed after the formation of the insulating layer 213, which leads to an effective reduction in the electric resistance of the conductive layer 223.

The coloring layer 134 is provided in contact with the insulating layer 213. The coloring layer 134 is covered with the insulating layer 214.

A connection portion 204 is provided in a region where the substrate 351 does not overlap with the substrate 361. In the connection portion 204, the wiring 365 is electrically connected to the FPC 372 via a connection layer 242. The connection portion 204 has a structure similar to that of the connection portion 207. On the top surface of the connection portion 204, a conductive layer obtained by processing the same conductive film as the electrode 311a is exposed. Thus, the connection portion 204 and the FPC 372 can be electrically connected to each other via the connection layer 242.

As the polarizing plate 135 provided on the outer surface of the substrate 361, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 180 are controlled depending on the kind of the polarizing plate so that desirable contrast is obtained.

Note that a variety of optical members can be arranged on the outer surface of the substrate 361. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, or the like may be arranged on the outer surface of the substrate 361.

For each of the substrates 351 and 361, glass, quartz, ceramic, sapphire, an organic resin, or the like can be used. When the substrates 351 and 361 are formed using a flexible material, the flexibility of the display device can be increased.

A liquid crystal element having, for example, a vertical alignment (VA) mode can be used as the liquid crystal element 180. Examples of the vertical alignment mode include a multi-domain vertical alignment (MVA) mode, a patterned vertical alignment (PVA) mode, and an advanced super view (ASV) mode.

A liquid crystal element having a variety of modes can be used as the liquid crystal element 180. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

The liquid crystal element is an element that controls transmission or non-transmission of light utilizing an optical modulation action of the liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode or design to be used.

To control the alignment of the liquid crystal, the alignment films can be provided. In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which several weight percent or more of a chiral material is mixed is used for the liquid crystal in order to improve the temperature range. The liquid crystal composition that includes a liquid crystal exhibiting a blue phase and a chiral material has a short response time and has optical isotropy. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of a liquid crystal display device in the manufacturing process can be reduced.

In the case where the reflective liquid crystal element is used, the polarizing plate 135 is provided on the display surface side. In addition, a light diffusion plate is preferably provided on the display surface side to improve visibility.

A front light may be provided on the outer side of the polarizing plate 135. As the front light, an edge-light front light is preferably used. A front light including an LED is preferably used to reduce power consumption.

For the materials that can be used for the light-emitting element, the transistors, the insulating layers, the conductive layers, the adhesive layers, the connection layer, and the like, the description in Embodiment 1 can be referred to.

<Structure Example 2>

Figure 25:
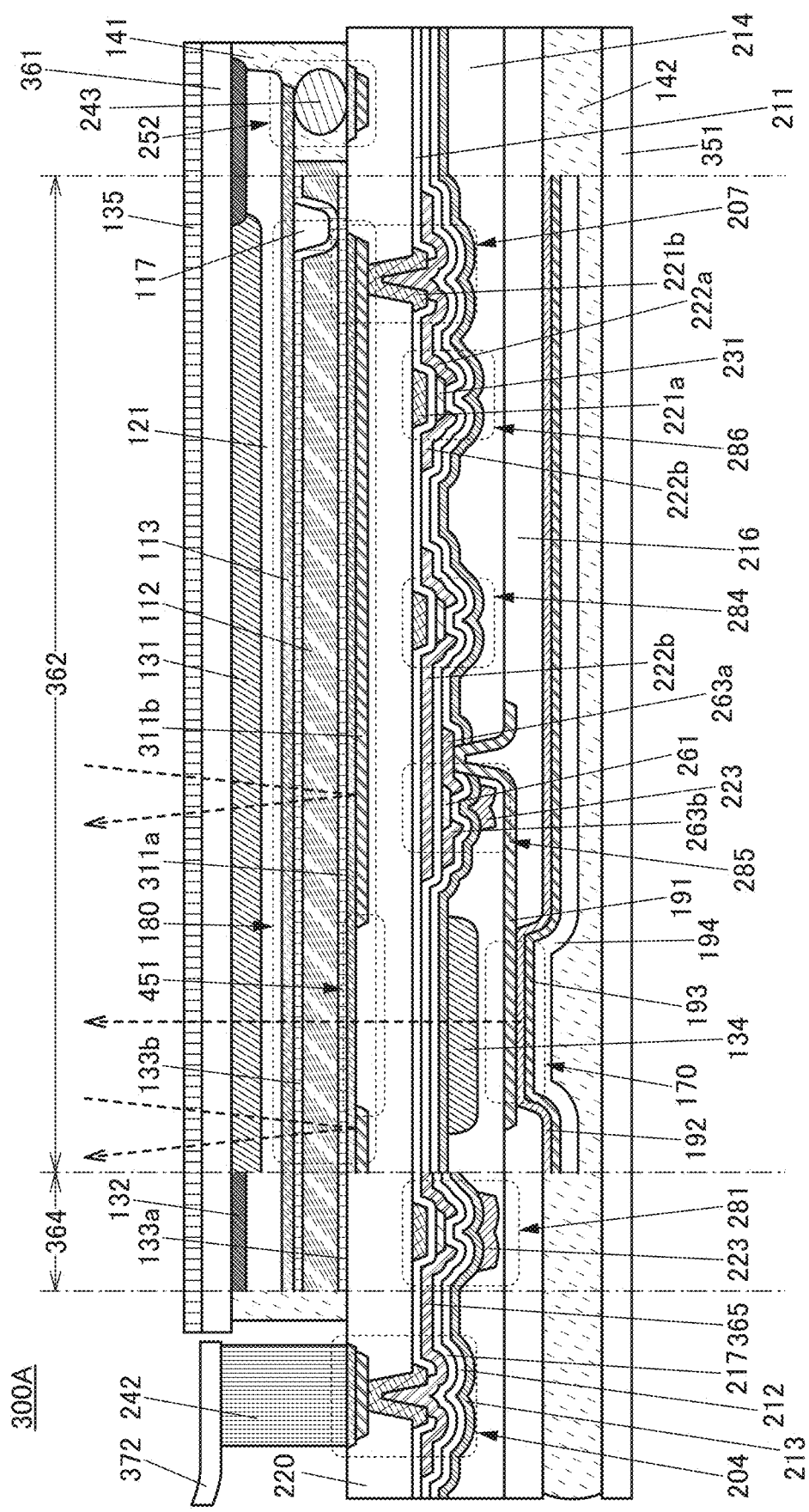
FIG. 25 is a cross-sectional view illustrating an example of a display device.

A display device 300A illustrated in FIG. 25 is different from the display device 300 mainly in that a transistor 281, a transistor 284, a transistor 285, and a transistor 286 are included instead of the transistor 201, the transistor 203, the transistor 205, and the transistor 206.

Note that the positions of the insulating layer 117, the connection portion 207, and the like in FIG. 25 are different from those in FIG. 24. FIG. 25 illustrates an end portion of a pixel. The insulating layer 117 is provided so as to overlap with an end portion of the coloring layer 131 and an end portion of the light-blocking layer 132. As in this structure, the insulating layer 117 may be provided in a region not overlapping with a display region (or in a region overlapping with the light-blocking layer 132).

Two transistors included in the display device may partly overlap with each other like the transistor 284 and the transistor 285. In that case, the area occupied by a pixel circuit can be reduced, leading to an increase in resolution. Furthermore, the light-emitting area of the light-emitting element 170 can be increased, leading to an improvement in aperture ratio. The light-emitting element 170 with a high aperture ratio requires low current density to obtain necessary luminance; thus, the reliability is improved.

Each of the transistors 281, 284, and 286 includes the conductive layer 221*a*, the insulating layer 211, the semiconductor layer 231, the conductive layer 222*a*, and the conductive layer 222*b*. The conductive layer 221*a* overlaps with the semiconductor layer 231 with the insulating layer 211 positioned therebetween. The conductive layer 222*a* and the conductive layer 222*b* are electrically connected to the semiconductor layer 231. The transistor 281 includes the conductive layer 223.

The transistor 285 includes the conductive layer 222*b*, an insulating layer 217, a semiconductor layer 261, the conductive layer 223, the insulating layer 212, the insulating layer 213, a conductive layer 263*a*, and a conductive layer 263*b*. The conductive layer 222*b* overlaps with the semiconductor layer 261 with the insulating layer 217 positioned therebetween. The conductive layer 223 overlaps with the semiconductor layer 261 with the insulating layers 212 and 213 positioned therebetween. The conductive layer 263*a* and the conductive layer 263*b* are electrically connected to the semiconductor layer 261.

The conductive layer 221*a* functions as a gate. The insulating layer 211 functions as a gate insulating layer. The conductive layer 222*a* functions as one of a source and a drain. The conductive layer 222*b* included in the transistor 286 functions as the other of the source and the drain.

The conductive layer 222*b* shared by the transistor 284 and the transistor 285 has a portion functioning as the other of a source and a drain of the transistor 284 and a portion functioning as a gate of the transistor 285. The insulating layer 217, the insulating layer 212, and the insulating layer 213 function as gate insulating layers. One of the conductive layer 263*a* and the conductive layer 263*b* functions as a source and the other functions as a drain. The conductive layer 223 functions as a gate.

<Structure Example 3>

Figure 26:
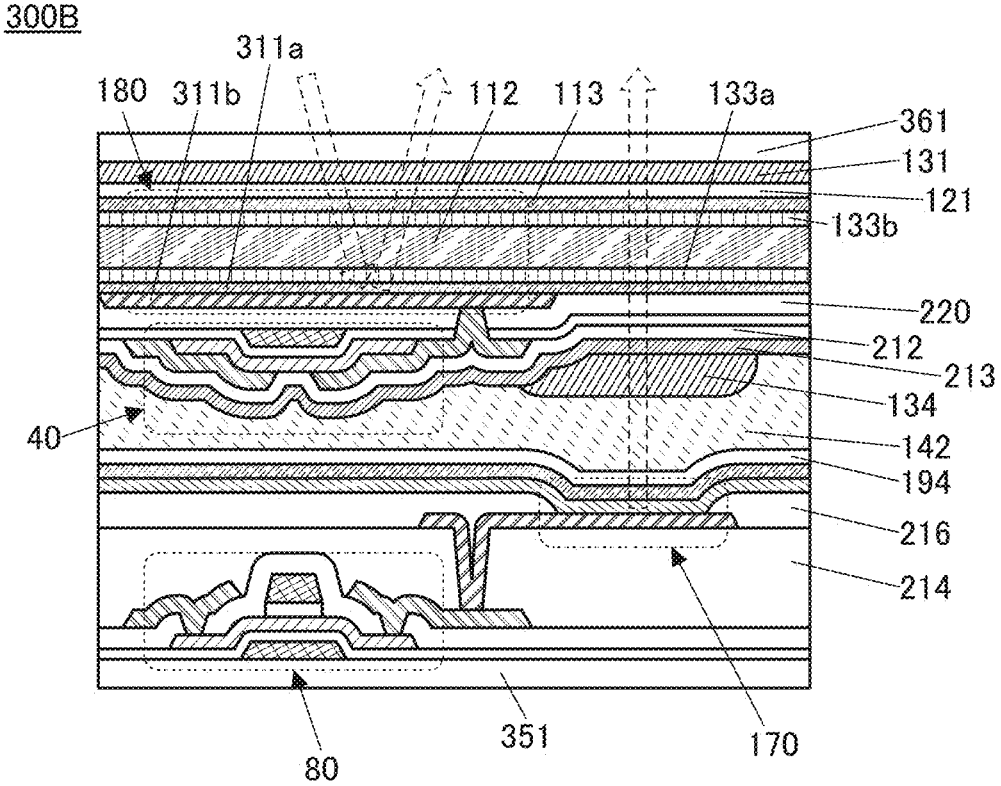
FIG. 26 is a cross-sectional view illustrating an example of a display device.

FIG. 26 is a cross-sectional view illustrating a display portion of a display device 300B.

The display device 300B illustrated in FIG. 26 includes the transistor 40, the transistor 80, the liquid crystal element 180, the light-emitting element 170, the insulating layer 220, the coloring layer 131, the coloring layer 134, and the like, between the substrate 351 and the substrate 361.

For the structures and manufacturing methods of the transistor 40 and the transistor 80, Embodiment 1 can be referred to.

In the liquid crystal element 180, external light is reflected on the electrode 311*b* and emitted to the substrate 361 side. The light-emitting element 170 emits light to the substrate 361 side. For the structures of the liquid crystal element 180 and the light-emitting element 170, the structure example 1 can be referred to.

The substrate 361 is provided with the coloring layer 131, the insulating layer 121, the electrode 113 functioning as the common electrode of the liquid crystal element 180, the alignment film 133*b*.

The liquid crystal layer 112 is sandwiched between the electrode 311*a* and the electrode 113 with the alignment film 133*a* positioned between the electrode 311*a* and the liquid crystal layer 112 and with the alignment film 133*b* positioned between the electrode 113 and the liquid crystal layer 112.

The transistor 40 is covered with the insulating layer 212 and the insulating layer 213. The insulating layer 213 and the coloring layer 134 are bonded to the insulating layer 194 with the bonding layer 142.

In the display device 300B, the transistor 40 for driving the liquid crystal element 180 and the transistor 80 for driving the light-emitting element 170 are formed over different planes; thus, each of the transistors can be easily formed using a structure and a material suitable for driving the corresponding display element.

<Manufacturing Method Example of Display Device 300>

Next, the manufacturing method of the display device of this embodiment will be specifically described with reference to FIGS. 27A to 27F, FIGS. 28A to 28C, FIGS. 29A and 29B, and FIGS. 30A and 30B. An example of a manufacturing method of the display device 300 illustrated in FIG. 24 will be described below. The manufacturing method will be described with reference to FIGS. 27A to 27F, FIGS. 28A to 28C, FIGS. 29A and 29B, and FIGS. 30A and 30B, focusing on the display portion 362 of the display device 300A. Note that the transistor 203 is not illustrated in FIGS. 27A to 27F, FIGS. 28A to 28C, FIGS. 29A and 29B, and FIGS. 30A and 30B.

Figure 27A:
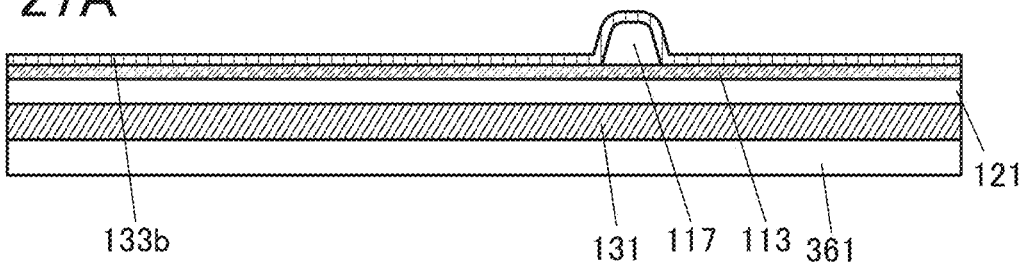
FIGS. 27A to 27F are cross-sectional views illustrating an example of a manufacturing method of a display device.

First, the coloring layer 131 is formed over the substrate 361 (FIG. 27A). The coloring layer 131 is formed using a photosensitive material, in which case the processing into an island shape can be performed by a photolithography method or the like. Note that in the circuit 364 and the like illustrated in FIG. 24, the light-blocking layer 132 is provided over the substrate 361.

Then, the insulating layer 121 is formed over the coloring layer 131 and the light-blocking layer 132.

The insulating layer 121 preferably functions as a planarization layer. A resin such as acrylic or epoxy is suitably used for the insulating layer 121.

An inorganic insulating film may be used for the insulating layer 121. For example, an inorganic insulating film such as a silicon nitride film, a silicon oxynitride film, a silicon oxide film, a silicon nitride oxide film, an aluminum oxide film, or an aluminum nitride film can be used for the insulating layer 121. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Further alternatively, a stack including two or more of the above insulating films may be used.

Next, the electrode 113 is formed. The electrode 113 can be formed in the following manner: a conductive film is formed, a resist mask is formed, the conductive film is etched, and the resist mask is removed. The electrode 113 is formed using a conductive material that transmits visible light.

After that, the insulating layer 117 is formed over the electrode 113. An organic insulating film is preferably used for the insulating layer 117.

Subsequently, the alignment film 133b is formed over the electrode 113 and the insulating layer 117 (FIG. 27A). The alignment film 133b can be formed in the following manner: a thin film is formed using a resin or the like and then, rubbing treatment is performed.

Note that steps illustrated in FIGS. 27B to 27F, FIGS. 28A to 28C, FIGS. 29A and 29B, and FIGS. 30A and 30B are performed independently of the steps described with reference to FIG. 27A.

Figure 27B:
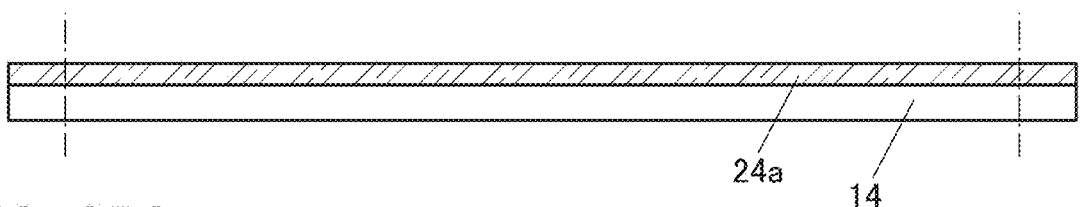
Figure 27C:
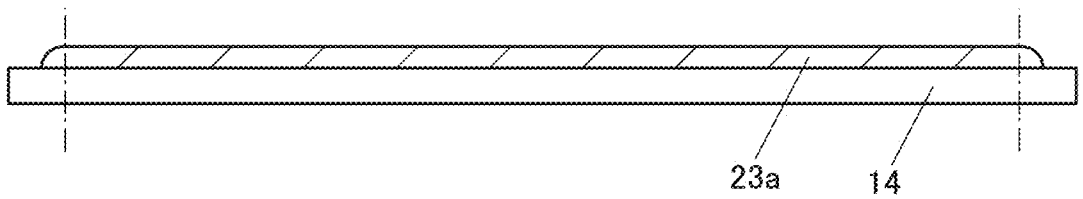
Figure 27D:
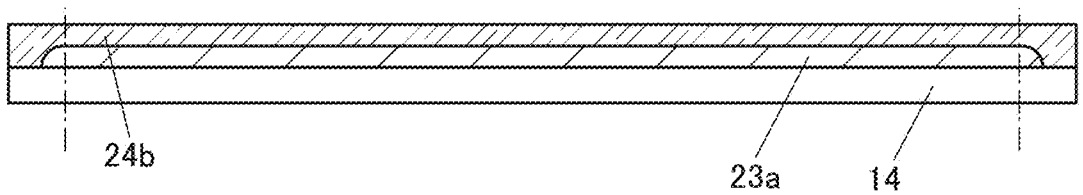
Figure 27E:
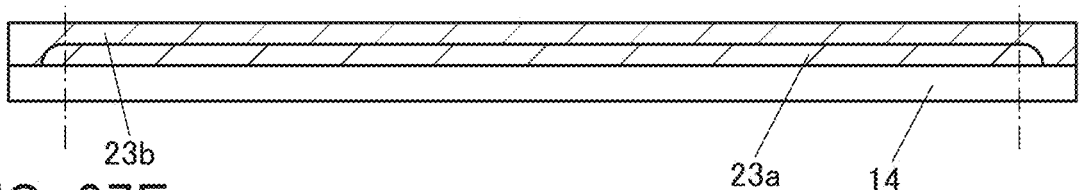

First, the first layer 24a is formed over the formation substrate 14 in a manner similar to that of the manufacturing method example 2 in Embodiment 1 (FIG. 27B). Subsequently, the first heat treatment is performed on the first layer 24a that has been processed into a desired shape, so that the first resin layer 23a is formed (FIG. 27C). In the example illustrated in FIG. 27C, the first resin layer 23a having an island-like shape is formed. The first heat treatment is performed in an oxygen-containing atmosphere. Then, the second layer 24b is formed over the formation substrate 14 and the first resin layer 23a (FIG. 27D). Subsequently, the second heat treatment is performed on the second resin layer 24b, so that the second resin layer 23b is formed (FIG. 27E). The second heat treatment is performed in an atmosphere containing less oxygen than an atmosphere of the first heat treatment.

Figure 27F:
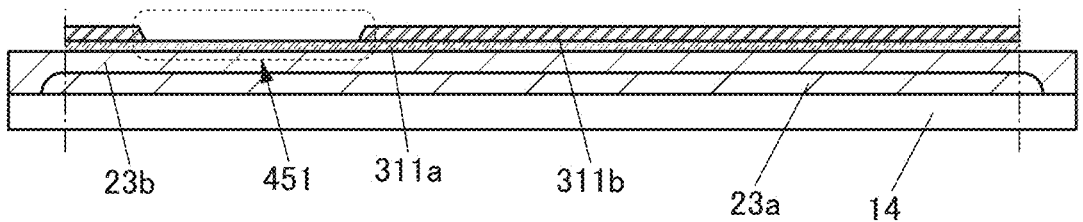

Next, the electrode 311a is formed over the second resin layer 23b, and the electrode 311b is formed over the electrode 311a (FIG. 27F). The electrode 311b includes the opening 451 over the electrode 311a. Each of the electrodes 311a and 311b can be formed in the following manner: a conductive film is formed, a resist mask is formed, the conductive film is etched, and the resist mask is removed. The electrode 311a is formed using a conductive material that transmits visible light. The electrode 311b is formed using a conductive material that reflects visible light.

The electrode 311a may be formed over an insulating film formed over the second resin layer 23b. As the insulating film, an inorganic insulating film that can be used to form the insulating layer 121 is suitably used. The insulating layer can be used as a barrier layer that prevents diffusion of impurities contained in the first resin layer 23a and the second resin layer 23b into a transistor and a display element formed later.

Figure 28A:
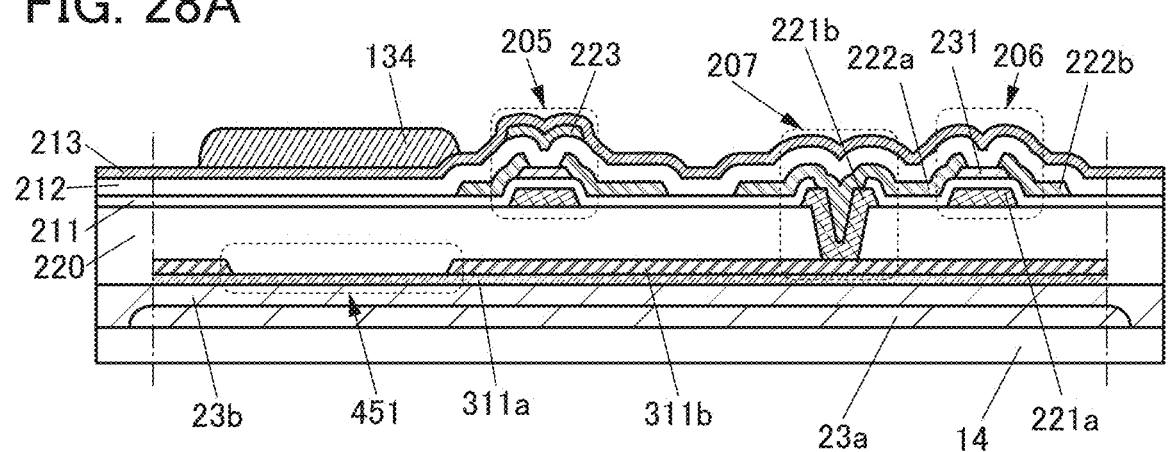
FIGS. 28A to 28C are cross-sectional views illustrating an example of a manufacturing method of a display device.

After that, the insulating layer 220 is formed (FIG. 28A). Then, an opening that reaches the electrode 311b is formed in the insulating layer 220.

The insulating layer 220 can be used as a barrier layer that prevents diffusion of impurities contained in the first resin layer 23a and the second resin layer 23b into a transistor and a display element formed later. For example, the insulating layer 220 preferably prevents moisture and the like contained in the first resin layer 23a and the second resin layer 23b from diffusing into the transistor and the display element when the first resin layer 23a and the second resin layer 23b is heated. Thus, the insulating layer 220 preferably has a high barrier property.

The insulating layer 220 can be formed using the inorganic insulating film, the resin, or the like that can be used for the insulating layer 121.

Next, the transistor 205 and the transistor 206 are formed over the insulating layer 220.

There is no particular limitation on a semiconductor material used for the semiconductor layer of the transistor, and for example, a Group 14 element, a compound semiconductor, or an oxide semiconductor can be used. Typically, a semiconductor containing silicon, a semiconductor containing gallium arsenide, an oxide semiconductor containing indium, or the like can be used.

Described here is the case where a bottom-gate transistor including a metal oxide layer as the semiconductor layer 231 is fabricated as the transistor 206. The transistor 205 includes the conductive layer 223 and the insulating layer 212 in addition to the components of the transistor 206, and has two gates. A metal oxide can function as an oxide semiconductor.

Specifically, first, the conductive layer 221a and the conductive layer 221b are formed over the insulating layer 220. The conductive layer 221a and the conductive layer 221b can be formed in the following manner: a conductive film is formed, a resist mask is formed, the conductive film is etched, and the resist mask is removed. At this time, the conductive layer 221b and the electrode 311b are connected to each other through an opening in the insulating layer 220.

Next, the insulating layer 211 is formed.

For the insulating layer 211, for example, an inorganic insulating film such as a silicon nitride film, a silicon oxynitride film, a silicon oxide film, a silicon nitride oxide film, an aluminum oxide film, or an aluminum nitride film can be used. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Further alternatively, a stack including two or more of the above insulating films may be used.

An inorganic insulating film is preferably formed at high temperatures because the film can have higher density and a higher barrier property as the deposition temperature becomes higher. The substrate temperature during the formation of the inorganic insulating film is preferably higher than or equal to room temperature (25° C.) and lower than or equal to 350° C., further preferably higher than or equal to 100° C. and lower than or equal to 300° C.

Then, the semiconductor layer 231 is formed. In this embodiment, a metal oxide layer is formed as the semiconductor layer 231. The metal oxide layer can be formed in the following manner: a metal oxide film is formed, a resist mask is formed, the metal oxide film is etched, and the resist mask is removed.

Next, the conductive layer 222a and the conductive layer 222b are formed. The conductive layer 222a and the conductive layer 222b can be formed in the following manner: a conductive film is formed, a resist mask is formed, the conductive film is etched, and the resist mask is removed. Each of the conductive layers 222a and 222b is connected to the semiconductor layer 231. Here, the conductive layer 222a included in the transistor 206 is electrically connected to the conductive layer 221b. As a result, the electrode 311b and the conductive layer 222a can be electrically connected to each other at the connection portion 207.

Note that during the processing of the conductive layer 222a and the conductive layer 222b, the semiconductor layer 231 might be partly etched to be thin in a region not covered by the resist mask.

In the above manner, the transistor 206 can be fabricated (FIG. 28A). In the transistor 206, part of the conductive layer 221a functions as a gate, part of the insulating layer 211 functions as a gate insulating layer, and the conductive layer 222a and the conductive layer 222b function as a source and a drain.

Next, the insulating layer 212 that covers the transistor 206 is formed. The insulating layer 212 is formed to cover the semiconductor layer 231, the conductive layer 222a, and the conductive layer 222b of each of the transistor 205 and the transistor 206. Next, the conductive layer 223 of the transistor 205 is formed over the insulating layer 212.

The insulating layer 212 can be formed in a manner similar to that of the insulating layer 211.

The conductive layer 223 included in the transistor 205 can be formed in the following manner: a conductive film is formed, a resist mask is formed, the conductive film is etched, and the resist mask is removed.

In the above manner, the transistor 205 can be fabricated (FIG. 28A). In the transistor 205, part of the conductive layer 221a and part of the conductive layer 223 function as gates, part of the insulating layer 211 and part of the insulating layer 212 function as gate insulating layers, and the conductive layer 222a and the conductive layer 222b function as a source and a drain.

Next, the insulating layer 213 covering the transistor 205 and the transistor 206 is formed (FIG. 28A). The insulating layer 213 can be formed in a manner similar to that of the insulating layer 211.

It is preferable to use an oxide insulating film formed in an oxygen-containing atmosphere, such as a silicon oxide film or a silicon oxynitride film, for the insulating layer 212. An insulating film with low oxygen diffusibility and oxygen permeability, such as a silicon nitride film, is preferably stacked as the insulating layer 213 over the silicon oxide film or the silicon oxynitride film. The oxide insulating film formed in an oxygen-containing atmosphere can easily release a large amount of oxygen by heating. When a stack including such an oxide insulating film that releases oxygen and such an insulating film with low oxygen diffusibility and oxygen permeability is heated, oxygen can be supplied to the metal oxide layer. As a result, oxygen vacancies in the metal oxide layer can be filled and defects at the interface between the metal oxide layer and the insulating layer 212 can be repaired, leading to a reduction in defect levels. Accordingly, a display device with extremely high reliability can be fabricated.

Figure 28B:
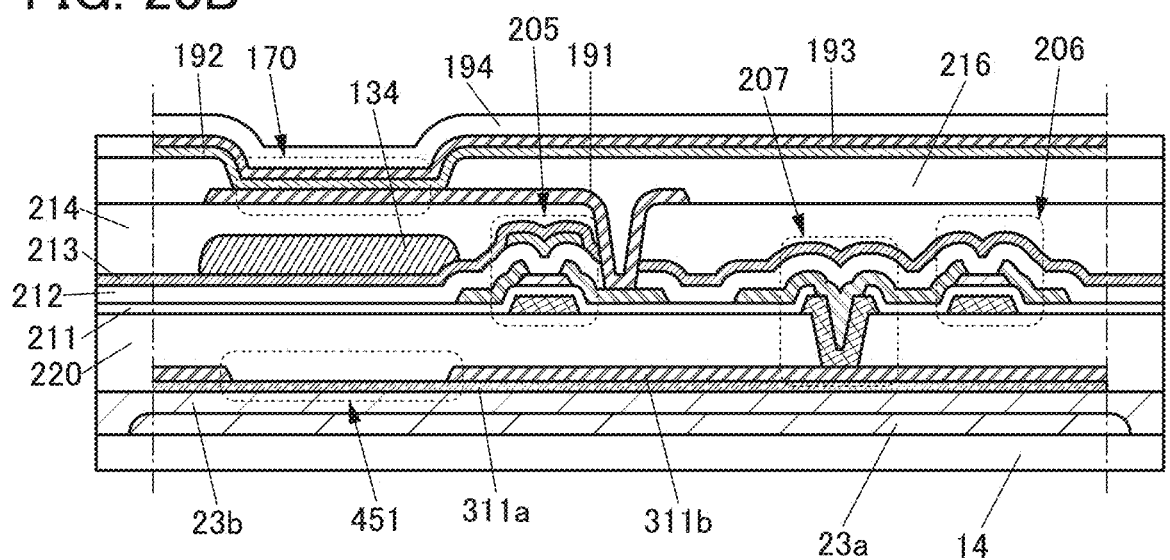

Next, the coloring layer 134 is formed over the insulating layer 213 (FIG. 28A) and then, the insulating layer 214 is formed (FIG. 28B). The coloring layer 134 is positioned so as to overlap with the opening 451 in the electrode 311b.

The coloring layer 134 can be formed in a manner similar to that of the coloring layer 131. The display element is formed on the insulating layer 214 in a later step; thus, the insulating layer 214 preferably functions as a planarization layer. For the insulating layer 214, the description of the resin or the inorganic insulating film that can be used for the insulating layer 121 can be referred to.

After that, an opening that reaches the conductive layer 222a included in the transistor 205 is formed in the insulating layer 212, the insulating layer 213, and the insulating layer 214.

Subsequently, the electrode 191 is formed (FIG. 28B). The electrode 191 can be formed in the following manner: a conductive film is formed, a resist mask is formed, the conductive film is etched, and the resist mask is removed. Here, the conductive layer 222a included in the transistor 205 and the electrode 191 are connected to each other. The electrode 191 is formed using a conductive material that transmits visible light.

Then, the insulating layer 216 that covers the end portion of the electrode 191 is formed (FIG. 28B). For the insulating layer 216, the description of the resin or the inorganic insulating film that can be used for the insulating layer 121 can be referred to. The insulating layer 216 includes an opening in a region overlapping with the electrode 191.

Next, the EL layer 192 and the electrode 193 are formed (FIG. 28B). Part of the electrode 193 functions as the common electrode of the light-emitting element 170. The electrode 193 is formed using a conductive material that reflects visible light.

Steps after the formation of the EL layer 192 are performed such that temperatures higher than the upper temperature limit of the EL layer 192 are not applied to the EL layer 192. The electrode 193 can be formed by an evaporation method, a sputtering method, or the like.

In the above manner, the light-emitting element 170 can be formed (FIG. 28B). In the light-emitting element 170, the electrode 191 part of which functions as the pixel electrode, the EL layer 192, and the electrode 193 part of which functions as the common electrode are stacked. The light-emitting element 170 is formed such that the light-emitting region overlaps with the coloring layer 134 and the opening 451 in the electrode 311b.

Next, the insulating layer 194 is formed so as to cover the electrode 193 (FIG. 28B). The insulating layer 194 functions as a protective layer that prevents diffusion of impurities such as water into the light-emitting element 170. The light-emitting element 170 is sealed with the insulating layer 194. After the electrode 193 is formed, the insulating layer 194 is preferably formed without exposure to the air.

The inorganic insulating film that can be used for the insulating layer 121 can be used for the insulating layer 194, for example. It is particularly preferable that the insulating layer 194 include an inorganic insulating film with a high barrier property. A stack including an inorganic insulating film and an organic insulating film can also be used.

The insulating layer 194 is preferably formed at substrate temperature lower than or equal to the upper temperature limit of the EL layer 192. The insulating layer 194 can be formed by an ALD method, a sputtering method, or the like. An ALD method and a sputtering method are preferable because a film can be formed at low temperatures. An ALD method is preferable because the coverage with the insulating layer 194 is improved.

Figure 28C:
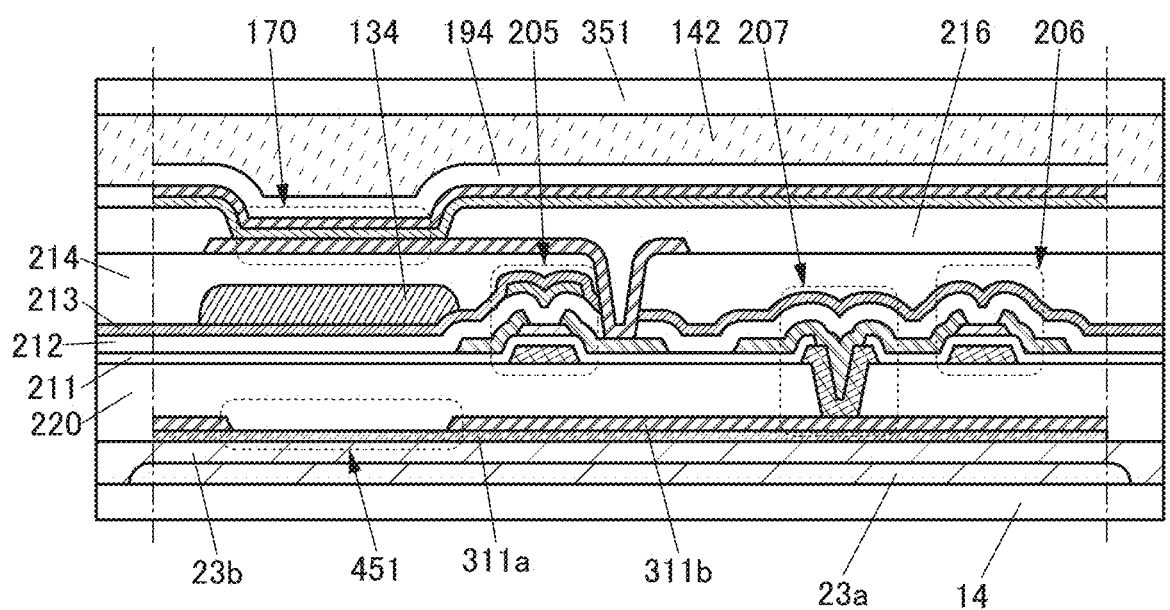

Then, the substrate 351 is bonded to a surface of the insulating layer 194 with the bonding layer 142 (FIG. 28C).

As the adhesive layer 142, any of a variety of curable adhesives such as a reactive curable adhesive, a thermosetting adhesive, an anaerobic adhesive, and a photocurable adhesive such as an ultraviolet curable adhesive can be used. Still alternatively, an adhesive sheet or the like may be used.

For the substrate 351, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Any of a variety of materials such as glass, quartz, a resin, a metal, an alloy, and a semiconductor can be used for the substrate 351. The substrate 351 formed using any of a variety of materials such as glass, quartz, a resin, a metal, an alloy, and a semiconductor may be thin enough to be flexible.

Figure 29A:
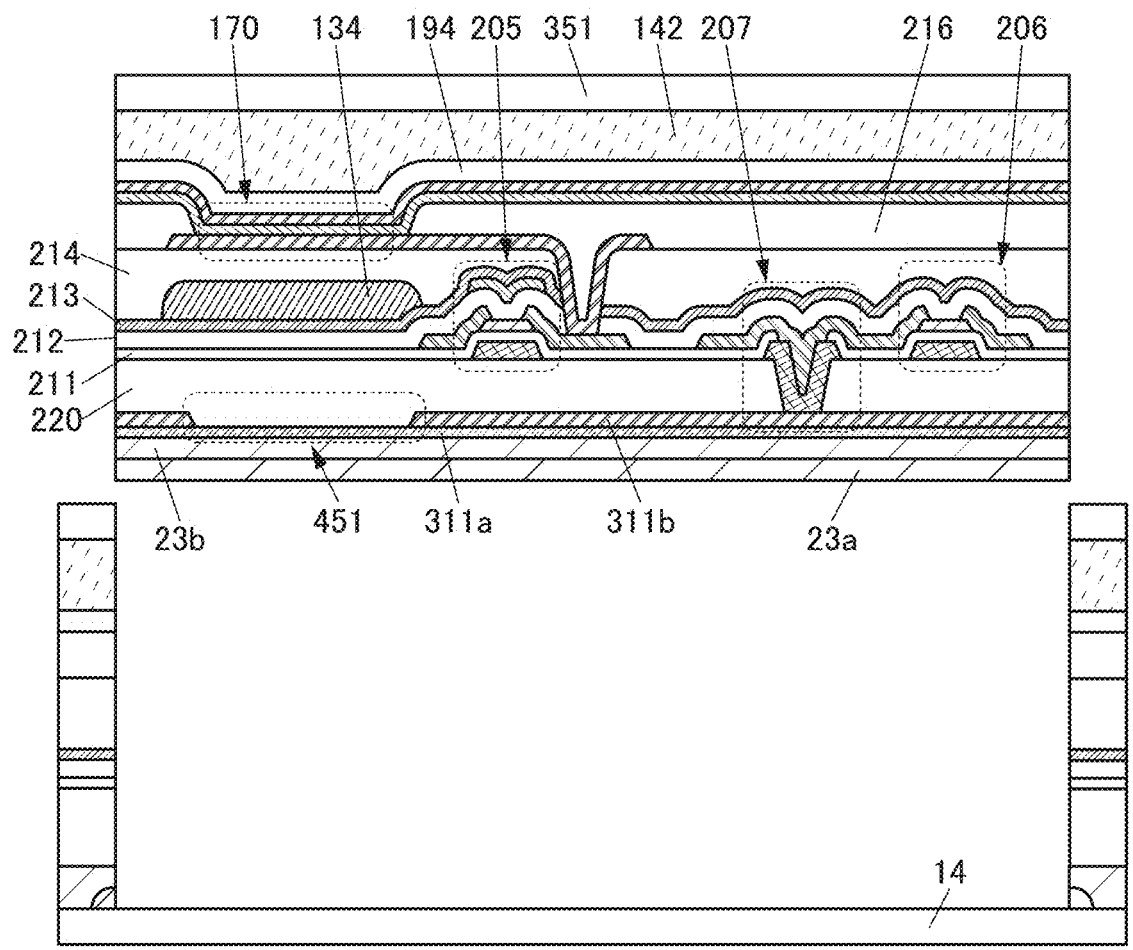
FIGS. 29A and 29B are cross-sectional views illustrating an example of a manufacturing method of a display device.

Then, a separation starting point is formed in the first resin layer 23a, and the formation substrate 14 and the first resin layer 23a are separated from each other (FIG. 29A).

Figure 29B:
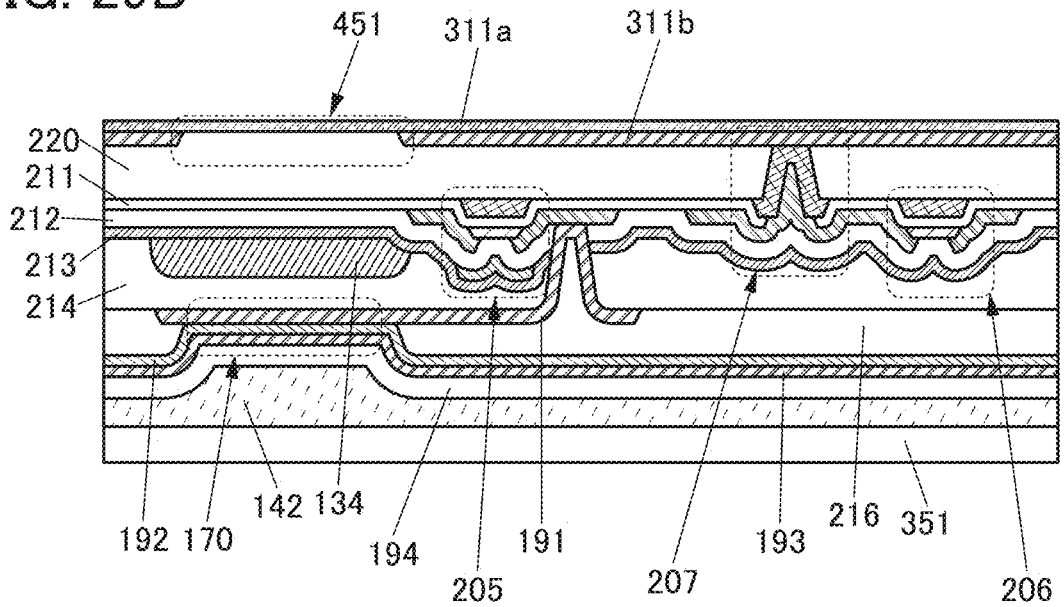

Next, the first resin layer 23a and the second resin layer 23b are preferably removed. The first resin layer 23a and the second resin layer 23b can be removed by a dry etching method, for example. Accordingly, the electrode 311a is exposed (FIG. 29B).

In the case where the insulating film is positioned between the second resin layer 23b and the electrode 311a, the insulating film may be either removed or left. To remove the insulating film, a dry etching method can be used, for example.

Figure 30A:
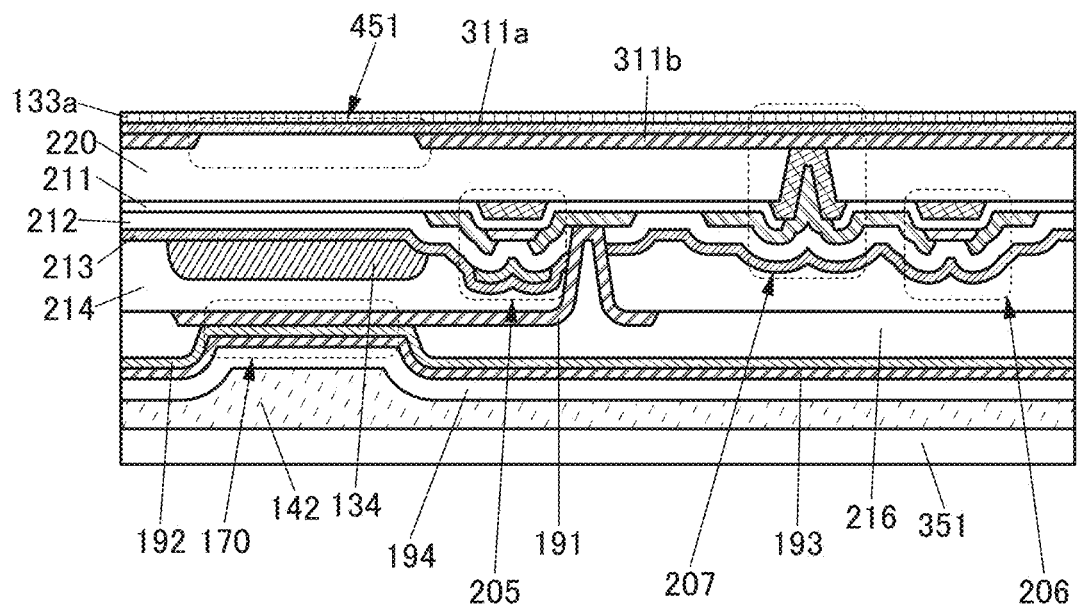
FIGS. 30A and 30B are cross-sectional views illustrating an example of a manufacturing method of a display device.

Subsequently, the alignment film 133a is formed on the exposed surface of the electrode 311a (or the insulating film) (FIG. 30A). The alignment film 133a can be formed in the following manner: a thin film is formed using a resin or the like and then, rubbing treatment is performed.

Figure 30B:
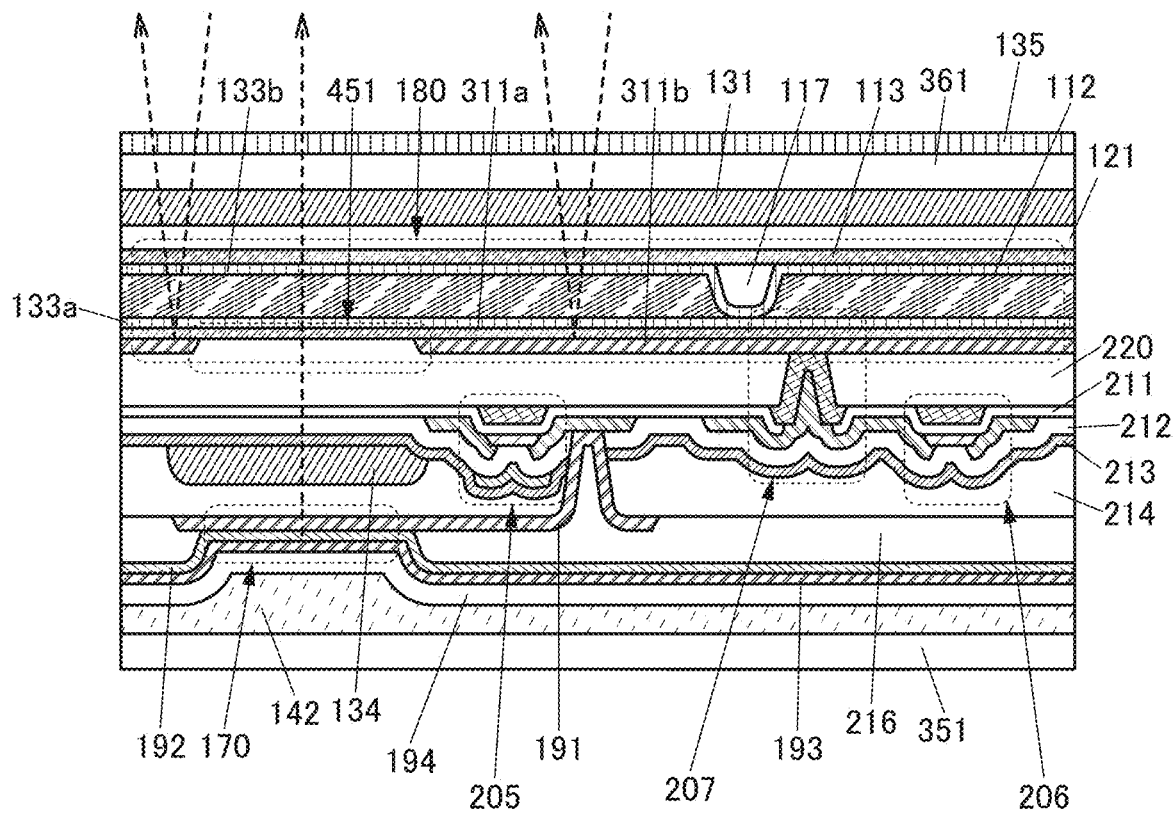

Then, the substrate 361 obtained from the steps described using FIG. 27A and the substrate 351 obtained from the steps up to the step illustrated in FIG. 30A are bonded to each other with the liquid crystal layer 112 provided therebetween (FIG. 30B). Although not illustrated in FIG. 30B, the substrate 351 and the substrate 361 are bonded to each other with the bonding layer 141 as illustrated in FIG. 24 and other drawings. For materials for the bonding layer 141, the description of the materials that can be used for the bonding layer 142 can be referred to.

In the liquid crystal element 180 illustrated in FIG. 30B, the electrode 311a (and the electrode 311b) part of which functions as the pixel electrode, the liquid crystal layer 112, and the electrode 113 part of which functions as the common electrode are stacked. The liquid crystal element 180 is formed so as to overlap with the coloring layer 131.

The polarizing plate 135 is placed on the outer surface of the substrate 361.

Through the above process, the display device 300 can be manufactured.

<Manufacturing Method Example of Display Device 300B>

Next, the manufacturing method of the display device of this embodiment will be specifically described with reference to FIGS. 31A to 31D, FIGS. 32A and 32B, and FIGS. 33A to 33C. An example of a manufacturing method of the display device 300B illustrated in FIG. 26 will be described below. Note that portions similar to those in the manufacturing method example of the display device 300 will not be described in some cases.

Figure 31A:
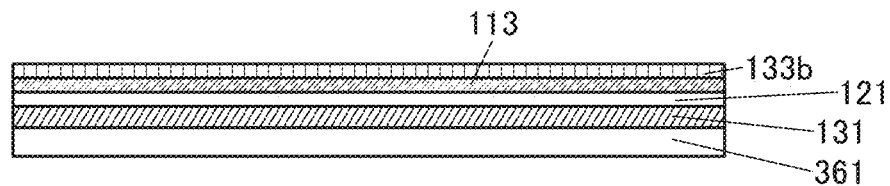
FIGS. 31A to 31D are cross-sectional views illustrating an example of a manufacturing method of a display device.

First, as in the manufacturing method example of the display device 300, the coloring layer 131, the insulating layer 121, the electrode 113, and the alignment film 133b are formed over the substrate 361 in that order (FIG. 31A).

Figure 31B:
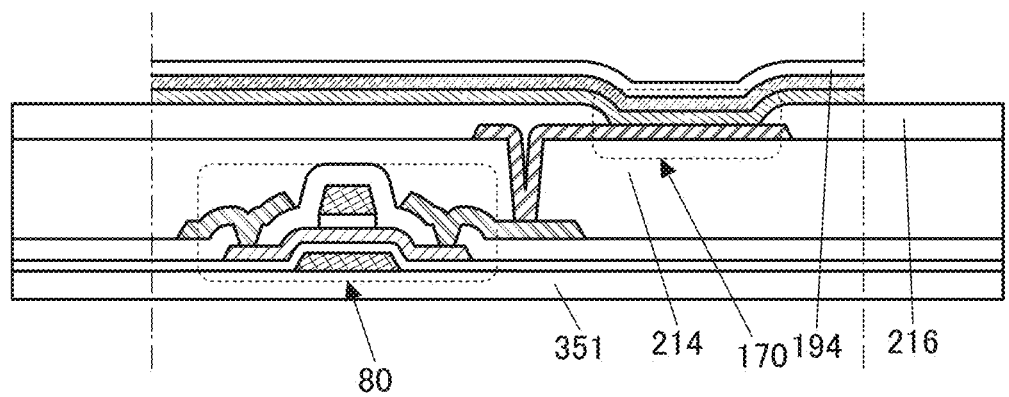

Furthermore, the steps illustrated in FIG. 31B are performed independently of the steps described with reference to FIG. 31A.

First, the transistor 80 is formed over the substrate 351. For the structure and manufacturing method of the transistor 80, Embodiment 1 can be referred to.

Then, the insulating layer 214, the insulating layer 216, the light-emitting element 170, and the insulating layer 194 are formed (FIG. 31B). For the structures and formation methods of the insulating layer 214, the insulating layer 216, the light-emitting element 170, and the insulating layer 194, the manufacturing method example of the display device 300 can be referred to.

Figure 31C:
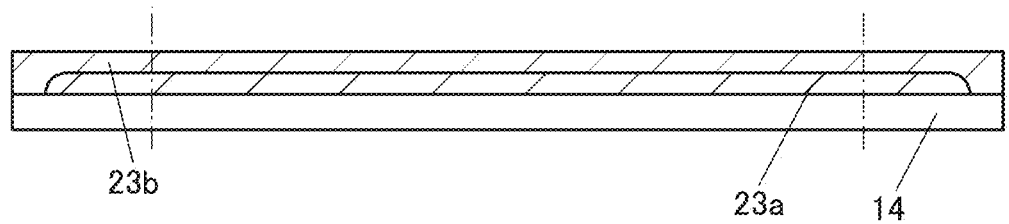
Figure 31D:
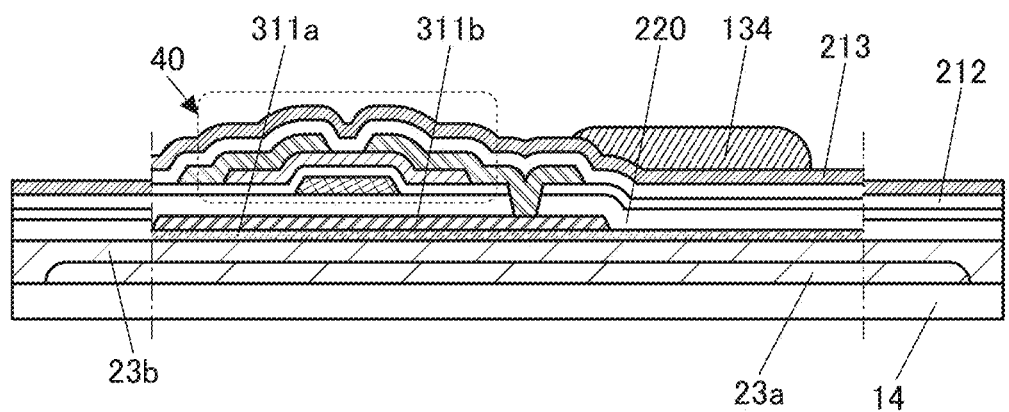

Furthermore, the steps illustrated in FIGS. 31C and 31D are performed independently of the steps described with reference to FIG. 31A and the steps described with reference to FIG. 31B.

First, the first resin layer 23a having an island shape is formed over the formation substrate 14 in a manner similar to that of the manufacturing method example 2 in Embodiment 1. Then, the second resin layer 23b is formed over the formation substrate 14 and the first resin layer 23a (FIG. 31C).

Specifically, the first layer 24a is formed over the formation substrate 14, and a first heat treatment is performed on the first layer 24a having a desired shape, whereby the first resin layer 23a is formed. The first heat treatment is performed in an atmosphere containing oxygen. Then, the second layer 24b is formed over the formation substrate 14 and the first resin layer 23a, and a second heat treatment is performed on the second layer 24b, whereby the second resin layer 23b is formed. The second heat treatment is performed in an atmosphere containing less oxygen than the atmosphere of the first heat treatment.

Next, the electrode 311a is formed over the second resin layer 23b, and the electrode 311b is formed over the electrode 311a (FIG. 31D). Each of the electrodes 311a and 311b can be formed in the following manner: a conductive film is formed, a resist mask is formed, the conductive film is etched, and the resist mask is removed. The electrode 311a is formed using a conductive material that transmits visible light. The electrode 311b is formed using a conductive material that reflects visible light.

The electrode 311a may be formed over an insulating film formed over the second resin layer 23b. As the insulating film, an inorganic insulating film that can be used to form the insulating layer 121 is suitably used. The insulating layer can be used as a barrier layer that prevents diffusion of impurities contained in the first resin layer 23a and the second resin layer 23b into a transistor and a display element formed later.

After that, the insulating layer 220 is formed (FIG. 31D). Then, an opening that reaches the electrode 311b is formed in the insulating layer 220.

Then, the transistor 40 is formed over the insulating layer 220 (FIG. 31D). For the structure and manufacturing method of the transistor 40, Embodiment 1 can be referred to.

After that, the insulating layer 212 that covers the transistor 40 is formed, the insulating layer 213 is formed over the insulating layer 212, and the coloring layer 134 is formed over the insulating layer 213 (FIG. 31D).

Figure 32A:
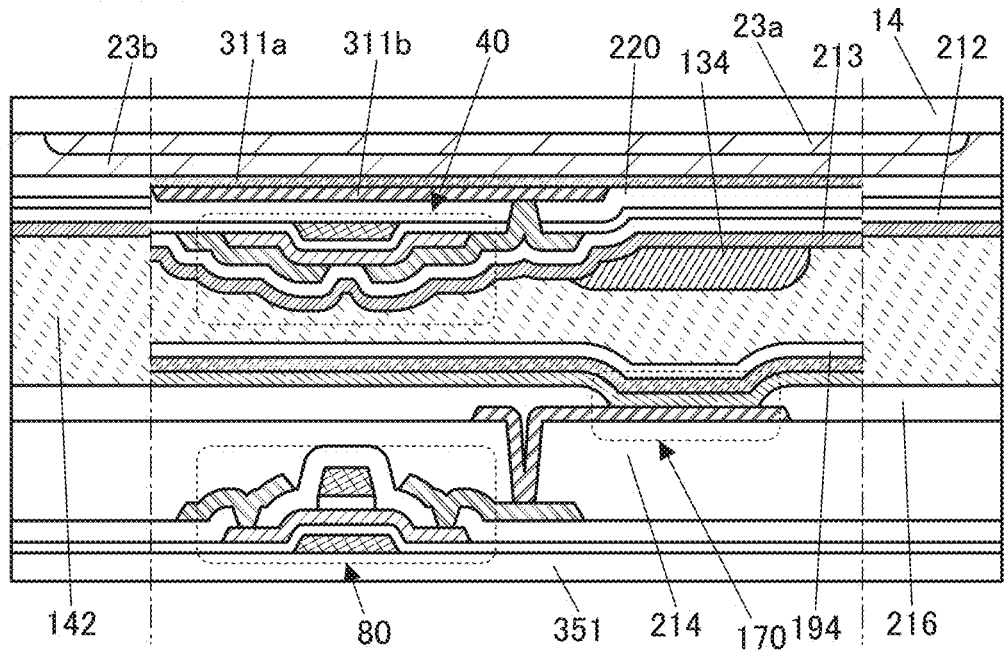
FIGS. 32A and 32B are cross-sectional views illustrating an example of a manufacturing method of a display device.

The substrate 351 obtained from the steps described with reference to FIG. 31B and the formation substrate 14 obtained from the steps up to the steps illustrated in FIG. 31D, are bonded to each other using the bonding layer 142 (FIG. 32A).

Figure 32B:
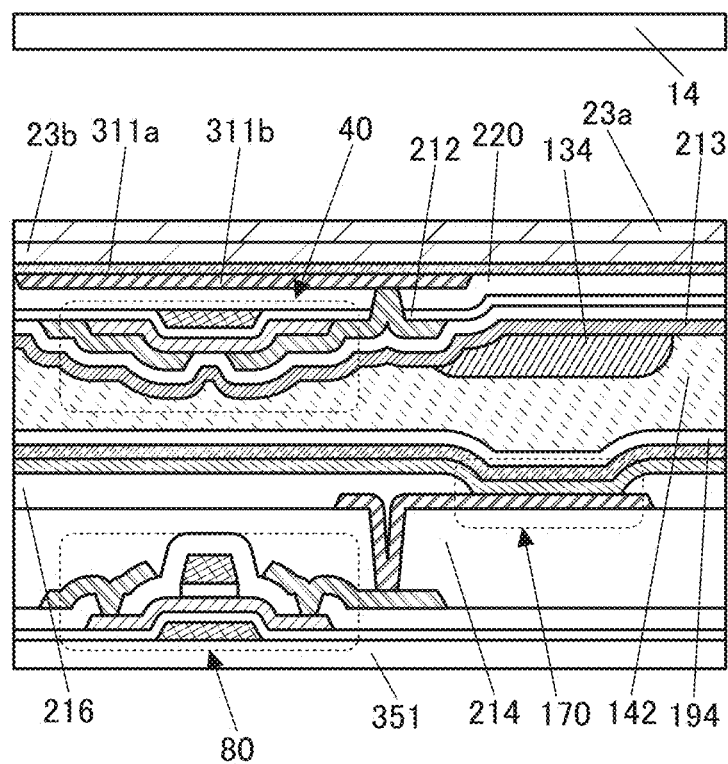

Then, a separation starting point is formed in the first resin layer 23a, and the formation substrate 14 and the first resin layer 23a are separated from each other (FIG. 32B).

Figure 33A:
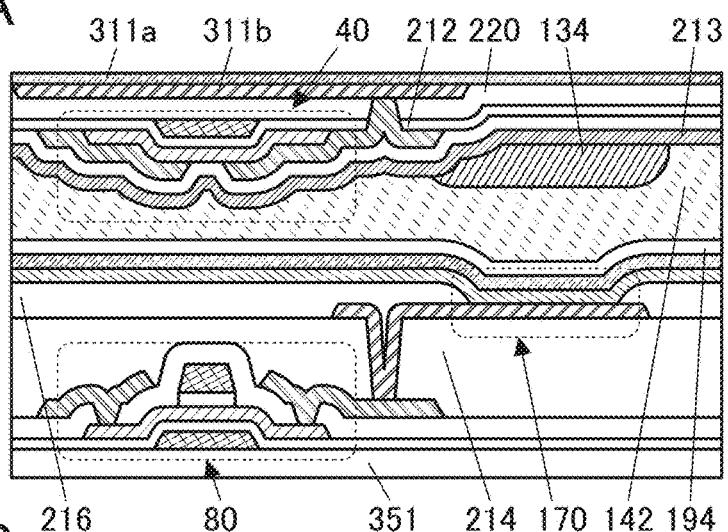
FIGS. 33A to 33C are cross-sectional views illustrating an example of a manufacturing method of a display device.

Next, the first resin layer 23a and the second resin layer 23b are preferably removed. The first resin layer 23a and the second resin layer 23b can be removed by a dry etching method, for example. Accordingly, the electrode 311a is exposed (FIG. 33A).

In the case where the insulating film is positioned between the second resin layer 23b and the electrode 311a, the insulating film may be either removed or left. To remove the insulating film, a dry etching method can be used, for example.

Figure 33B:
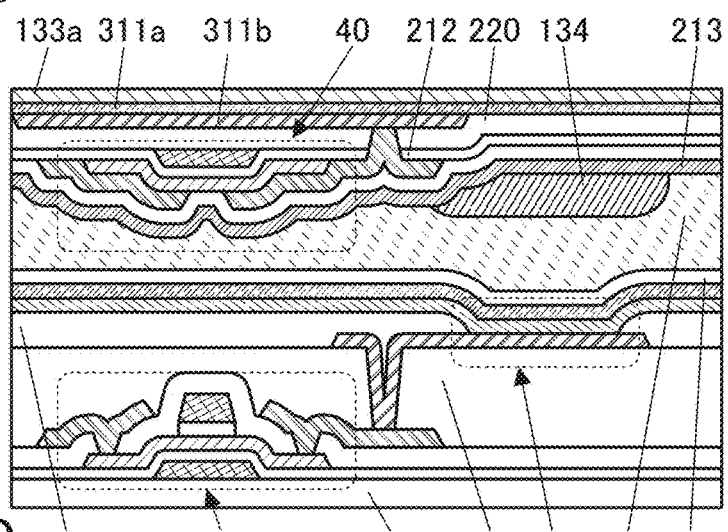

Subsequently, the alignment film 133a is formed on the exposed surface of the electrode 311a (or the insulating film) (FIG. 33B).

Figure 33C:
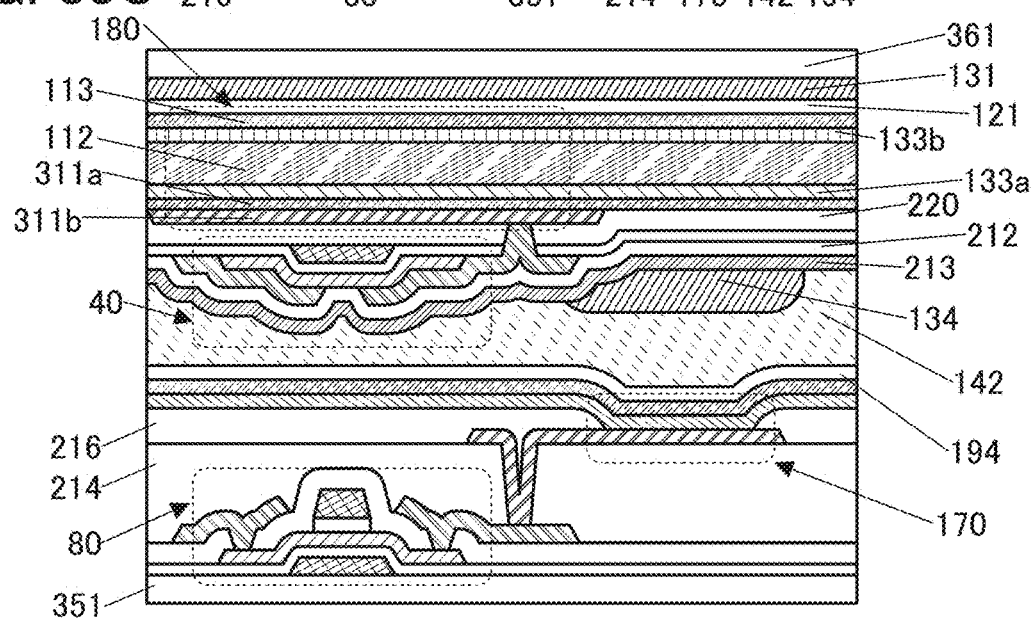

Then, the substrate 361 obtained from the step described using FIG. 31A and the substrate 351 obtained from the steps up to the step illustrated in FIG. 33B are bonded to each other with the liquid crystal layer 112 provided therebetween (FIG. 33C). Although not illustrated in FIG. 33C, the substrate 351 and the substrate 361 are bonded to each other with a bonding layer.

In the liquid crystal element 180 illustrated in FIG. 33C, the electrode 311a (and the electrode 311b) part of which functions as the pixel electrode, the liquid crystal layer 112, and the electrode 113 part of which functions as the common electrode are stacked. The liquid crystal element 180 is formed so as to overlap with the coloring layer 131.

Through the above process, the display device 300B can be manufactured.

The display device of this embodiment includes two types of display elements as described above; thus, switching between a plurality of display modes is possible. Accordingly, the display device can have high visibility regardless of the ambient brightness, leading to high convenience.

With the use of the method described in Embodiment 1, the first resin layer 23a can be separated from the formation substrate 14 without laser irradiation performed on the entire area of the first resin layer 23a. Consequently, the display device can be manufactured at low costs. In addition, separation of the first resin layer 23a from the formation substrate 14 at an unintended time can be avoided. Since the timing of separation can be controlled and high separability can be achieved, the yield of the separation process and the manufacturing process of a display device can be increased.

This embodiment can be combined with any of other embodiments as appropriate.

(Embodiment 4)

In this embodiment, more specific structure examples of the display device described in Embodiment 3 will be described with reference to FIGS. 34A, 34B1, 34B2, 34B3, and 34B4, FIG. 35, and FIGS. 36A and 36B.

Figure 34A:
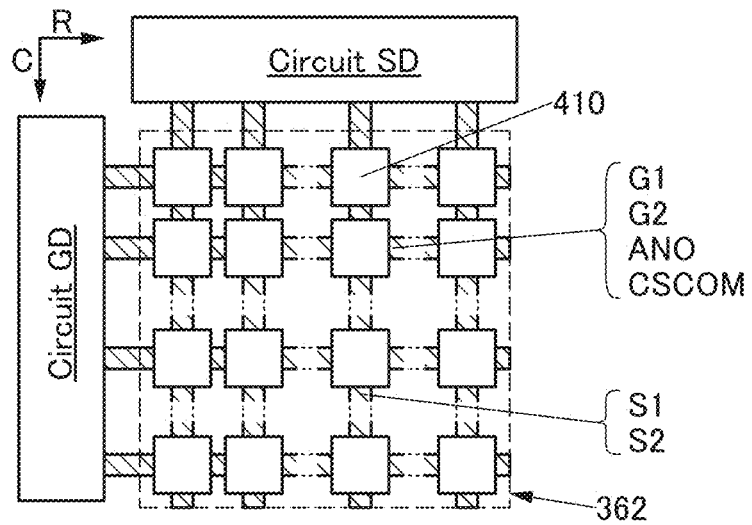
FIG. 34A illustrates an example of a display device, and FIGS. 34B1, 34B2, 34B3, and 34B4 each illustrate an example of a pixel.
Figure 34A:
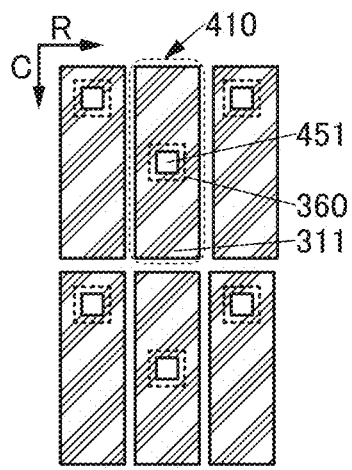
Figure 34A:
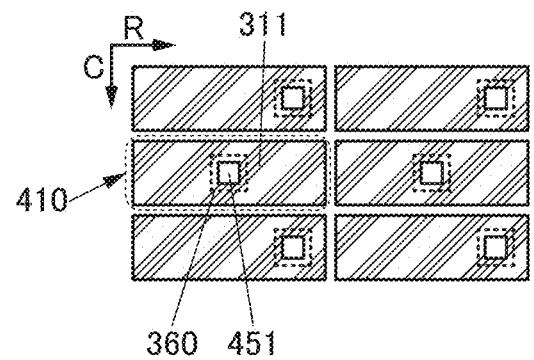
Figure 34A:
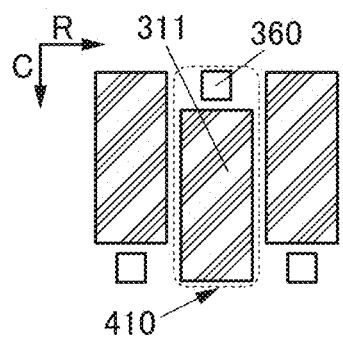
Figure 34A:
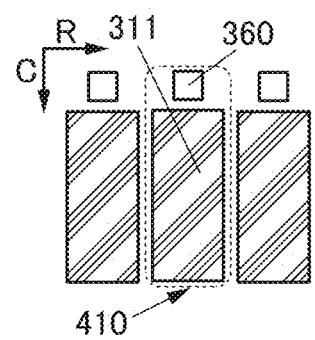

FIG. 34A is a block diagram of a display device 400. The display device 400 includes the display portion 362, a circuit GD, and a circuit SD. The display portion 362 includes a plurality of pixels 410 arranged in a matrix.

The display device 400 includes a plurality of wirings G1, a plurality of wirings G2, a plurality of wirings ANO, a plurality of wirings CSCOM, a plurality of wirings S1, and a plurality of wirings S2. The plurality of wirings G1, the plurality of wirings G2, the plurality of wirings ANO, and the plurality of wirings CSCOM are each electrically connected to the circuit GD and the plurality of pixels 410 arranged in a direction indicated by an arrow R. The plurality of wirings S1 and the plurality of wirings S2 are each electrically connected to the circuit SD and the plurality of pixels 410 arranged in a direction indicated by an arrow C.

Although the structure including one circuit GD and one circuit SD is illustrated here for simplicity, the circuit GD and the circuit SD for driving liquid crystal elements and the circuit GD and the circuit SD for driving light-emitting elements may be provided separately.

The pixels 410 each include a reflective liquid crystal element and a light-emitting element.

FIGS. 34B1, 34B2, 34B3, and 34B4 illustrate structure examples of the electrode 311 included in the pixel 410. The electrode 311 serves as a reflective electrode of the liquid crystal element. The opening 451 is provided in the electrode 311 in FIGS. 34B1 and 34B2.

In FIGS. 34B1 and 34B2, a light-emitting element 360 positioned in a region overlapping with the electrode 311 is indicated by a broken line. The light-emitting element 360 overlaps with the opening 451 included in the electrode 311. Thus, light from the light-emitting element 360 is emitted to the display surface side through the opening 451.

In FIG. 34B1, the pixels 410 which are adjacent in the direction indicated by the arrow R are pixels emitting light of different colors. As illustrated in FIG. 34B1, the openings 451 are preferably provided in different positions in the electrodes 311 so as not to be aligned in two adjacent pixels provided in the direction indicated by the arrow R. This allows two light-emitting elements 360 to be apart from each other, thereby preventing light emitted from the light-emitting element 360 from entering a coloring layer in the adjacent pixel 410 (such a phenomenon is referred to as crosstalk). Furthermore, since two adjacent light-emitting elements 360 can be arranged apart from each other, a high-resolution display device is achieved even when EL layers of the light-emitting elements 360 are separately formed with a blocking mask or the like.

In FIG. 34B2, the pixels 410 which are adjacent in a direction indicated by the arrow C are pixels emitting light of different colors. Also in FIG. 34B2, the openings 451 are preferably provided in different positions in the electrodes 311 so as not to be aligned in two adjacent pixels provided in the direction indicated by the arrow C.

The lower the ratio of the total area of the opening 451 to the total area except for the opening is, the brighter an image displayed using the liquid crystal element can be. Furthermore, the higher the ratio of the total area of the opening 451 to the total area except for the opening is, the brighter an image displayed using the light-emitting element 360 can be.

The opening 451 may have a polygonal shape, a quadrangular shape, an elliptical shape, a circular shape, a cross-like shape, a stripe shape, a slit-like shape, or a checkered pattern, for example. The opening 451 may be provided close to the adjacent pixel. Preferably, the opening 451 is provided close to another pixel emitting light of the same color, in which case crosstalk can be suppressed.

As illustrated in FIGS. 34B3 and 34B4, a light-emitting region of the light-emitting element 360 may be positioned in a region where the electrode 311 is not provided, in which case light emitted from the light-emitting element 360 is emitted to the display surface side.

In FIG. 34B3, the light-emitting elements 360 are not aligned in two adjacent pixels 410 provided in the direction indicated by the arrow R. In FIG. 34B4, the light-emitting elements 360 are aligned in two adjacent pixels 410 provided in the direction indicated by the arrow R.

The structure illustrated in FIG. 34B3 can, as mentioned above, prevent crosstalk and increase the resolution because the light-emitting elements 360 included in two adjacent pixels 410 can be apart from each other. The structure illustrated in FIG. 34B4 can prevent light emitted from the light-emitting element 360 from being blocked by the electrode 311 because the electrode 311 is not positioned along a side of the light-emitting element 360 which is parallel to the direction indicated by the arrow C. Thus, high viewing angle characteristics can be achieved.

As the circuit GD, any of a variety of sequential circuits such as a shift register can be used. In the circuit GD, a transistor, a capacitor, and the like can be used. A transistor included in the circuit GD can be formed in the same steps as the transistors included in the pixels 410.

The circuit SD is electrically connected to the wirings S1. For example, an integrated circuit can be used as the circuit SD. Specifically, an integrated circuit formed on a silicon substrate can be used as the circuit SD.

For example, a COG method, a COF method, or the like can be used to mount the circuit SD on a pad electrically connected to the pixels 410. Specifically, an anisotropic conductive film can be used to mount an integrated circuit on the pad.

Figure 35:
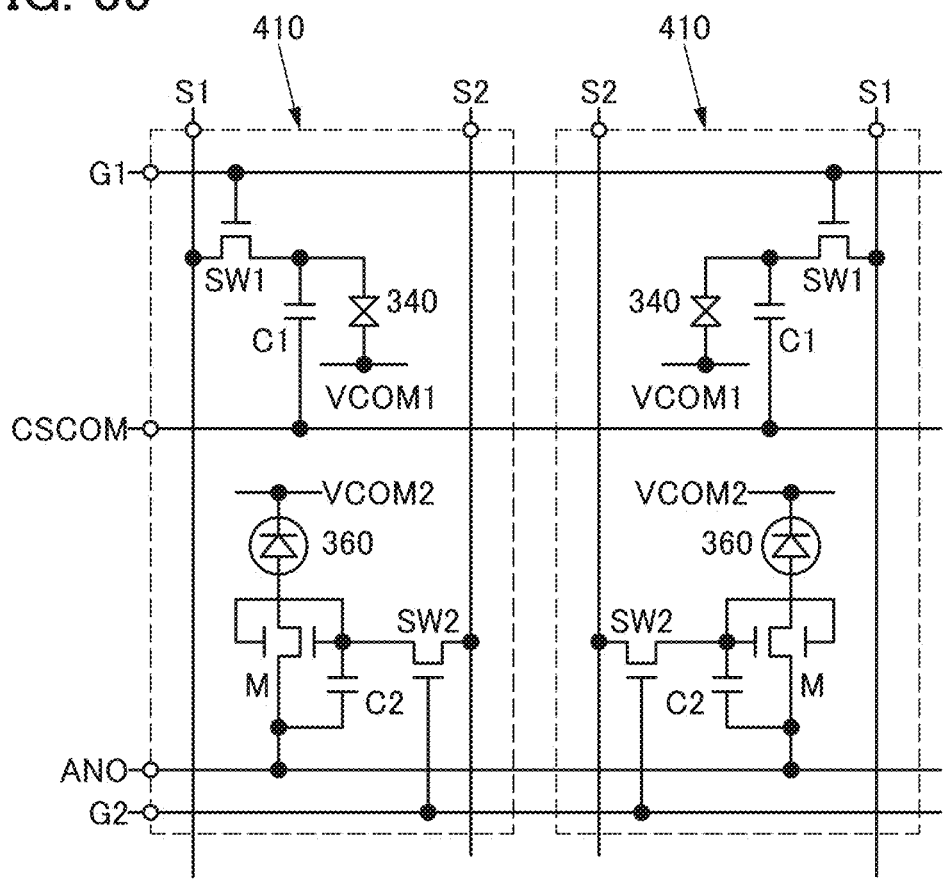
FIG. 35 is a circuit diagram illustrating an example of a pixel circuit in a display device.

FIG. 35 is an example of a circuit diagram of the pixels 410. FIG. 35 illustrates two adjacent pixels 410.

The pixels 410 each include a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 35 illustrates a wiring VCOM1 electrically connected to the liquid crystal element 340 and a wiring VCOM2 electrically connected to the light-emitting element 360.

FIG. 35 illustrates an example in which a transistor is used as each of the switches SW1 and SW2.

A gate of the switch SW1 is connected to the wiring G1. One of a source and a drain of the switch SW1 is connected to the wiring S1, and the other is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other is connected to one electrode of the capacitor C2 and gates of the transistor M. The other electrode of the capacitor C2 is connected to one of a source and a drain of the transistor M and the wiring ANO. The other of the source and the drain of the transistor M is connected to one electrode of the light-emitting element 360. Furthermore, the other electrode of the light-emitting element 360 is connected to the wiring VCOM2.

FIG. 35 illustrates an example where the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of liquid crystals of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 35, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Figure 36A:
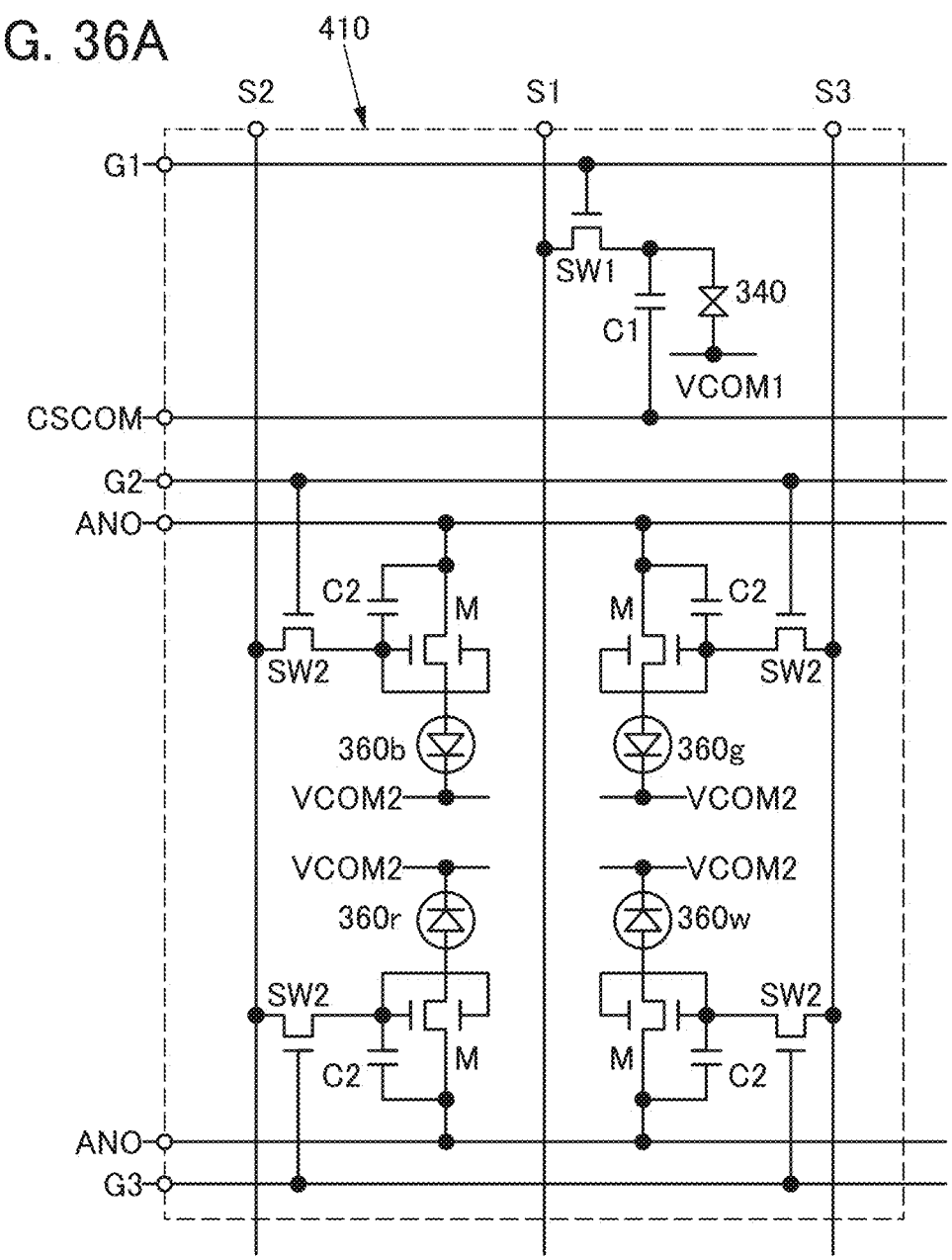
FIG. 36A is a circuit diagram illustrating an example of a pixel circuit of a display device.

Although FIG. 35 illustrates an example in which one liquid crystal element 340 and one light-emitting element 360 are provided in one pixel 410, one embodiment of the present invention is not limited thereto. FIG. 36A illustrates an example in which one liquid crystal element 340 and four light-emitting elements 360 (light-emitting elements 360r, 360g, 360b, and 360w) are provided in one pixel 410. The pixel 410 illustrated in FIG. 36A differs from that in FIG. 35 in being capable of displaying a full-color image with the use of the light-emitting elements by one pixel.

In FIG. 36A, in addition to the wirings in FIG. 35, a wiring G3 and a wiring S3 are connected to the pixel 410.

In the example in FIG. 36A, light-emitting elements emitting red light (R), green light (G), blue light (B), and white light (W) can be used as the four light-emitting elements 360, for example. Furthermore, as the liquid crystal element 340, a reflective liquid crystal element emitting white light can be used. Thus, in the case of displaying an image in the reflective mode, a white image can be displayed with high reflectivity. In the case of displaying an image in the transmissive mode, an image can be displayed with a higher color rendering property at low power consumption.

Figure 36B:
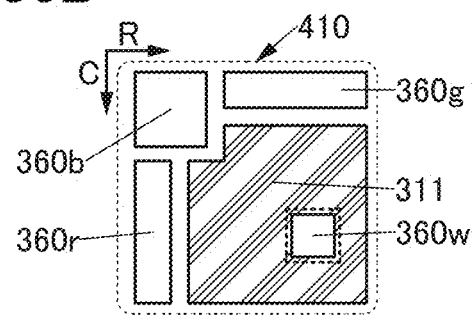
FIG. 36B illustrates an example of a pixel.

FIG. 36B illustrates a structure example of the pixel 410 corresponding to FIG. 36A. The pixel 410 includes the light-emitting element 360w overlapping with the opening included in the electrode 311 and the light-emitting element 360r, the light-emitting element 360g, and the light-emitting element 360b which are arranged in the periphery of the electrode 311. It is preferable that the light-emitting elements 360r, 360g, and 360b have almost the same light-emitting area.

This embodiment can be combined with any other embodiment as appropriate.

(Embodiment 5)

In this embodiment, a display module and electronic devices of embodiments of the present invention are described.

Figure 37:
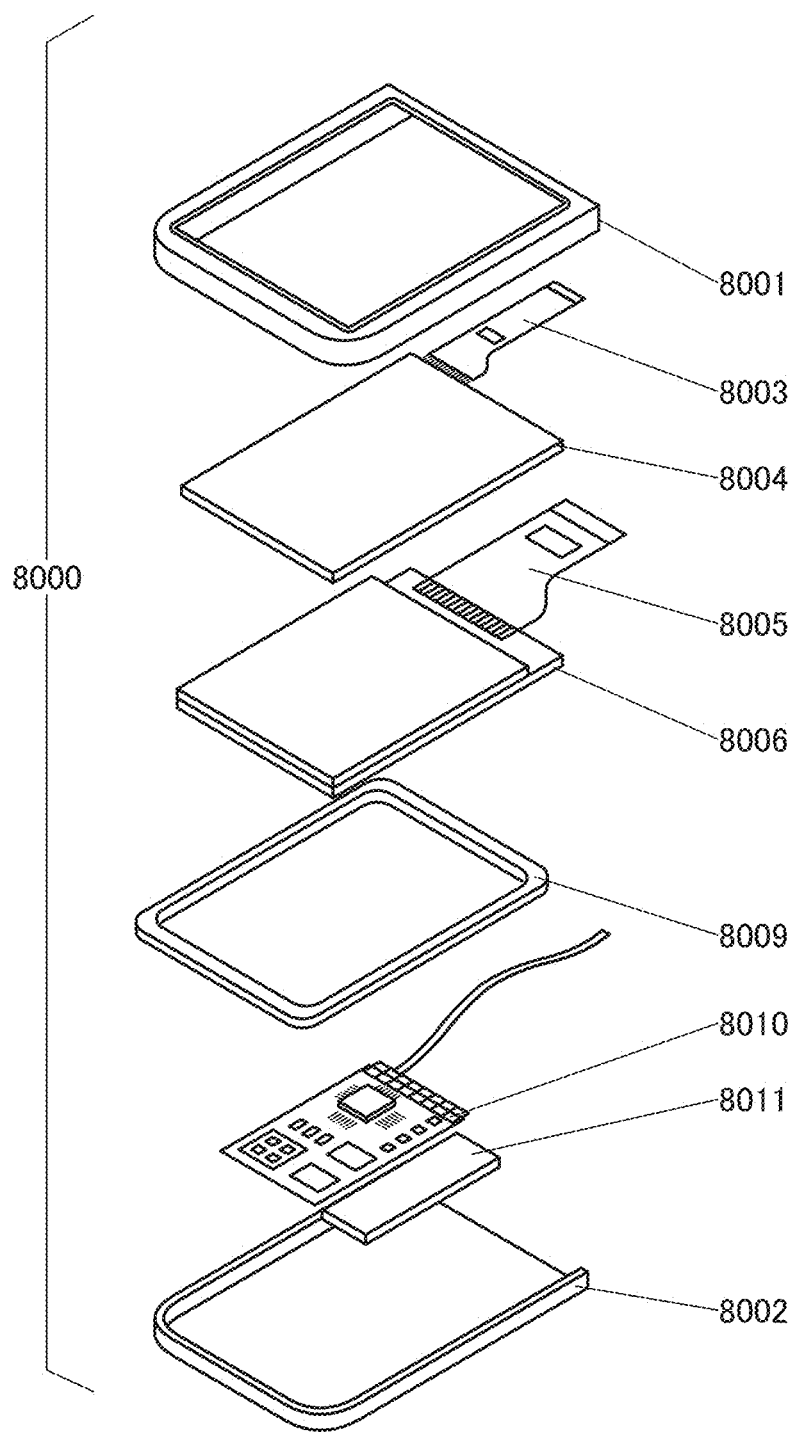
FIG. 37 illustrates an example of a display module.

In a display module 8000 in FIG. 37, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device fabricated using the separation method of one embodiment of the present invention can be used for, for example, the display panel 8006. Thus, the display module can be manufactured with high yield.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. Instead of providing the touch panel 8004, the display panel 8006 may have a touch panel function.

The frame 8009 protects the display panel 8006 and functions as an electromagnetic shield for blocking electromagnetic waves generated by the operation of the printed circuit board 8010. The frame 8009 can also function as a radiator plate.

The printed circuit board 8010 includes a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 may be additionally provided with a member such as a polarizing plate, a retardation plate, or a prism sheet.

According to one embodiment of the present invention, highly reliable electronic devices having curved surfaces can be manufactured. According to one embodiment of the present invention, flexible and highly reliable electronic devices can be manufactured.

Examples of the electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The display device of one embodiment of the present invention can achieve high visibility regardless of the intensity of external light. Thus, the display device of one embodiment of the present invention can be suitably used for a portable electronic device, a wearable electronic device (wearable device), an e-book reader, or the like.

Figure 38A:
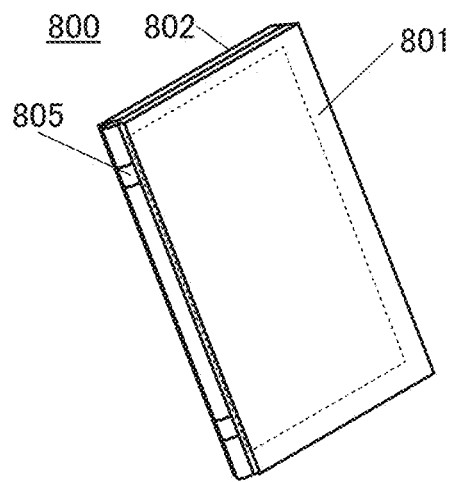
FIGS. 38A to 38D illustrate examples of electronic devices.
Figure 38B:
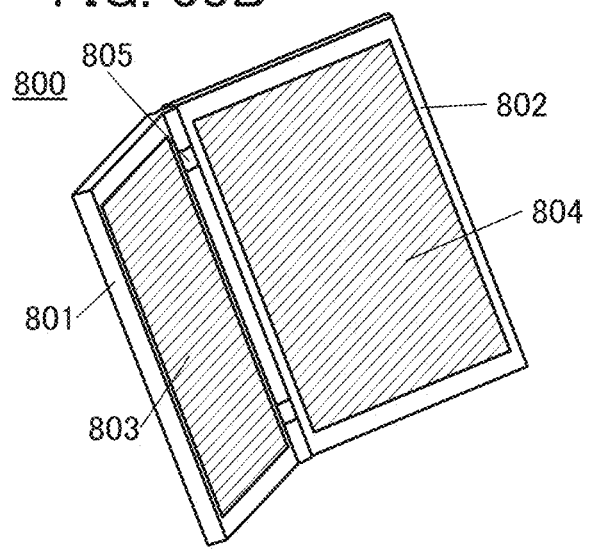

A portable information terminal 800 illustrated in FIGS. 38A and 38B includes a housing 801, a housing 802, a display portion 803, a display portion 804, a hinge portion 805, and the like.

The housing 801 and the housing 802 are joined together with the hinge portion 805. The portable information terminal 800 can be opened as illustrated in FIG. 38B from a closed state (FIG. 38A).

The display device manufactured using the separation method of one embodiment of the present invention can be used for at least one of the display portion 803 and the display portion 804. Thus, the portable information terminal can be manufactured with high yield.

The display portion 803 and the display portion 804 can each display at least one of a text, a still image, a moving image, and the like. When a text is displayed on the display portion, the portable information terminal 800 can be used as an e-book reader.

Since the portable information terminal 800 is foldable, the portable information terminal 800 has high portability and excellent versatility.

A power button, an operation button, an external connection port, a speaker, a microphone, or the like may be provided for the housing 801 and the housing 802.

Figure 38C:
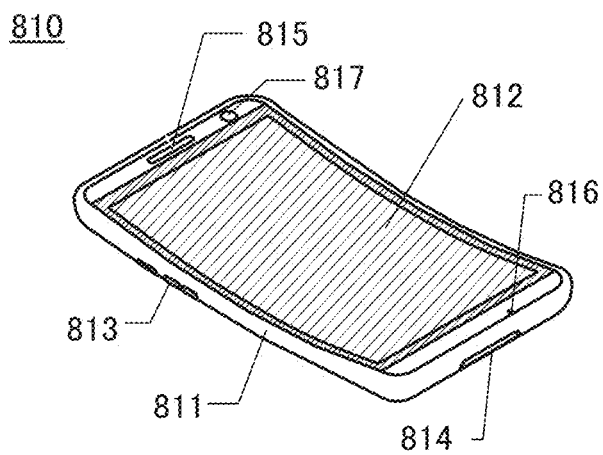

A portable information terminal 810 illustrated in FIG. 38C includes a housing 811, a display portion 812, an operation button 813, an external connection port 814, a speaker 815, a microphone 816, a camera 817, and the like.

The display device manufactured using the separation method of one embodiment of the present invention can be used for the display portion 812. Thus, the portable information terminal can be manufactured with high yield.

The portable information terminal 810 includes a touch sensor in the display portion 812. Operations such as making a call and inputting a character can be performed by touch on the display portion 812 with a finger, a stylus, or the like.

With the operation button 813, the power can be turned on or off. In addition, types of images displayed on the display portion 812 can be switched; for example, switching an image from a mail creation screen to a main menu screen is performed with the operation button 813.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically). Furthermore, the direction of display on the screen can be changed by touch on the display portion 812, operation with the operation button 813, sound input using the microphone 816, or the like.

The portable information terminal 810 functions as, for example, one or more of a telephone set, a notebook, and an information browsing system. Specifically, the portable information terminal 810 can be used as a smartphone. The portable information terminal 810 is capable of executing a variety of applications such as mobile phone calls, e-mailing, viewing and editing texts, music reproduction, reproducing a moving image, Internet communication, and computer games, for example.

Figure 38D:
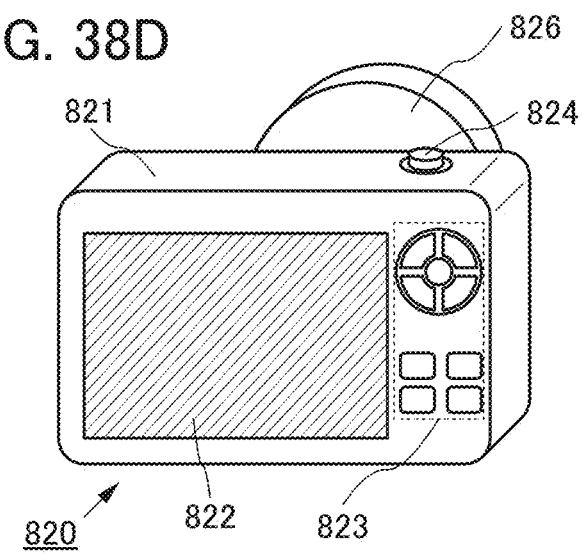

A camera 820 illustrated in FIG. 38D includes a housing 821, a display portion 822, operation buttons 823, a shutter button 824, and the like. Furthermore, an attachable lens 826 is attached to the camera 820.

The display device manufactured using the separation method of one embodiment of the present invention can be used for the display portion 822. Thus, the camera can be manufactured with high yield.

Although the lens 826 of the camera 820 here is detachable from the housing 821 for replacement, the lens 826 may be incorporated into the housing 821.

A still image or a moving image can be taken with the camera 820 at the press of the shutter button 824. In addition, images can also be taken by the touch of the display portion 822 which has a function of a touch panel.

Note that a stroboscope, a viewfinder, or the like can be additionally attached to the camera 820. Alternatively, these may be incorporated into the housing 821.

FIGS. 39A to 39E illustrate electronic devices. These electronic devices each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The display device manufactured using the separation method of one embodiment of the present invention can be favorably used for the display portion 9001. Thus, the electronic devices can be manufactured with high yield.

The electronic devices illustrated in FIGS. 39A to 39E can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that the functions of the electronic devices illustrated in FIGS. 39A to 39E are not limited to the above, and the electronic devices may have other functions.

Figure 39A:
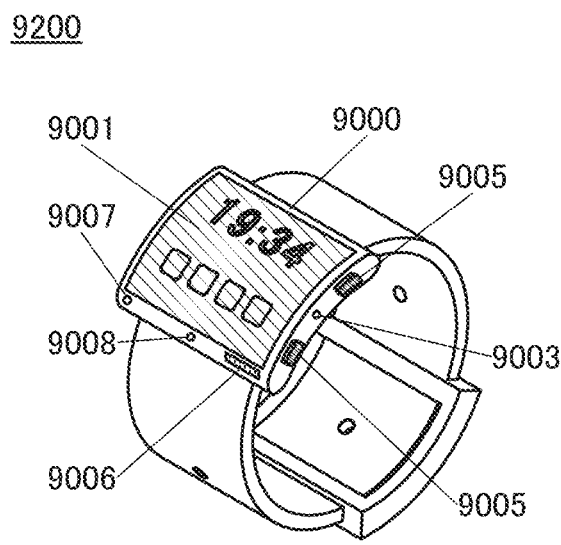
FIGS. 39A to 39E illustrate examples of electronic devices.
Figure 39B:
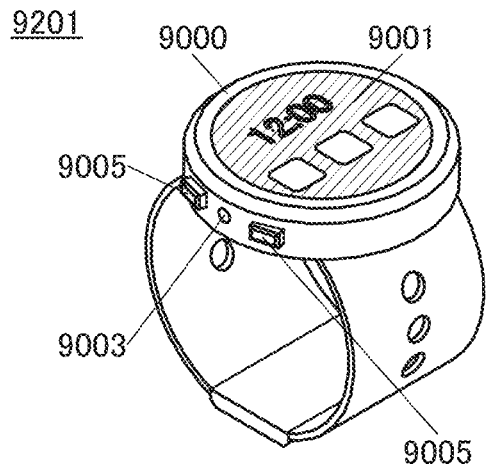

FIG. 39A is a perspective view of a watch-type portable information terminal 9200. FIG. 39B is a perspective view of a watch-type portable information terminal 9201.

The portable information terminal 9200 illustrated in FIG. 39A is capable of executing a variety of applications such as mobile phone calls, e-mailing, viewing and editing texts, music reproduction, Internet communication, and computer games. The display surface of the display portion 9001 is bent, and an image can be displayed on the bent display surface. The portable information terminal 9200 can employ near field communication conformable to a communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

Unlike in the portable information terminal illustrated in FIG. 39A, the display surface of the display portion 9001 is not curved in the portable information terminal 9201 illustrated in FIG. 39B. Furthermore, the external state of the display portion of the portable information terminal 9201 is a non-rectangular shape (a circular shape in FIG. 39B).

Figure 39C:
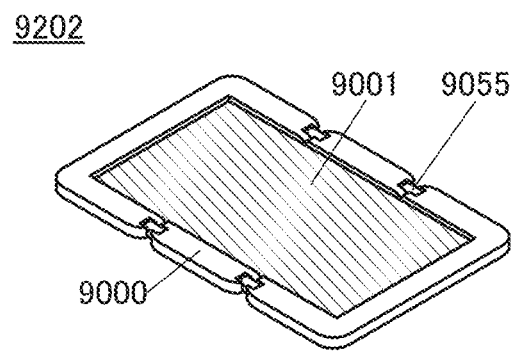
Figure 39D:
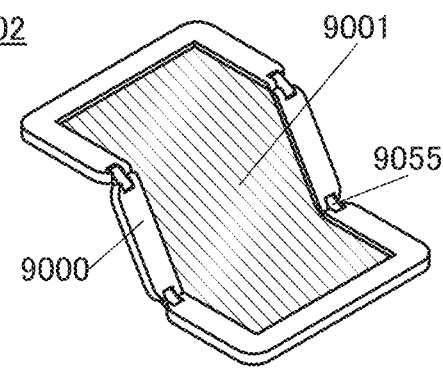
Figure 39E:
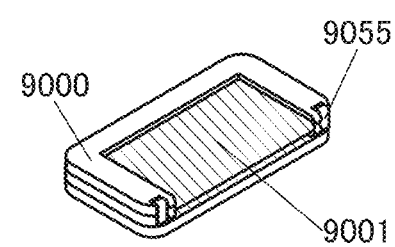

FIGS. 39C to 39E are perspective views of a foldable portable information terminal 9202. FIG. 39C is a perspective view illustrating the portable information terminal 9202 that is opened. FIG. 39D is a perspective view illustrating the portable information terminal 9202 that is being opened or being folded. FIG. 39E is a perspective view illustrating the portable information terminal 9202 that is folded.

The folded portable information terminal 9202 is highly portable, and the opened portable information terminal 9202 is highly browsable due to a seamless large display region. The display portion 9001 of the portable information terminal 9202 is supported by three housings 9000 joined together by hinges 9055. By folding the portable information terminal 9202 at a connection portion between two housings 9000 with the hinges 9055, the portable information terminal 9202 can be reversibly changed in shape from opened to folded. For example, the portable information terminal 9202 can be bent with a radius of curvature of greater than or equal to 1 mm and less than or equal to 150 mm.

This embodiment can be combined with any other embodiment as appropriate.

EXAMPLE 1

In this example, the effect that the baking conditions used to form a resin layer over a formation substrate have on the separability of the resin layer was evaluated.

<1. Baking Atmosphere>

First, two samples fabricated in different baking atmospheres for forming a resin layer were compared.

As a formation substrate of each sample, an approximately 0.7-mm-thick glass substrate was used. As a resin layer, a polyimide resin film was formed over the formation substrate of each sample. The polyimide resin film was formed using a photosensitive material including a polyimide resin precursor. The thickness of the polyimide resin film at application of the material was approximately 2.0 μm. The thickness of the polyimide resin film after being subjected to baking was approximately 1.5 μm.

A sample 1A was subjected to baking at 450° C. for one hour while supplying a mixed gas of a nitrogen gas and an oxygen gas (oxygen concentration of 20%) with a flow rate of 580 NL/min.

A sample 1B was subjected to baking at 450° C. for one hour while supplying a nitrogen gas with a flow rate of 600 NL/min. The oxygen concentration in the apparatus during the baking was approximately 0.01% to 0.02%.

Then, a UV separation tape was attached to each of the resin layers and was pulled by a hand to be separated from the formation substrate.

Figure 40A:
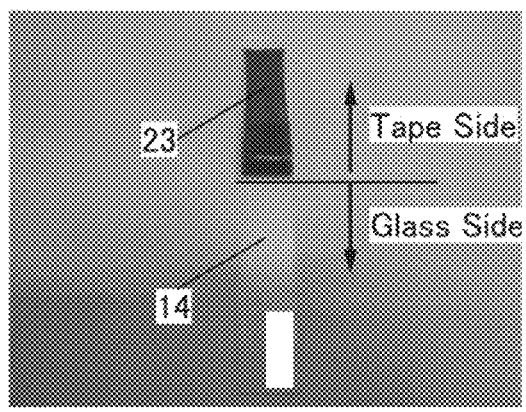
FIGS. 40A and 40B are external photographs showing the separation results of Example 1.
Figure 40B:
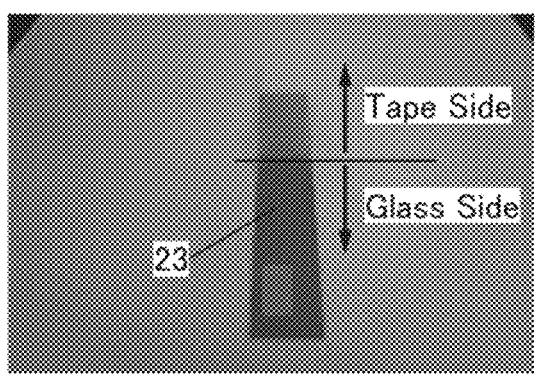

FIG. 40A shows the results of separation of the sample 1A. FIG. 40B shows separation results of the sample 1B. In each of the photographs, the portion above a solid line is the tape side and the portion below the solid line is the glass side.

As shown in FIG. 40A, in the sample 1A, the resin layer 23 remained on the tape side, which allowed separation to occur at an interface between the formation substrate 14 and the resin layer 23.

As shown in FIG. 40B, in the sample 1B, the resin layer 23 remained on the formation substrate 14 side after separation, which did not allow separation to occur at the interface between the formation substrate 14 and the resin layer 23.

The sample 1A and the sample 1B are different from each other in a baking atmosphere for forming the resin layer 23. Thus, it is considered that the resin layer 23 can be easily separated from the formation substrate 14 when the resin layer 23 is formed through baking in an atmosphere containing a sufficient amount of oxygen. It is considered that unintentional separation of the resin layer 23 from the formation substrate 14 can be avoided by forming the resin layer 23 through baking in an atmosphere containing small amount of oxygen.

<2. Baking Temperature and Thickness of Resin Layer>

Next, nine samples were compared. Resin layers of the nine samples were formed at different baking temperatures and have different thicknesses.

As the formation substrate of each sample, an approximately 0.7-mm-thick glass substrate was used. As the resin layer, a polyimide resin film was formed over the formation substrate of each sample. The polyimide resin film was formed using a photosensitive material including a polyimide resin precursor. After the material was applied, the resin layer was formed through baking for one hour while supplying a mixed gas of nitrogen gas and oxygen gas (oxygen concentration of 20%) with a flow rate of 580 NL/min.

Table 1 shows baking temperatures and the thicknesses of the resin layers at application of the material of each of the samples. For example, in Table 1, the thickness of 2.0 μm means that the material of the resin layer (the material containing a polyimide resin precursor) was applied to have a thickness of 2.0 μm. Note that the thickness of the resin layer after baking was less than 2.0 μm.

TABLE 1

| | | Baking temperature of resin layer | | |
| --- | --- | --- | --- | --- |
| | | 350° C. | 400° C. | 450° C. |
| Thickness of resin layer (at application) | 2.0 μm | Sample 1C | Sample 1D | Sample 1E |
| | 1.0 μm | Sample 1F | Sample 1G | Sample 1H |
| | 0.2 μm | Sample 1I | Sample 1J | Sample 1K |

Next, the resin layer and a film were attached to each other with an adhesive layer.

As the adhesive layer, an approximately 5-μm-thick thermosetting epoxy resin was used. The film has a stacked-layer structure including an approximately 23-μm-thick film and an approximately 100-μm-thick protective film.

Next, a cutter was inserted from the film side into a portion located inward from an end portion of the resin layer to make a cut in a frame-like shape. Then, the film was pulled by a hand to be separated from the formation substrate.

Table 2 shows the results of separation of the samples. The samples in which separation occurred at the interface between the formation substrate and the resin layer are indicated by circles. The samples in which separation did not occur at the interface between the formation substrate and the resin layer are indicated by crosses.

TABLE 2

| | | Baking temperature of resin layer | | |
| --- | --- | --- | --- | --- |
| | | 350° C. | 400° C. | 450° C. |
| Thickness of resin layer (at application) | 2.0 μm | × | × | ○ |
| | 1.0 μm | × | × | ○ |
| | 0.2 μm | × | × | ○ |

Figure 41:
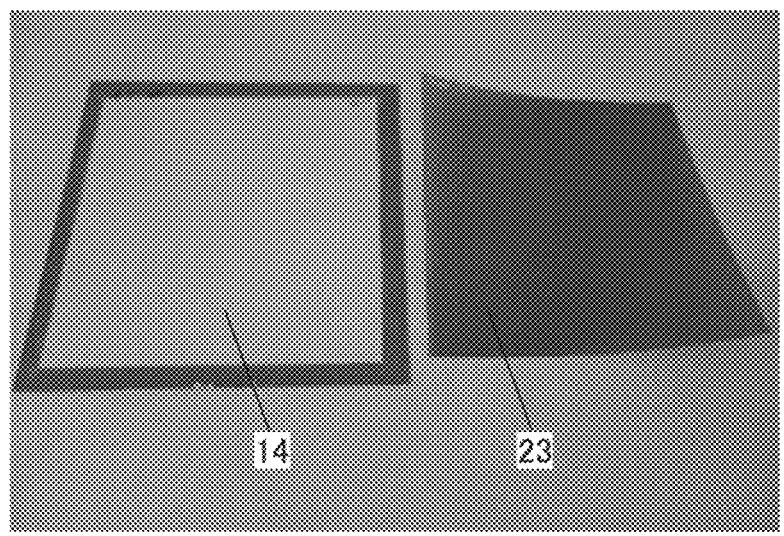
FIG. 41 is a photograph showing the appearances of separation results of Example 1.

FIG. 41 shows results of separation of the sample 1E (the thickness of the resin layer at application was 2.0 μm, and the baking temperature was 450° C.). In the portion inside the frame-like cut made by the cutter, the resin layer 23 was able to be separated from the formation substrate 14.

In this example, in any of the samples subjected to baking at 450° C., the resin layer was able to be separated from the formation substrate regardless of the thickness of the resin layer. In any of the samples subjected to baking at 350° C. or 400° C., the resin layer was not able to be separated from the formation substrate regardless of the thickness of the resin layer.

The above results indicate that baking performed in an atmosphere containing a sufficient amount of oxygen at a high temperature enables the resin layer to be easily separated from the formation substrate regardless of the thickness of the resin layer. The results also indicate that, even in an atmosphere containing a sufficient amount of oxygen, forming the resin layer through baking at a low temperature suppresses unintentional separation of the resin layer from the formation substrate.

EXAMPLE 2

In this example, results of separating a resin layer from a formation substrate by a separation method of one embodiment of the present invention will be described.

First, as shown in FIGS. 42A1 and 42A2, the island-shaped first resin layer 23a was formed over the formation substrate 14 by a photolithography method. Next, the second resin layer 23b was formed over the formation substrate 14 and the first resin layer 23a. The second resin layer 23b was formed to cover the first resin layer 23a. The formation substrate 14 includes a portion which is in contact with the first resin layer 23a and a portion which is in contact with the second resin layer 23b.

As the formation substrate 14, an approximately 0.7 mm thick 5-inch-square glass substrate was used.

A photosensitive material containing a polyimide resin precursor was applied, processed into an island shape, and subjected to baking at 450° C. for one hour while supplying a mixed gas of a nitrogen gas and an oxygen gas (oxygen concentration of 20%) with a flow rate of 580 NL/min, whereby the first resin layer 23a was formed. The thickness of the resin layer at application of the material was different between samples (see Table 3).

The photosensitive material containing a polyimide resin precursor was applied and subjected to baking at 450° C. for one hour in a mixed atmosphere of nitrogen and oxygen, whereby the second resin layer 23b was formed. The thickness of the layer to be a resin layer at application of the material was different between samples (see Table 3).

TABLE 3

| | | Thickness of the first resin layer 23a (at application) | | |
| --- | --- | --- | --- | --- |
| | | 2.0 μm | 1.0 μm | 0.2 μm |
| Thickness of the second resin layer 23b (at application) | 2.0 μm | Sample 2A | Sample 2C | Sample 2E |
| | 1.0 μm | Sample 2B | Sample 2D | Sample 2F |

Next, the second resin layer 23b and the film 27 were attached to each other using an adhesive layer 26 (see FIG. 42B).

As the adhesive layer, an approximately 5-μm-thick thermosetting epoxy resin was used. The film has a stacked-layer structure including an approximately 23-μm-thick film and an approximately 100-μm-thick protective film.

Next, an instrument 65 (here, a cutter) was inserted from the film 27 side into a portion located inward from an end portion of the first resin layer 23a to make a cut 64 in a frame-like shape (FIGS. 42C1 and 42C2). Then, the film 27 was pulled by a hand to be separated from the formation substrate 14 (FIG. 42D).

Figure 43:
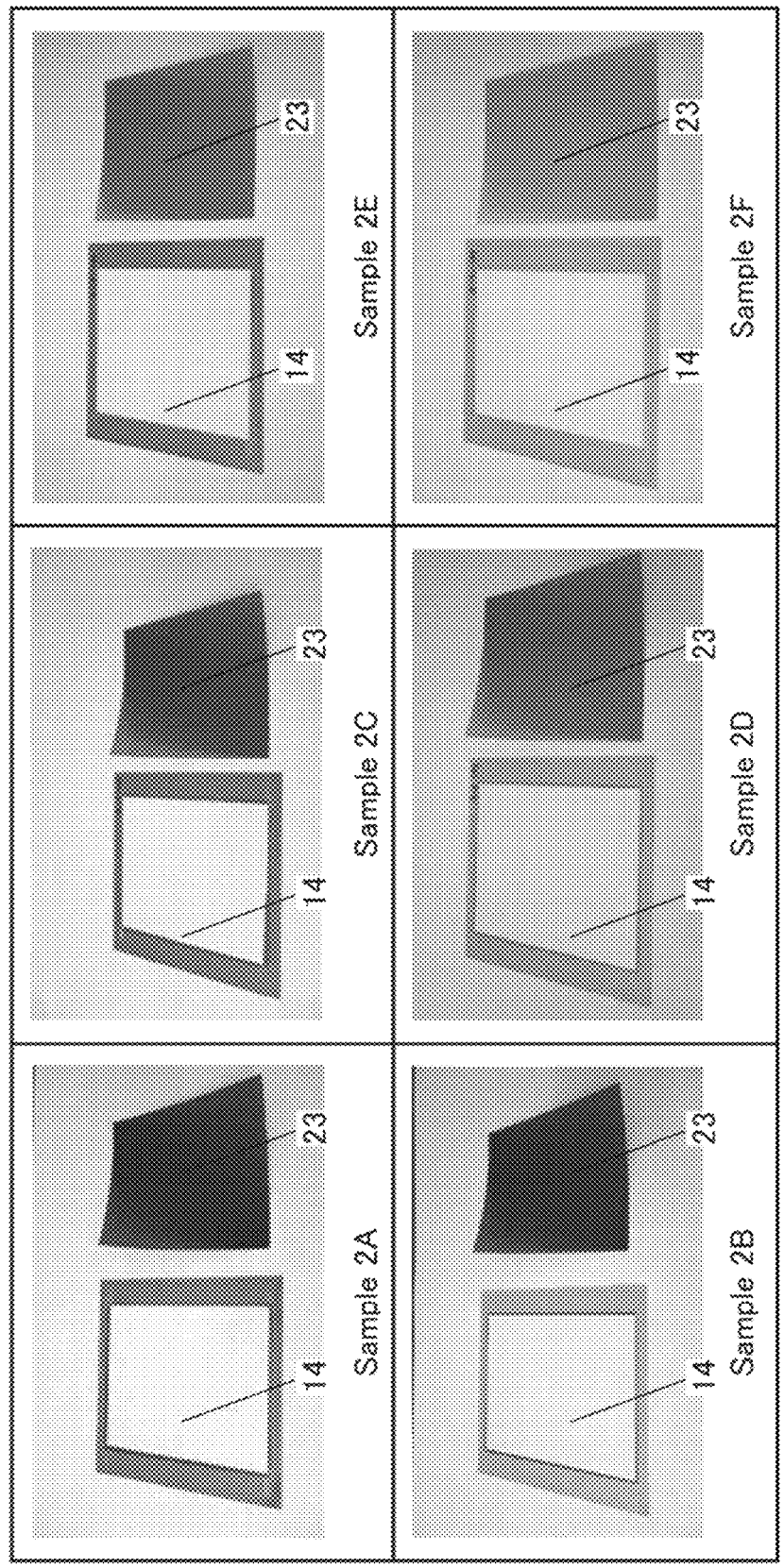
FIG. 43 is photographs showing the appearances of separation results of Example 2.

FIG. 43 shows external photographs each showing the sample after separation. In a portion of the resin layer 23 inside the cut 64, the resin layer 23 was able to be separated from the formation substrate 14 without the remaining film.

[Separation Test]

Figure 44A:
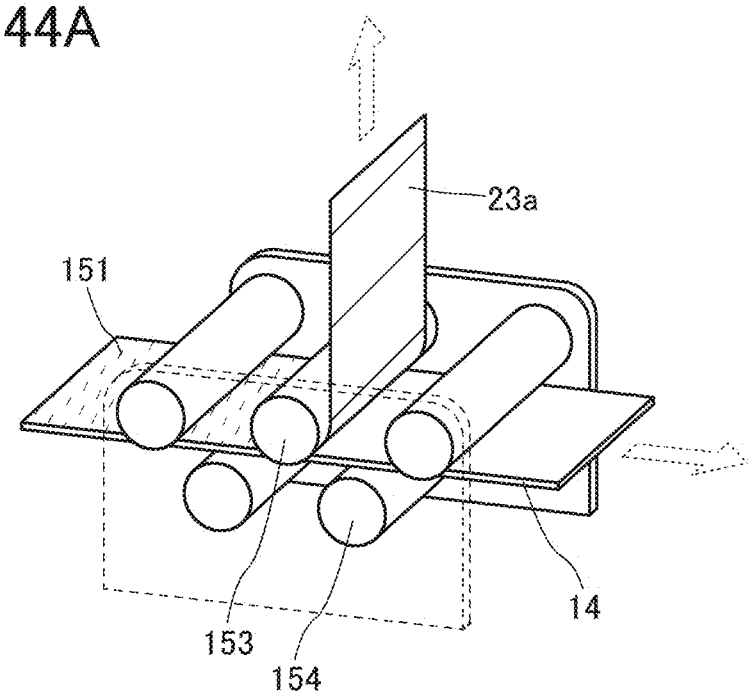
FIG. 44A is a perspective view illustrating a device which is used for measurement of force required for separation in Example 2 and FIG. 44B is a cross-sectional view illustrating a sample in Example 2.

The force required to separate the layer to be separated from the formation substrate 14 was measured in each of the samples of Example 1. A jig illustrated in FIG. 44A was used for the measurement. The jig illustrated in FIG. 44A includes a plurality of guide rollers 154 and a support roller 153. First, a tape 151 is attached onto a layer 150 to be separated that has been formed over the formation substrate 14, and an end portion of the tape 151 is partly separated in advance. Then, the formation substrate 14 is fixed to the jig so that the tape 151 is held by the support roller 153, and the tape 151 and the layer 150 to be separated are positioned perpendicular to the formation substrate 14. The force required for separating was measured as follows: the tape 151 was pulled at a rate of 20 mm/min in a direction perpendicular to the formation substrate 14 to separate the layer 150 to be separated from the formation substrate 14, and the pulling force in the perpendicular direction was measured. During the separation, the formation substrate 14 moves in the plane direction along the guide rollers 154 with the first resin layer 23a exposed. The support roller 153 and the guide rollers 154 are rotatable so that the formation substrate 14 and the layer 150 to be separated are not affected by friction during the move.

For the separation test, a compact table-top universal tester (EZ-TEST EZ-S-50N) manufactured by Shimadzu Corporation was used, and an adhesive tape/adhesive sheet testing method based on standard number JIS Z0237 of Japanese Industrial Standards (JIS) was employed. Each sample had a size of 126 mm×25 mm.

Figure 44B:
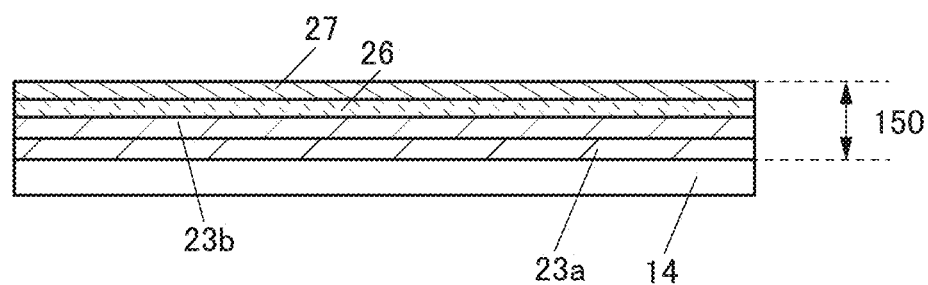

FIG. 44B shows the stacked-layer structure of the layer 150 to be separated.

The layer 150 to be separated includes the first resin layer 23a over the formation substrate 14, the second resin layer 23b over the first resin layer 23a, the adhesive layer 26 over the second resin layer 23b, and the film 27 over the adhesive layer 26. The thicknesses of the first resin layer 23a and the second resin layer 23b at application are different between samples, and the details are shown in Table 3.

Figure 45:
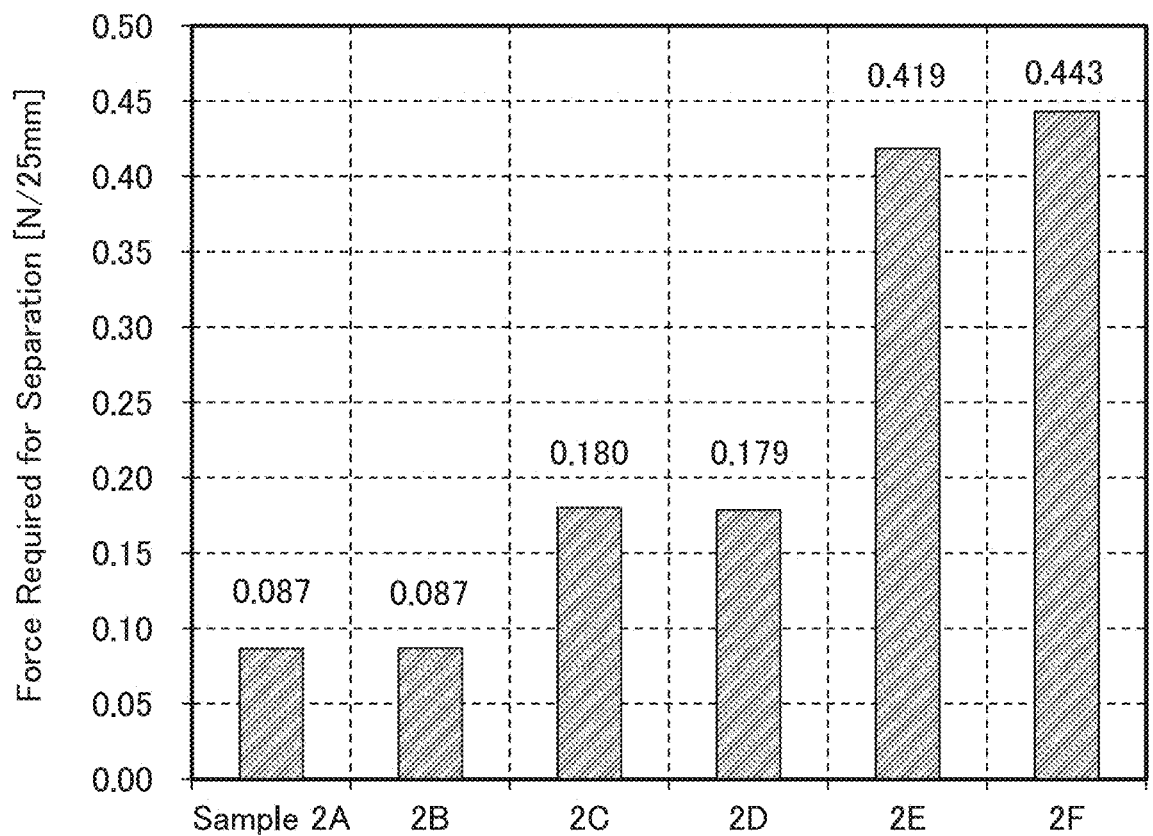
FIG. 45 shows measurement results of force required for separation in Example 2.

FIG. 45 shows results of the separation test. As shown in FIG. 45, the larger the thickness of the first resin layer 23a is, the smaller the force required for separation tends to be. The force required for separation does not change even when the thickness of the second resin layer 23b is changed.

FIGS. 46A to 46C, FIGS. 47A to 47C, and FIGS. 48A to 48C show cross-sectional STEM images of a sample 2A, a sample 2C, and a sample 2E before and after separation, respectively.

Figure 46A:
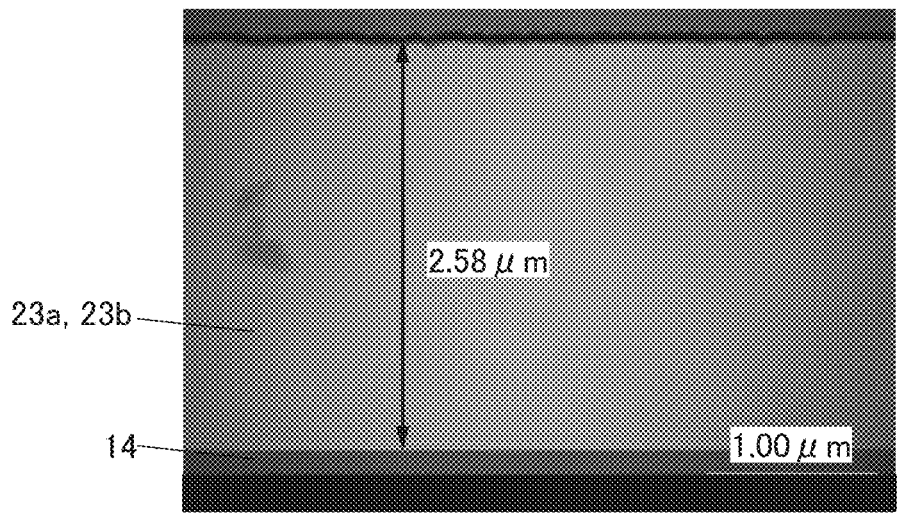
FIGS. 46A to 46C are each a cross-sectional STEM image of a sample 2A in Example 2.
Figure 47A:
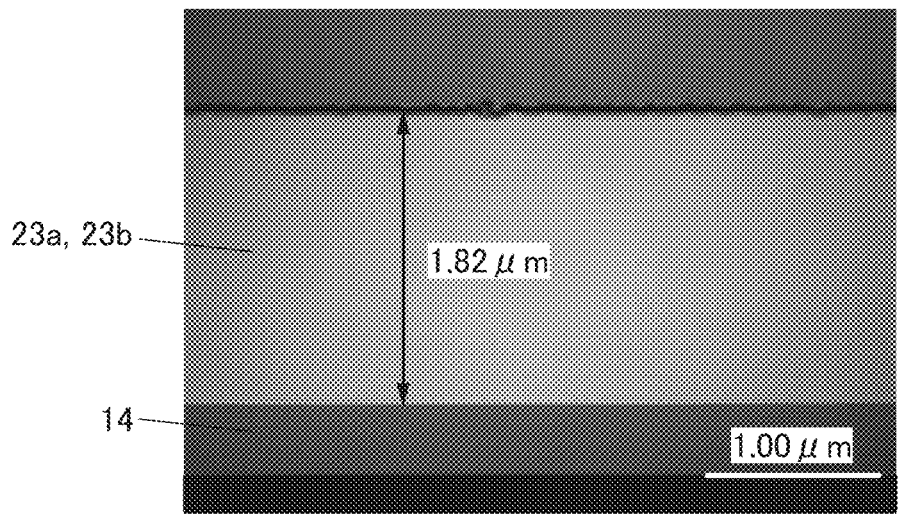
FIGS. 47A to 47C are each a cross-sectional STEM image of a sample 2C in Example 2.
Figure 48A:
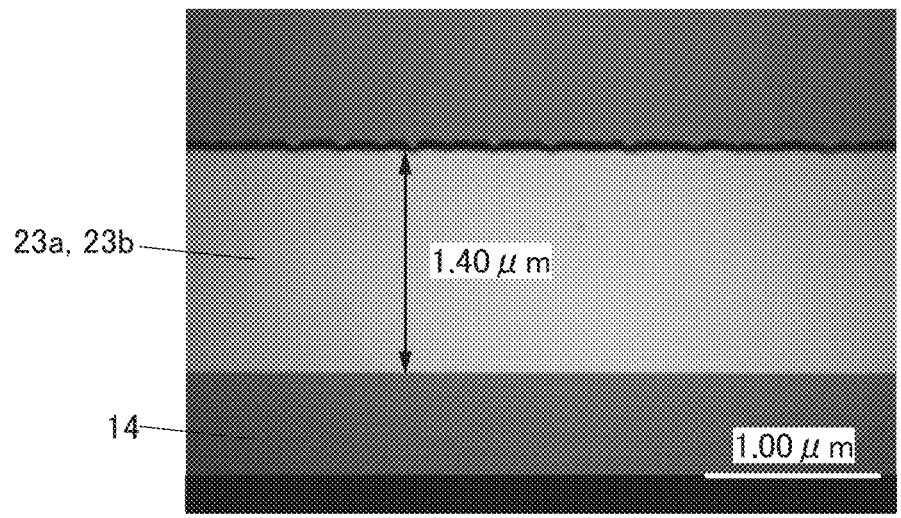
FIGS. 48A to 48C are each a cross-sectional STEM image of a sample 2E in Example 2.

FIG. 46A, FIG. 47A, and FIG. 48A show cross sectional STEM images of the sample 2A, the sample 2C, and the sample 2E, respectively. The images show the samples before separation.

As shown in FIG. 46A, in the sample 2A, the thickness of the stacked-layer structure including the first resin layer 23a and the second resin layer 23b is approximately 2.58 µm.

As shown in FIG. 47A, in the sample 2C, the thickness of the stacked-layer structure including the first resin layer 23a and the second resin layer 23b is approximately 1.82 µm.

As shown in FIG. 48A, in the sample 2E, the thickness of the stacked-layer structure including the first resin layer 23a and the second resin layer 23b is approximately 1.40 µm.

Figure 46B:
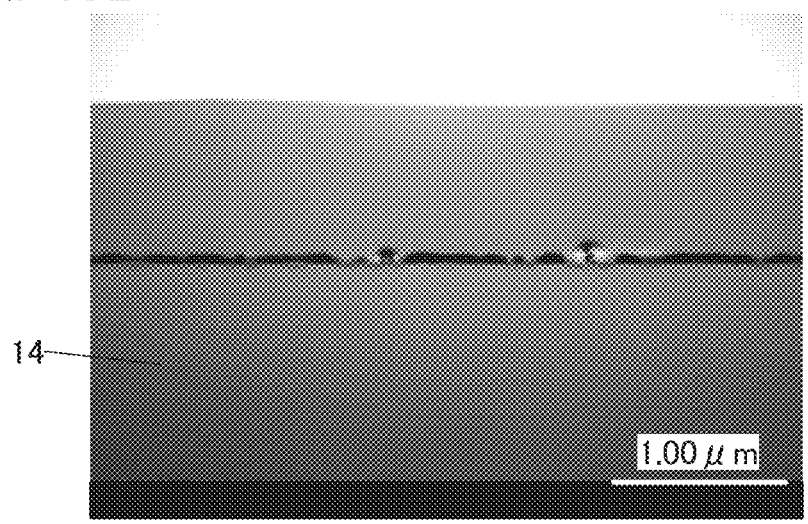
Figure 47B:
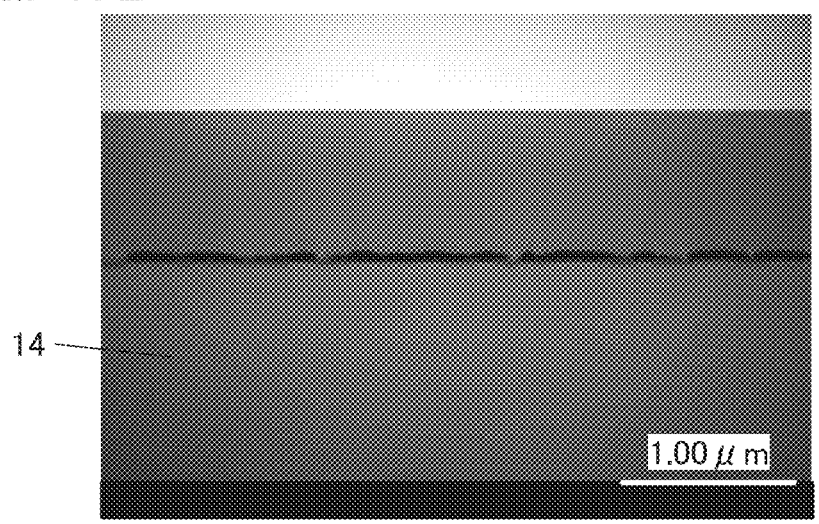
Figure 48B:
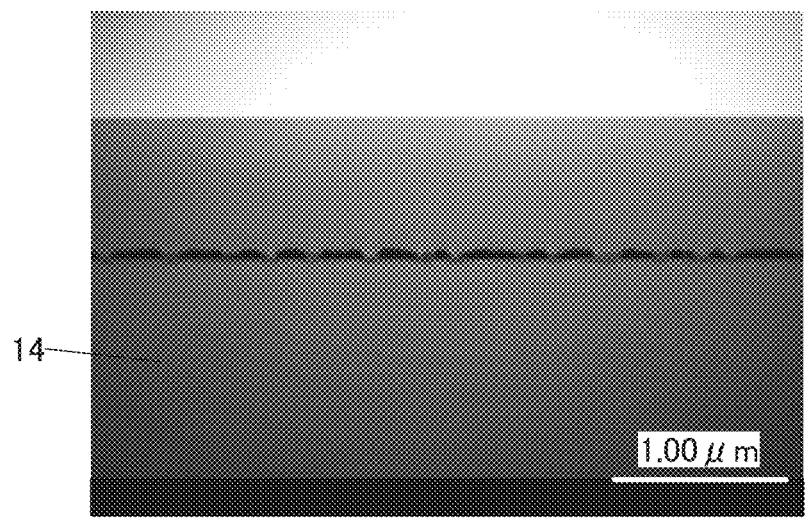

FIG. 46B, FIG. 47B, and FIG. 48B show cross-sectional STEM images of the sample 2A, the sample 2C, and the sample 2E, respectively, on the formation substrate 14 side. The images show samples after separation.

In each of the samples, the resin layer was not observed on a glass surface after separation.

Figure 46C:
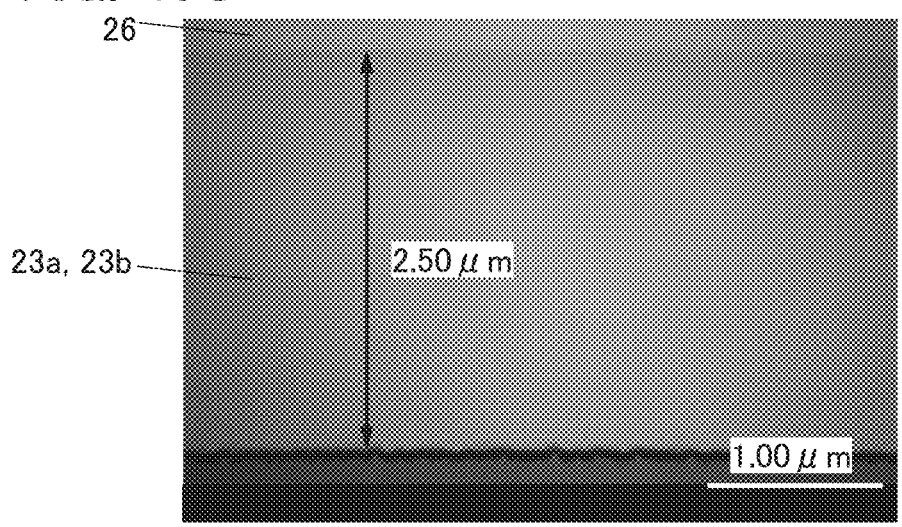
Figure 47C:
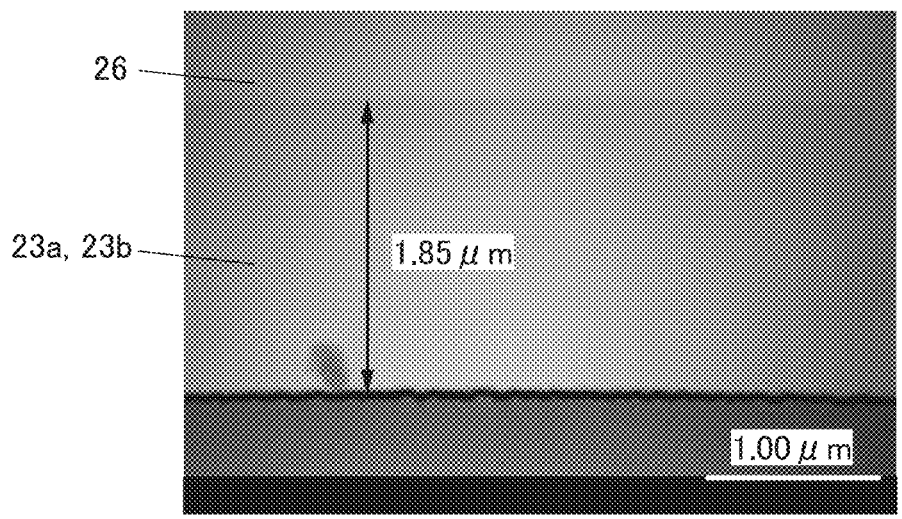
Figure 48C:
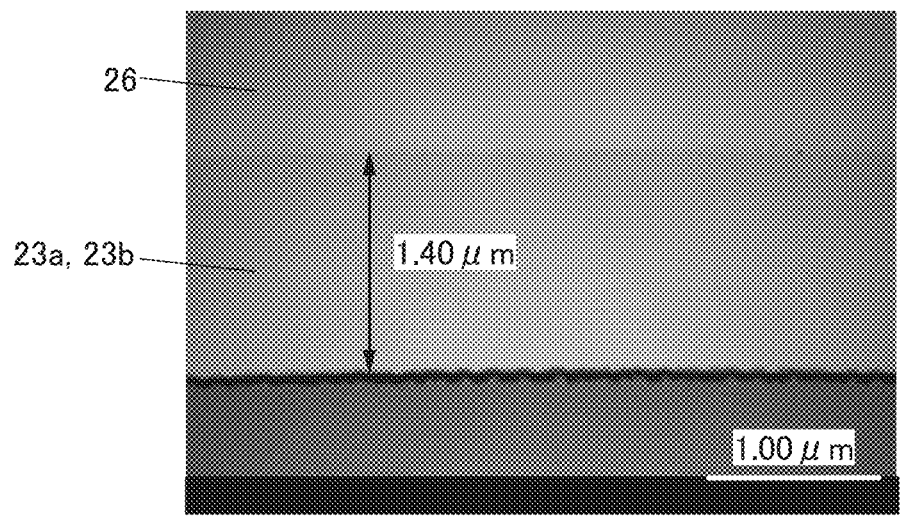

FIG. 46C, FIG. 47C, and FIG. 48C show cross-sectional STEM images of the sample 2A, the sample 2C, and the sample 2E, respectively, on the film 27 side. The images show samples after separation.

As shown in FIG. 46C, it is found that in the sample 2A, a stacked-layer structure with a thickness of approximately 2.50 µm including the first resin layer 23a and the second resin layer 23b is on the film 27 side.

As shown in FIG. 47C, it is found that in the sample 2C, a stacked-layer structure with a thickness of approximately 1.85 µm including the first resin layer 23a and the second resin layer 23b is on the film 27 side.

As shown in FIG. 48C, it is found that in the sample 2E, a stacked-layer structure with a thickness of approximately 1.40 µm including the first resin layer 23a and the second resin layer 23b is on the film 27 side.

According to the results of a cross-sectional observation, it was shown that separation was performed at the interface between the formation substrate 14 and the first resin layer 23a.

EXAMPLE 3

In this example, the effect that the baking conditions used to form a resin layer over a formation substrate have on the separability of the resin layer was evaluated. In this example, results of forming the resin layer using a material different from the material in Example 1 will be described.

As a formation substrate of each sample, an approximately 0.7-mm-thick glass substrate was used. As a resin layer, a polyimide resin film was formed over the formation substrate of each sample. The polyimide resin film was formed by a spin coating method. The polyimide resin film was formed under the following conditions: the temperature was room temperature, the application amount was 40 ml, and the application time was 12.5 sec. The number of revolutions at application in the sample 3A was 500 rpm. The numbers of revolutions at application in the samples 3B and 3C were each 1000 rpm. The deposition conditions were determined so that the resin layers of the three samples have approximately the same thickness after baking. The polyimide resin film was formed using a non-photosensitive material including a soluble polyimide resin.

For Sample 3A, baking was performed at 180° C. for 30 minutes while a mixed gas of a nitrogen gas and an oxygen gas (580 NL/min, oxygen concentration: 20%) was supplied, and then, baking was performed at 450° C. for 1 hour while the same mixed gas was supplied. The thickness of the resin layer after the baking was approximately 1.11 µm.

For Sample 3B, baking was performed at 180° C. for 30 minutes while a mixed gas of a nitrogen gas and an oxygen gas (580 NL/min, oxygen concentration: 20%) was supplied, and then, baking was performed at 400° C. for 1 hour while the same mixed gas was supplied. The thickness of the resin layer after the baking was approximately 1.01 µm.

For Sample 3C, baking was performed at 180° C. for 30 minutes while a mixed gas of a nitrogen gas and an oxygen gas (580 NL/min, oxygen concentration: 20%) was supplied, and then, baking was performed at 350° C. for 1 hour while the same mixed gas was supplied. The thickness of the resin layer after the baking was approximately 1.07 µm.

In each of the samples 3A, 3B, and 3C, when a separation test was performed in a manner similar to that in Example 2, separation was able to be made at the interface between the formation substrate and the resin layer.

The force required for separation in Sample 3A was 0.091 N. The force required for separation in Sample 3B was 0.169 N. There is no large difference between the thicknesses of Sample 3A and Sample 3B; thus, it can be presumed that the force required for separation in Sample A is reduced by baking at a higher temperature.

In this example, a resin layer was formed using non-photosensitive material. In contrast, in Example 1, the resin layer was formed using a photosensitive material. It is revealed from the results of the example that, when the resin layer is formed through baking at a high temperature in an atmosphere containing sufficient oxygen, the resin layer can be separated from the formation substrate regardless of the photosensitivity of the material for the resin layer.

In Example 1, only in the samples subjected to baking at 450° C., separation was able to be made at the interface between the formation substrate and the resin layer. In the sample subjected to baking at 350° C. or 400° C., separation was not able to be made at the interface.

On the other hand, in this example, without being limited to the sample subjected to baking at 450° C., separation was able to be made at the interface between the formation substrate and the resin layer even in the material subjected to 350° C. or 400° C. This suggests that a favorable range of the baking temperature is different depending on materials used for the resin layer.

The above results show that, by forming the resin layer through baking at a high temperature in an atmosphere containing enough oxygen, the resin layer can be separated from the formation substrate.

EXAMPLE 4

In this example, the XPS analysis results of a surface on the formation substrate side of a resin layer formed over a formation substrate are described.

The surface on the formation substrate side of the resin layer corresponds to a surface exposed by the separation process.

In this example, six samples (samples 4A to 4F) and a comparative sample were fabricated.

In the samples 4A to 4F, separation can be made at the interface between the formation substrate and the resin layer even when a particular treatment is not performed (e.g., a treatment of irradiating the entire surface of the resin layer with laser light). In the comparative sample, separation cannot be made at the interface between the formation substrate and the resin layer when the particular treatment is not performed.

As the formation substrate of each sample, an approximately 0.7-mm-thick glass substrate was used.

As the resin layer, a polyimide resin film was formed over the formation substrate of each sample. The polyimide resin films were formed by a spin coating method.

In each of the samples 4A, 4B, and 4C, and the comparative sample, the polyimide resin film was formed using a photosensitive material including a polyimide resin precursor. The polyimide resin film was formed to have a thickness of approximately 2.0 μm when the material was applied.

The sample 4A, the sample 4B, and the sample 4C were subjected to baking at 450° C. while supplying a mixed gas of a nitrogen gas and an oxygen gas (oxygen concentration of 20%) with a flow rate of 580 NL/min. The time for baking performed on the sample 4A, the sample 4B, and the sample 4C were 1 hour, 2 hours, and 3 hours, respectively.

The comparative sample was subjected to baking at 450° C. for one hour while supplying a nitrogen gas with a flow rate of 600 NL/min. The oxygen concentration in the apparatus during the baking was approximately 0.01% to 0.02%.

The deposition conditions of the samples 4D, 4E, and 4F were determined so that the resin layers of the three samples after baking have approximately the same thickness. Specifically, the polyimide resin films were formed under the following conditions: the temperature was room temperature, the application quantity was 40 ml, and the application time was 12.5 sec. The numbers of revolutions at the application in the samples 4D and 4E were each 1000 rpm. The number of revolutions at the application in the sample 4F was 500 rpm. The polyimide resin film was formed using a non-photosensitive material including a soluble polyimide resin.

For the sample 4D, the sample 4E, and the sample 4F, baking was performed at 180° C. for 30 minutes while a mixed gas of a nitrogen gas and an oxygen gas (580 NL/min, oxygen concentration: 20%) was supplied, and then, baking was performed for 1 hour while the same mixed gas was supplied. The temperature of the 1-hour baking was 350° C. for Sample 4D, 400° C. for Sample 4E, and 450° C. for Sample 4F.

In each sample, XPS analysis was performed on the surface on the formation substrate side.

Figure 49A:
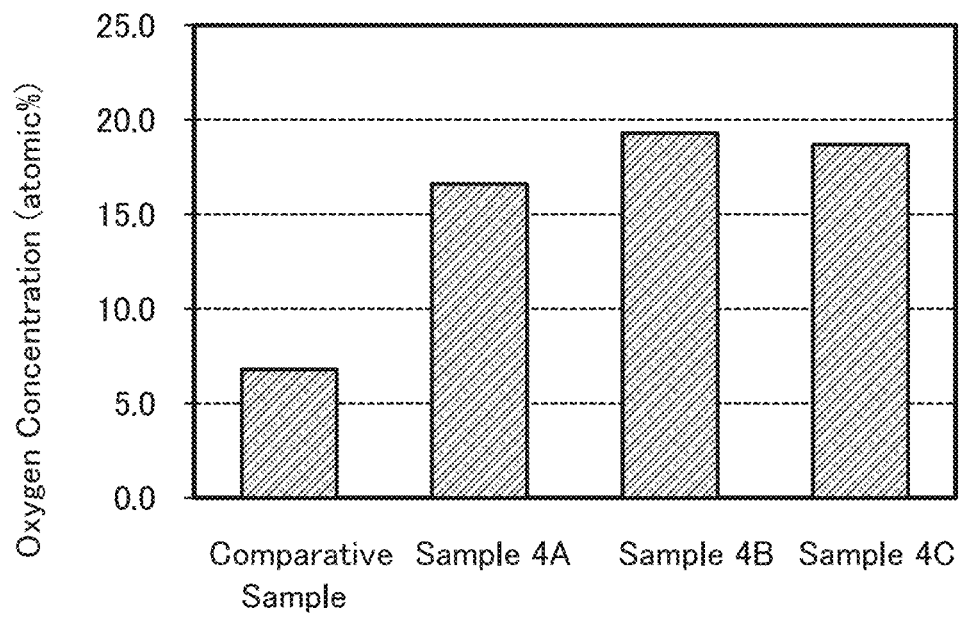
FIGS. 49A and 49B show XPS analysis results of samples in Example 4.
Figure 49B:
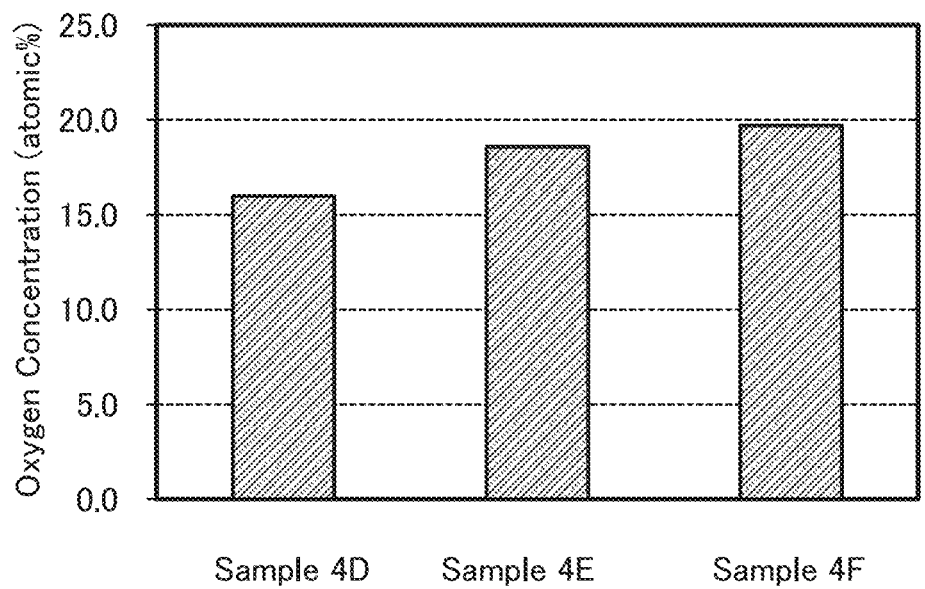

FIGS. 49A and 49B show oxygen concentration of each of the samples.

Oxygen concentration of the comparative sample was approximately 6.8 atomic %. The oxygen concentration of the samples 4A to 4F each exceeded 15 atomic %. Each of the oxygen concentration of the samples 4A to 4F was higher than the oxygen concentration of the comparative sample.

The sample 4D to the sample 4F were formed such that the resin layers in the samples after being baked had almost the same film thickness. The forces required for separation in samples having the same structures as the sample 4D to sample 4F were evaluated. The evaluation shows that the structure of the sample 4D required the largest force for separation and the structure of the sample 4F required the smallest force for separation. According to this and the results shown in FIG. 49B, there is a tendency that the higher the oxygen concentration is, the smaller the force required for separation is. This suggests that the oxygen concentration measured by the XPS analysis performed on the surface on the separation surface side of the resin layer is preferably high.

REFERENCE NUMERALS

10A: display device, 10B: display device, 13: adhesive layer, 14: formation substrate, 22: substrate, 23: resin layer, 23a: first resin layer, 23b: second resin layer, 24a: first layer, 24b: second layer, 26: adhesive layer, 27: film, 28: adhesive layer, 29: substrate, 31: insulating layer, 32: insulating layer, 33: insulating layer, 34: insulating layer, 35: insulating layer, 40: transistor, 41: conductive layer, 43a: conductive layer, 43b: conductive layer, 43c: conductive layer, 44: metal oxide layer, 45: conductive layer, 49: transistor, 60: light-emitting element, 61: conductive layer, 62: EL layer, 63: conductive layer, 64: cut, 65: instrument, 66: laser light, 67: irradiation region, 71: protective layer, 74: insulating layer, 75: protective layer, 75a: substrate, 75b: adhesive layer, 76: connector, 80: transistor, 81: conductive layer, 82: insulating layer, 83: metal oxide layer, 83a: channel region, 83b: LDD region, 83c: low-resistance region, 84: insulating layer, 85: conductive layer, 86a: conductive layer, 86b: conductive layer, 86c: conductive layer, 90: transistor, 91: formation substrate, 93a: first resin layer, 93b: second resin layer, 95: insulating layer, 97: coloring layer, 98: light-blocking layer, 98a: partition, 98b: partition, 99: adhesive layer, 112: liquid crystal layer, 113: electrode, 117: insulating layer, 121: insulating layer, 131: coloring layer, 132: light-blocking layer, 133a: alignment film, 133b: alignment film, 134: coloring layer, 135: polarizing plate, 141: adhesive layer, 142: adhesive layer, 150: layer to be separated, 151: tape, 153: support roller, 154: guide roller, 170: light-emitting element, 180: liquid crystal element, 191: electrode, 192: EL layer, 193: electrode, 194: insulating layer, 201: transistor, 203: transistor, 204: connection portion, 205: transistor, 206: transistor, 207: connection portion, 211: insulating layer, 212: insulating layer, 213: insulating layer, 214: insulating layer, 216: insulating layer, 217: insulating layer, 220: insulating layer, 221a: conductive layer, 221b: conductive layer, 222a: conductive layer, 222b: conductive layer, 223: conductive layer, 231: semiconductor layer, 242: connection layer, 243: connector, 252: connection portion, 261: semiconductor layer, 263*a*: conductive layer, 263*b*: conductive layer, 281: transistor, 284: transistor, 285: transistor, 286: transistor, 300: display device, 300A: display device, 300B: display device, 311: electrode, 311*a*: electrode, 311*b*: electrode, 340: liquid crystal element, 351: substrate, 360: light-emitting element, 360*b*: light-emitting element, 360*g*: light-emitting element, 360*r*: light-emitting element, 360*w*: light-emitting element, 361: substrate, 362: display portion, 364: circuit, 365: wiring, 372: FPC, 373: IC, 381: display portion, 382: driver circuit portion, 400: display device, 410: pixel, 451: opening, 800: portable information terminal, 801: housing, 802: housing, 803: display portion, 804: display portion, 805: hinge portion, 810: portable information terminal, 811: housing, 812: display portion, 813: operation button, 814: external connection port, 815: speaker, 816: microphone, 817: camera, 820: camera, 821: housing, 822: display portion, 823: operation button, 824: shutter button, 826: lens, 8000: display module, 8001: upper cover, 8002: lower cover, 8003: FPC, 8004: touch panel, 8005: FPC, 8006: display panel, 8009: frame, 8010: printed circuit board, 8011: battery, 9000: housing, 9001: display portion, 9003: speaker, 9005: operation key, 9006: connection terminal, 9007: sensor, 9008: microphone, 9055: hinge, 9200: portable information terminal, 9201: portable information terminal, and 9202: portable information terminal.

This application is based on Japanese Patent Application serial no. 2016-149840 filed with Japan Patent Office on Jul. 29, 2016, the entire contents of which are hereby incorporated by reference.

The invention claimed is:

1. A separation method comprising:
    forming a layer over a substrate with use of a material comprising a resin or a resin precursor;
    performing a first heat treatment on the layer while supplying a mixed gas comprising oxygen and at least one of nitrogen and a rare gas to form a resin layer;
    performing a second heat treatment after performing the first heat treatment while supplying a gas whose proportion of oxygen is lower than a proportion of oxygen in the mixed gas;
    forming a layer to be separated over the resin layer; and
    separating the layer to be separated and the substrate from each other,
    wherein a proportion of an oxygen gas flow rate in a whole gas flow rate in the mixed gas is greater than or equal to 5% and less than or equal to 50%.

2. The separation method according to claim 1, further comprising the step of:
    forming a second layer over the resin layer before performing the second heat treatment.

3. The separation method according to claim 1, wherein the first heat treatment is performed at a temperature of greater than or equal to 350° C. and less than or equal to 450° C.

4. The separation method according to claim 1, wherein the resin layer is formed to a thickness greater than or equal to 1 μm and less than or equal to 3 μm.

5. The separation method according to claim 1, wherein the layer is formed with use of a solution with a viscosity of greater than or equal to 5 cP and less than 100 cP.

6. The separation method according to claim 1, wherein the layer is formed using a spin coater.

7. The separation method according to claim 1, wherein the layer to be separated is formed at a temperature lower than or equal to a temperature of the first heat treatment.

8. The separation method according to claim 1, wherein the layer is formed using a photosensitive resin.

9. A separation method comprising:
    forming a layer over a substrate with use of a material comprising a resin or a resin precursor;
    performing a first heat treatment on the layer in an atmosphere comprising oxygen while supplying a mixed gas comprising oxygen and at least one of nitrogen and a rare gas to form a resin layer;
    forming an insulating layer covering an end portion of the resin layer over the substrate and the resin layer;
    performing a second heat treatment on the insulating layer while supplying a gas whose proportion of oxygen is lower than a proportion of oxygen in the mixed gas;
    forming a transistor comprising a metal oxide in a channel formation region over the resin layer with the insulating layer positioned therebetween;
    separating at least part of the resin layer from the substrate to form a separation starting point; and
    separating the transistor and the substrate from each other.

10. The separation method according to claim 9, wherein a proportion of an oxygen gas flow rate in a whole gas flow rate in the mixed gas is greater than or equal to 5% and less than or equal to 50%.

11. The separation method according to claim 9, wherein the first heat treatment is performed at a temperature of greater than or equal to 350° C. and less than or equal to 450° C.

12. The separation method according to claim 9, wherein the resin layer is formed to a thickness greater than or equal to 1 μm and less than or equal to 3 μm.

13. The separation method according to claim 9, wherein the layer is formed with use of a solution with a viscosity of greater than or equal to 5 cP and less than 100 cP.

14. The separation method according to claim 9, wherein the layer is formed using a spin coater.

15. The separation method according to claim 9, wherein the transistor is formed at a temperature lower than or equal to a temperature of the first heat treatment.

16. The separation method according to claim 9, wherein the layer is formed using a photosensitive resin.

17. The separation method according to claim 9, wherein the insulating layer is a second resin layer.

18. The separation method according to claim 9, wherein the second heat treatment is performed while supplying a nitrogen gas.

19. The separation method according to claim 9, wherein the second heat treatment is performed at a temperature lower than a temperature of the first heat treatment while supplying a second mixed gas comprising nitrogen and oxygen.

* * * * *